(12) United States Patent
Hagihara

(10) Patent No.: US 8,704,696 B2
(45) Date of Patent: Apr. 22, 2014

(54) AD CONVERSION CIRCUIT AND IMAGING APPARATUS

(71) Applicant: Olympus Corporation, Tokyo (JP)

(72) Inventor: Yoshio Hagihara, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/683,685

(22) Filed: Nov. 21, 2012

(65) Prior Publication Data

US 2013/0134296 A1  May 30, 2013

(30) Foreign Application Priority Data

Nov. 24, 2011 (JP) .................................. 2011-256143

(51) Int. Cl.
*H03M 1/56* (2006.01)
*H03M 1/50* (2006.01)
*H03M 1/14* (2006.01)

(52) U.S. Cl.
CPC ............... *H03M 1/56* (2013.01); *H03M 1/502* (2013.01); *H03M 1/14* (2013.01)
USPC ......................................... 341/169; 341/156

(58) Field of Classification Search
None
See application file for complete search history.

(56) References Cited

U.S. PATENT DOCUMENTS 7,629,913 B2 * 12/2009 Okumura ...................... 341/155
2012/0176518 A1 * 7/2012 Yamazaki et al. ............ 348/241

FOREIGN PATENT DOCUMENTS

| JP | 2000-001399 A | 1/2000 |
| JP | 2001-008109 A | 1/2001 |
| JP | 2011-023887 A | 2/2011 |

* cited by examiner

*Primary Examiner* — Howard Williams
(74) *Attorney, Agent, or Firm* — Westerman, Hattori, Daniels & Adrian, LLP

(57) ABSTRACT

An AD conversion circuit includes a reference signal generation unit, which generates a reference signal, a comparison unit, which ends a comparison process at a timing at which the reference signal has satisfied a predetermined condition with respect to the analog signal, a first path in which a signal is transferred through each of n delay units, a clock signal generation unit, which outputs a lower-order phase signal, a latch unit, which latches the lower-order phase signal, a higher-order count unit including a first counter circuit, which acquires a higher-order count value by performing a count operation using a signal output from any one of the delay units, a calculation unit, which generates a lower-order count signal, and a lower-order count unit, which acquires a lower-order count value by performing the count operation using the lower-order count signal.

13 Claims, 29 Drawing Sheets

US 8,704,696 B2

AD CONVERSION CIRCUIT AND IMAGING APPARATUS

BACKGROUND OF THE INVENTION

1. Field of the Invention

The present invention relates to an analog-to-digital (AD) conversion circuit and an imaging apparatus having the same.

Priority is claimed on Japanese Patent Application No. 2011-256143, filed Nov. 24, 2011, the content of which is incorporated herein by reference.

2. Description of Related Art

In FIG. 25, part of a configuration of a time-to-digital converter (TDC) type AD conversion circuit in accordance with the related art is selectively illustrated. Hereinafter, the TDC type AD conversion circuit is simply referred to as an AD conversion circuit. The circuit illustrated in FIG. 25 includes a voltage-controlled oscillator (VCO) 1100, a latch unit 1108, a binarization unit 1106, and a count unit 1101. The VCO 1100 has an oscillation circuit in which nine delay units (not AND (NAND) circuits NAND0 to NAND8) are connected. The latch unit 1108 holds output signals CK0 to CK8 (lower-order phase signals) of the VCO 1100. The binarization unit 1106 binarizes data of the latch unit 1108 (equivalent to states of the output signals CK0 to CK8 of the VCO 1100). The count unit 1101 has a counter circuit that performs a count operation using the output signal CK8 of the NAND circuit NAND8 as a count clock.

A start pulse StartP is input to one input terminal of the NAND circuit NAND0 constituting the VCO 1100. The output signal CK8 of the NAND circuit NAND8 is input to the other input terminal of the NAND circuit NAND0. A power supply voltage VDD is input to one input terminal of each of the NAND circuits NAND1 to NAND7. Output signals of previous-stage NAND circuits are input to the other input terminals of the NAND circuits NAND1 to NAND7. During an operation period of the AD conversion circuit, the power supply voltage VDD is set to a high level. The output signal CK5 of the NAND circuit NAND5 is input to one input terminal of the NAND circuit NAND8. The output signal CK7 of the previous-stage NAND circuit NAND7 is input to the other input terminal of the NAND circuit NAND8. The output signal CK5 of the NAND circuit NAND5 is input to the NAND circuit NAND8 of a third subsequent stage in addition to the NAND circuit NAND6 of a first subsequent stage. Thereby, a feed-forward loop is formed and a so-called "asymmetric oscillation circuit" is configured.

Next, an operation of the AD conversion circuit will be described. In FIG. 26, waveforms of the start pulse StartP and the output signals CK0 to CK8 of the VCO 1100 are illustrated. First, a logic state of the start pulse StartP changes from an L (=Low) state to an H (=High) state, and hence the VCO 1100 starts a transition operation. In this transition operation, logic states of signals output by the NAND circuits constituting the VCO 1100 sequentially change. The count unit 1101 starts the count operation simultaneously when the VCO 1100 starts the transition operation. A reference signal generation unit (not illustrated) starts the generation of a ramp wave (reference signal). The ramp wave generated by the reference signal generation unit is a signal having a level that changes (increases or decreases) in one direction with the passage of time.

An analog signal serving as an AD conversion target and a ramp wave variant approximately in synchronization with operations of the VCO 1100 and the count unit 1101 are input to a comparison unit (not illustrated). In parallel with this, the output signals CK0 to CK8 of the VCO 1100 are input to the latch unit 1108, and the output signal CK8 of the VCO 1100 is input to the count unit 1101. If a magnitude relationship of two input signals input to the comparison unit is switched, an output signal CO of the comparison unit is inverted. At this time, the latch unit 1108 holds (latches) the logic states of the output signals CK0 to CK8 of the VCO 1100, and the count unit 1101 holds a count value.

The output signals CK0 to CK8 of the VCO 1100 operate approximately in synchronization with the ramp wave input to the comparison unit. Thus, digital data corresponding to the analog signal serving as the AD conversion target is held in the latch unit 1108 and the count unit 1101. Thereafter, in the binarization unit 1106, data based on the logic state held by the latch unit 1108 is binarized, and digital data including the binary data (lower-order data) and data (higher-order data) based on the count value held by the count unit 1101 is output as the AD conversion result.

The states (combinations of the states of the output signals CK0 to CK8 of the VCO 1100) of lower-order phase signals (equivalent to the output signals CK0 to CK8 of the VCO 1100) latched in the latch unit 1108 become, for example, a total of eight states including states 0 to 7. Binarization is performed by encoding the output signals CK0 to CK8 of the VCO 1100 in the eight states. For example, when the count unit 1101 performs the count operation at a rising edge of the output signal CK8 of the VCO 1100, the combinations of the logic states of the output signals CK0 to CK8 become states 0 to 7 in eight equal periods into which a period (a period from the rising edge of the output signal CK8 to the next rising edge) in which the count unit 1101 performs one count operation is divided.

Next, a case in which the AD conversion circuit in accordance with the above-described related art is applied to a column analog-to-digital converter (ADC) type solid-state imaging apparatus (for example, Japanese Unexamined Patent Application, First Publication No. 2011-23887) is considered. The VCO 1100 is arranged outside a column unit corresponding to a pixel column. The comparison unit, the latch unit 1108, the binarization unit 1106, and the count unit 1101 are arranged inside the column unit. A pixel signal output from a pixel is input as the analog signal serving as the AD conversion target to the comparison unit. When the output signal CO of the comparison unit has been inverted, the lower-order phase signals, which are the output signals CK0 to CK8 of the VCO 1100, are latched in the latch unit 1108. After the lower-order phase signals latched in the latch unit 1108 have been binarized by the binarization unit 1106, the binary signals are output as digital data, which is the AD conversion result, along with the count value of the count unit 1101.

Hereinafter, content of a process of detecting a thermometer code and an encoding error will be described. FIG. 27 is a timing chart illustrating a binarization procedure in the AD conversion circuit including the circuit of FIG. 25. An example in which the count unit 1101 performs the count operation at the rising edge of the output signal CK8 of the VCO 1100 will be described.

In FIG. 27, the output signals of the VCO 1100 illustrated in FIG. 26 are arranged to be a group of signals that sequentially rise (change from the L state to the H state) at predetermined time intervals. Specifically, the output signals are arranged in the order of the output signals CK1, CK3, CK5, CK7, CK0, CK2, CK4, and CK6. As illustrated in FIG. 27, when a predetermined time (corresponding to a delay time for two NAND circuits) has elapsed after the output signal CK1 has changed from the L state to the H state, the output signal CK3 changes from the L state to the H state. When a predetermined time (corresponding to a delay time for two NAND circuits) has elapsed after the output signal CK3 has changed from being in the L state to being in the H state, the output signal CK5 changes from being in the L state to being in the H state. Thereafter, likewise, the output signals CK7, CK0, CK2, CK4, and CK6 sequentially change from being in the L state to being in the H state.

The lower-order phase signal is binarized, for example, using an output signal other than the output signal CK8. Specifically, the binarization is performed by performing the following <Procedure (1)> to <Procedure (7)> in time series.

In the procedures, a position at which the logic state changes from the H state to the L state, that is, the thermometer code, is detected in a signal group (signal stream) in which the output signals CK1, CK3, CK5, CK7, CK0, CK2, CK4, and CK6 latched in the latch unit 1108 have been arranged in this order, and the state is determined according to the detected thermometer code. The "change of the logic state from the H state to the L state" indicates that a previous output signal is in the H state and a subsequent output signal is in the L state when the output signals constituting the above-described signal group are sequentially viewed.

For example, in the case of state 7, if the logic states of the output signals CK1, CK3, CK5, CK7, CK0, CK2, CK4, and CK6 are viewed in this order, the logic state changes from the H state to the L state between the output signal CK4 and the output signal CK6. Even in the other states 0 to 6, the logic state between two output signals corresponding to each state changes from being in the H state to being in the L state. That is, it is possible to determine states by detecting positions at which the logic states of the output signals arranged as illustrated in FIG. 27 change.

Hereinafter, the procedures will be described.

<Procedure (1)> . . . Determination of whether or not the state is "state 7"

The logic states of the output signals CK6 and CK4 are compared. If there is a thermometer code here, the state is determined to be "state 7."

<Procedure (2)> . . . Determination of whether or not the state is "state 6"

The logic states of the output signals CK4 and CK2 are compared. If there is a thermometer code here, the state is determined to be "state 6."

<Procedure (3)> . . . Determination of whether or not the state is "state 5"

The logic states of the output signals CK2 and CK0 are compared. If there is a thermometer code here, the state is determined to be "state 5."

<Procedure (4)> . . . Determination of whether or not the state is "state 4"

The logic states of the output signals CK0 and CK7 are compared. If there is a thermometer code here, the state is determined to be "state 4."

<Procedure (5)> . . . Determination of whether or not the state is "state 3"

The logic states of the output signals CK7 and CK5 are compared. If there is a thermometer code here, the state is determined to be "state 3."

<Procedure (6)> . . . Determination of whether or not the state is "state 2"

The logic states of the output signals CK5 and CK3 are compared. If there is a thermometer code here, the state is determined to be "state 2."

<Procedure (7)> . . . Determination of whether or not the state is "state 1"

The logic states of the output signals CK3 and CK1 are compared. If there is a thermometer code here, the state is determined to be "state 1."

When it is determined that the state is not any one of "state 7" to "state 1" in <Procedure (1)> to <Procedure (7)>, the state is "state 0." Accordingly, it is not particularly necessary to determine whether or not the state is "state 0."

However, there are timings at which falling edges of the output signals CK0 and CK7 among the output signals CK0 to CK8 of the asymmetric oscillation circuit (VCO 1100) are approximately simultaneous. For example, if the phase of the output signal CK0 has been slightly advanced or if the phase of the output signal CK7 has been slightly delayed even when the logic states of the output signals CK0 to CK8 correspond to "state 0," there are cases in which the logic state of the output signal CK0 becomes the L state and the logic state of the output signal CK7 becomes the H state according to the timing at which the latch unit 1108 has latched the output signals CK0 to CK8. When the logic state of the output signal CK0 becomes the L state and the logic state of the output signal CK7 becomes the H state, the thermometer code is detected in the step of <Procedure (4)> if the above-described <Procedure (1)> to <Procedure (7)> are performed. Thereby, an encoding error in which it is erroneously determined that the state is "state 4" occurs.

Next, another example of the encoding error will be described. Hereinafter, description will be given using an example in which the count unit 1101 performs the count operation at the falling edge of the output signal CK8 of the VCO 1100. FIG. 28 illustrates the waveforms of the start pulse StartP and the output signals CK0 to CK8 of the VCO 1100. When the count unit 1101 performs the count operation at the falling edge of the output signal CK8 of the VCO 1100, the combinations of the logic states of the output signals CK0 to CK8 become states 0 to 7 in eight equal periods into which a period (a period from the falling edge of the output signal CK8 to the next falling edge) in which the count unit 1101 performs one count operation is divided as illustrated in FIG. 28.

FIG. 29 is a timing chart illustrating a binarization procedure in the AD conversion circuit including the circuit of FIG. 25. In FIG. 29, the output signals of the VCO 1100 illustrated in FIG. 28 are arranged to be a group of signals that sequentially fall (change from being in the H state to being in the L state) at predetermined time intervals. Specifically, the output signals are arranged in the order of the output signals CK1, CK3, CK5, CK0, CK2, CK4, CK6, and CK8. As illustrated in FIG. 29, when a predetermined time (corresponding to a delay time for two NAND circuits) has elapsed after the output signal CK1 has changed from being in the H state to being in the L state, the output signal CK3 changes from being in the H state to being in the L state. When a predetermined time (corresponding to a delay time for two NAND circuits) has elapsed after the output signal CK3 has changed from being in the H state to being in the L state, the output signal CK5 changes from being in the H state to being in the L state. Thereafter, likewise, the output signals CK0, CK2, CK4, CK6, and CK8 sequentially change from being in the H state to being in the L state.

The lower-order phase signal is binarized, for example, using an output signal other than the output signal CK7. Specifically, the binarization is performed by performing the following <Procedure (1)> to <Procedure (7)> in time series.

In the procedures, the state is determined according to a position at which the logic state changes from the L state to the H state in a signal group (signal stream) in which the output signals CK1, CK3, CK5, CK0, CK2, CK4, CK6, and CK8 latched in the latch unit 1108 have been arranged in this order. That is, the thermometer code is detected and the state is determined according to the detected thermometer code. The "change of the logic state from the L state to the H state" indicates that a previous output signal is in the L state and a subsequent output signal is in the H state when the output signals constituting the above-described signal group are sequentially viewed.

For example, in the case of state 7, if the logic states of the output signals CK1, CK3, CK5, CK0, CK2, CK4, CK6, and CK8 are viewed in this order, the logic state between the output signal CK6 and the output signal CK8 changes from being in the L state to being in the H state. Even in the other states 0 to 6, the logic state changes from the L state to the H state between two output signals corresponding to each state. That is, it is possible to determine states by detecting positions at which the logic states of the output signals arranged as illustrated in FIG. 29 change.

Hereinafter, the procedures will be described.

<Procedure (1)> . . . Determination of whether or not the state is "state 7"

The logic states of the output signals CK8 and CK6 are compared. If there is a thermometer code here, the state is determined to be "state 7."

<Procedure (2)> . . . Determination of whether or not the state is "state 6"

The logic states of the output signals CK6 and CK4 are compared. If there is a thermometer code here, the state is determined to be "state 6."

<Procedure (3)> . . . Determination of whether or not the state is "state 5"

The logic states of the output signals CK4 and CK2 are compared. If there is a thermometer code here, the state is determined to be "state 5."

<Procedure (4)> . . . Determination of whether or not the state is "state 4"

The logic states of the output signals CK2 and CK0 are compared. If there is a thermometer code here, the state is determined to be "state 4."

<Procedure (5)> . . . Determination of whether or not the state is "state 3"

The logic states of the output signals CK0 and CK5 are compared. If there is a thermometer code here, the state is determined to be "state 3."

<Procedure (6)> . . . Determination of whether or not the state is "state 2"

The logic states of the output signals CK5 and CK3 are compared. If there is a thermometer code here, the state is determined to be "state 2."

<Procedure (7)> . . . Determination of whether or not the state is "state 1"

The logic states of the output signals CK3 and CK1 are compared. If there is a thermometer code here, the state is determined to be "state 1."

When it is determined that the state is not any one of "state 7" to "state 1" in <Procedure (1)> to <Procedure (7)>, the state is "state 0." Accordingly, it is not particularly necessary to determine whether or not the state is "state 0."

However, there are timings at which falling edges of the output signals CK8 and CK6 among the output signals CK0 to CK8 of the asymmetric oscillation circuit (VCO 1100) are approximately simultaneous. For example, if the phase of the output signal CK8 has been slightly advanced or if the phase of the output signal CK6 has been slightly delayed even when the logic states of the output signals CK0 to CK8 correspond to "state 3," there are cases in which the logic state of the output signal CK6 becomes the L state and the logic state of the output signal CK8 becomes the H state according to the timing at which the latch unit 1108 has latched the output signals CK0 to CK8. When the logic state of the output signal CK6 becomes the L state and the logic state of the output signal CK8 becomes the H state, the thermometer code is detected in the step of <Procedure (1)> if the above-described <Procedure (1)> to <Procedure (7)> are performed. Thereby, an encoding error in which it is erroneously determined that the state is "state 7" occurs.

SUMMARY OF THE INVENTION

According to a first aspect of the present invention, an AD conversion circuit includes: a reference signal generation unit configured to generate a reference signal that increases or decreases with the passage of time; a comparison unit configured to compare an analog signal serving as an AD conversion target with the reference signal and end a comparison process at a timing at which the reference signal has satisfied a predetermined condition with respect to an analog signal; a clock generation unit configured to have an oscillation circuit formed by n (n is an odd number greater than or equal to 3) delay units and including a first path in which a signal is transferred through each of the n delay units and a second path in which a signal is transferred by bypassing some of the n delay units, and output a lower-order phase signal including a plurality of signals output from the plurality of delay units; a latch unit configured to latch the lower-order phase signal at a timing related to the end of the comparison process; a higher-order count unit including a first counter circuit configured to acquire a higher-order count value by performing a count operation using a signal output from any one of the delay units arranged between two delay units positioned at both ends of the second path and arranged on the first path as a first count clock; a calculation unit configured to detect a change position of a logic state in a signal group including the plurality of signals constituting the lower-order phase signal latched in the latch unit in order to detect a state of the lower-order phase signal defined based on the count clock of the first counter circuit, and generate a lower-order count signal based on the detected change position; and a lower-order count unit including a second counter circuit configured to acquire a lower-order count value by performing the count operation using the lower-order count signal as a second count clock. The AD conversion circuit outputs digital data corresponding to the analog signal.

According to a second aspect of the present invention, in the AD conversion circuit, the calculation unit detects the change position of the logic state in a signal group after the plurality of signals constituting the lower-order phase signal latched in the latch unit have been arranged as follows. That is, the plurality of signals are arranged in the same order as a signal group when the plurality of signals constituting the lower-order phase signal output from the clock generation unit during the comparison process have been arranged to be a group of signals that sequentially rise or fall at predetermined time intervals according to whether the first counter circuit performs the count operation based on rising or falling of the first count clock.

According to a third aspect of the present invention, in the AD conversion circuit, the latch unit latches a first lower-order phase signal at a timing related to an end of a first comparison process corresponding to a first analog signal. Thereafter, the latch unit latches a second lower-order phase signal at a timing related to an end of a second comparison process corresponding to a second analog signal. The calculation unit generates a first lower-order count signal according to the first lower-order phase signal latched in the latch unit. Thereafter, the calculation unit generates a second lower-order count signal according to the second lower-order phase signal latched in the latch unit. The lower-order count unit acquires a first lower-order count value by performing the count operation using the first lower-order count signal as the second count clock and also outputting a first higher-order count clock. The lower-order count unit inverts values of bits constituting the first lower-order count value. Thereafter, the lower-order count unit acquires a second lower-order count value by performing the count operation using the second lower-order count signal as the second count clock and also outputting a second higher-order count clock. The higher-order count unit acquires a first higher-order count value by performing the count operation using one of a plurality of signals constituting the first lower-order phase signal output from the clock generation unit as the first count clock and further performing the count operation based on the first higher-order count clock. The higher-order count unit inverts values of bits constituting the first higher-order count value. Thereafter, the higher-order count unit performs the count operation using one of a plurality of signals constituting the second lower-order phase signal output from the clock generation unit as the first count clock. Further, the higher-order count unit acquires a second higher-order count value by performing the count operation based on the second higher-order count clock. Thereby, the AD conversion circuit outputs digital data corresponding to a difference between the first analog signal and the second analog signal.

According to a fourth aspect of the present invention, in the AD conversion circuit, the latch unit latches a first lower-order phase signal at a timing related to an end of a first comparison process corresponding to a first analog signal. Thereafter, the latch unit latches a second lower-order phase signal at a timing related to an end of a second comparison process corresponding to a second analog signal. The calculation unit generates a first lower-order count signal according to the first lower-order phase signal latched in the latch unit. Thereafter, the calculation unit generates a second lower-order count signal according to the second lower-order phase signal latched in the latch unit. The lower-order count unit acquires a first lower-order count value by performing the count operation using the first lower-order count signal as the second count clock. The lower-order count unit inverts values of bits constituting the first lower-order count value. Thereafter, the lower-order count unit acquires a second lower-order count value by performing the count operation using the second lower-order count signal as the second count clock. The lower-order count unit outputs a higher-order count clock based on a flag bit of the second lower-order count value. The higher-order count unit acquires a first higher-order count value by performing the count operation using one of a plurality of signals constituting the first lower-order phase signal output from the clock generation unit as the first count clock. The higher-order count unit inverts values of bits constituting the first higher-order count value. Thereafter, the higher-order count unit performs the count operation using one of a plurality of signals constituting the second lower-order phase signal output from the clock generation unit as the first count clock. Further, the higher-order count unit acquires a second higher-order count value by performing the count operation based on the higher-order count clock. Thereby, the AD conversion circuit outputs digital data corresponding to a difference between the first analog signal and the second analog signal.

According to a fifth aspect of the present invention, in the AD conversion circuit, the latch unit latches a first lower-order phase signal at a timing related to an end of a first comparison process corresponding to a first analog signal. Thereafter, the latch unit latches a second lower-order phase signal at a timing related to an end of a second comparison process corresponding to a second analog signal. The calculation unit generates a first lower-order count signal according to the first lower-order phase signal latched in the latch unit. Thereafter, the calculation unit generates a second lower-order count signal according to the second lower-order phase signal latched in the latch unit. The lower-order count unit acquires a first lower-order count value by performing the count operation using the first lower-order count signal as the second count clock in any one of a count-up mode and a count-down mode and also outputting a first higher-order count clock. Thereafter, the lower-order count unit acquires a second lower-order count value by performing the count operation using the second lower-order count signal as the second count clock in the other mode of the count-up mode and the count-down mode and also outputting a second higher-order count clock. The higher-order count unit performs the count operation using one of a plurality of signals constituting the first lower-order phase signal output from the clock generation unit as the first count clock in any one of the count-up mode and the count-down mode. Further, the higher-order count unit acquires a first higher-order count value by performing the count operation based on the first higher-order count clock. Thereafter, the higher-order count unit performs the count operation using one of a plurality of signals constituting the second lower-order phase signal output from the clock generation unit as the first count clock in the other mode of the count-up mode and the count-down mode. Further, the higher-order count unit acquires a second higher-order count value by performing the count operation based on the second higher-order count clock. Thereby, the AD conversion circuit outputs digital data corresponding to a difference between the first analog signal and the second analog signal.

According to a sixth aspect of the present invention, in the AD conversion circuit, the latch unit latches a first lower-order phase signal at a timing related to an end of a first comparison process corresponding to a first analog signal. Thereafter, the latch unit latches a second lower-order phase signal at a timing related to an end of a second comparison process corresponding to a second analog signal. The calculation unit generates a first lower-order count signal according to the first lower-order phase signal latched in the latch unit. Thereafter, the calculation unit generates a second lower-order count signal according to the second lower-order phase signal latched in the latch unit. The lower-order count unit acquires a first lower-order count value by performing the count operation using the first lower-order count signal as the second count clock in any one mode of a count-up mode and a count-down mode. Thereafter, the lower-order count unit acquires a second lower-order count value by performing the count operation using the second lower-order count signal as the second count clock in the other mode of the count-up mode and the count-down mode. The lower-order count unit outputs a higher-order count clock based on a flag bit of the second lower-order count value. The higher-order count unit acquires a first higher-order count value by performing the count operation using one of a plurality of signals constituting the first lower-order phase signal output from the clock generation unit as the first count clock in any one mode of the count-up mode and the count-down mode. Thereafter, the higher-order count unit performs the count operation using one of a plurality of signals constituting the second lower-order phase signal output from the clock generation unit as the first count clock in the other mode of the count-up mode and the count-down mode. Further, the higher-order count unit acquires a second higher-order count value by performing the count operation based on the higher-order count clock. Thereby, the AD conversion circuit outputs digital data corresponding to a difference between the first analog signal and the second analog signal.

According to a seventh aspect of the present invention, an imaging apparatus includes: an imaging unit in which a plurality of pixels each including a photoelectric conversion element and outputting a pixel signal are arranged in a matrix; and the AD conversion circuit to which an analog signal corresponding to the pixel signal is input.

According to an eighth aspect of the present invention, an imaging apparatus includes: an imaging unit in which a plurality of pixels each including a photoelectric conversion element and outputting a pixel signal are arranged in a matrix; and the AD conversion circuit to which a first analog signal corresponding to a first pixel signal based on a reset level and a second analog signal corresponding to a second pixel signal based on an amount of an electromagnetic wave incident on the photoelectric conversion element are input.

DETAILED DESCRIPTION OF THE INVENTION

Hereinafter, embodiments of the present invention will be described with reference to the drawings.

First Embodiment

First, the first embodiment of the present invention will be described. Part of a configuration of an AD conversion circuit in accordance with this embodiment is selectively illustrated in FIG. 1. The circuit illustrated in FIG. 1 includes a VCO 100a (a clock generation unit), a latch unit 108, a calculation unit 106, a lower-order count unit 103, and a higher-order count unit 101. The VCO 100a has an oscillation circuit in which nine delay units (NAND circuits NAND0 to NAND8) are connected. The latch unit 108 holds output signals CK0 to CK8 (lower-order phase signals) of the VCO 100a. The calculation unit 106 detects a thermometer code (a thermo code or a change position of a logic state) based on data (equivalent to states of the output signals CK0 to CK8 of the VCO 100a) of the latch unit 108. The calculation unit 106 generates a lower-order count signal, which is a count clock, based on the detected thermometer code. The lower-order count unit 103 has a counter circuit that performs a count operation using the lower-order count signal from the calculation unit 106 as the count clock. The higher-order count unit 101 has a counter circuit that performs the count operation using the output signal CK7 of the NAND circuit NAND7 as the count clock. The higher-order count unit 101 performs the count operation at a rising edge of the output signal CK7.

Figure 1:
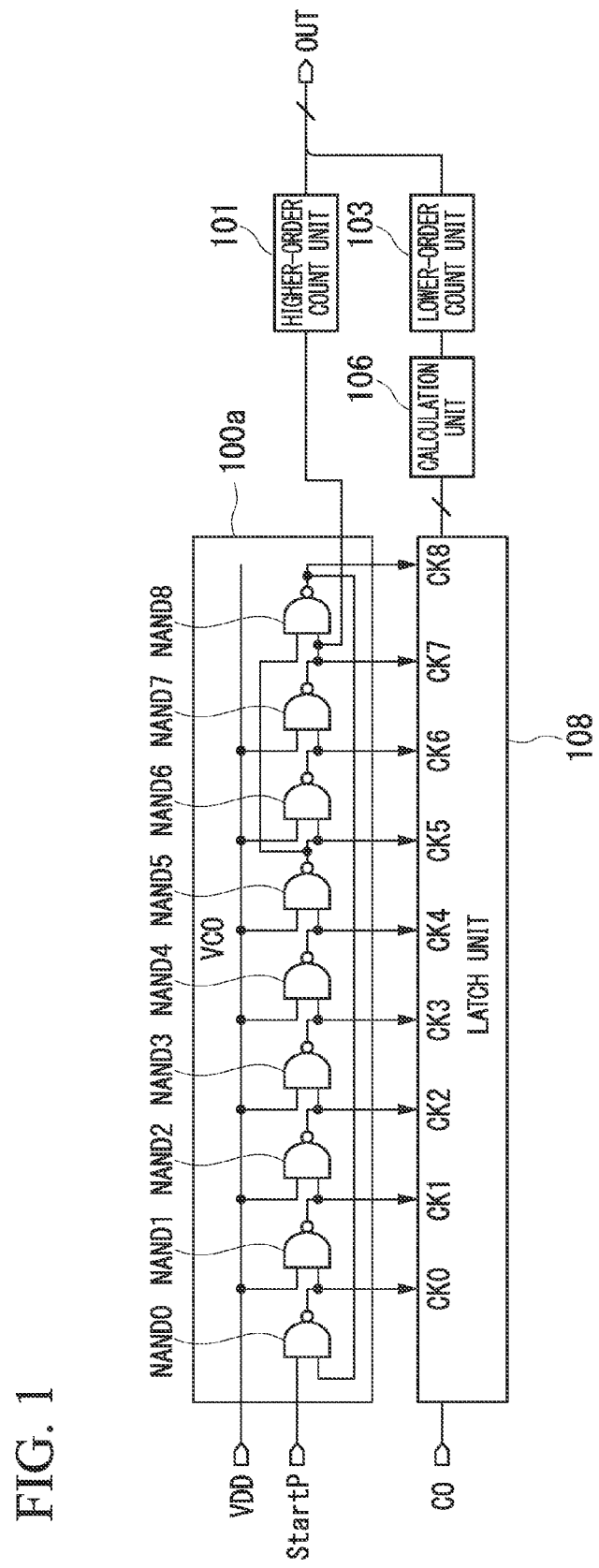
FIG. 1 is a block diagram illustrating a partial configuration of an AD conversion circuit in accordance with a first embodiment of the present invention.
Figure 16:
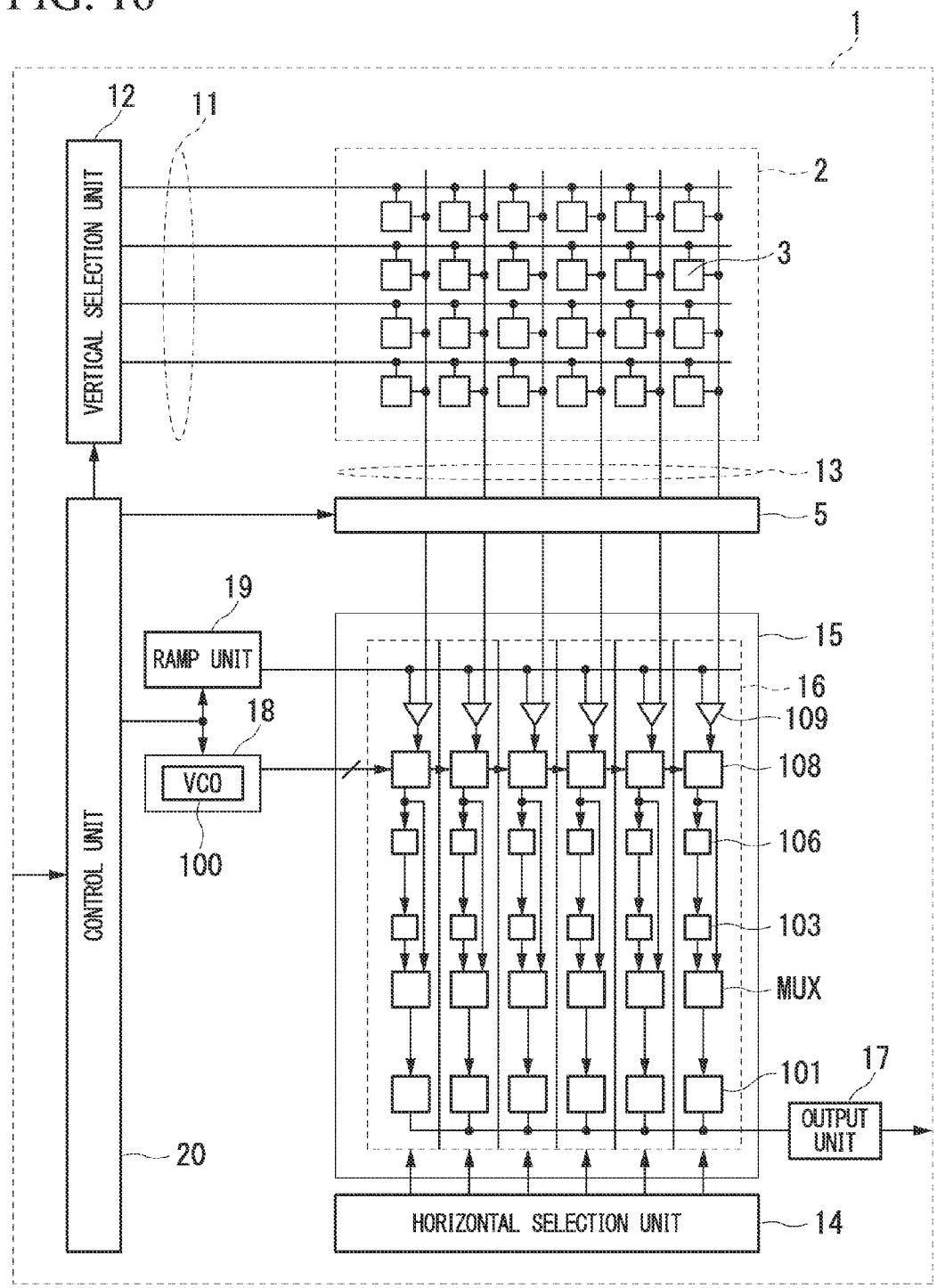
FIG. 16 is a block diagram illustrating a configuration of an imaging apparatus in accordance with a fifth embodiment of the present invention.

A section formed by the VCO 100*a*, the latch unit 108, the calculation unit 106, the lower-order count unit 103, and the higher-order count unit 101 of FIG. 1, a ramp unit (not illustrated) (for example, corresponding to a ramp unit 19 illustrated in FIG. 16), and a comparison unit (not illustrated) (for example, corresponding to a comparison unit 109 illustrated in FIG. 16) is an example of the AD conversion circuit in accordance with this embodiment. In FIG. 1, the output signals CK0 to CK8 of the VCO 100*a* are input to the latch unit 108. However, as will be described later, the calculation unit 106 detects the thermometer code using an output signal other than the output signal CK8. Thus, the output signal CK8 may not be input to the latch unit 108.

A start pulse StartP is input to one input terminal of the NAND circuit NAND0 constituting the VCO 100*a*. The output signal CK8 of the NAND circuit NAND8 is input to the other input terminal of the NAND circuit NAND0. A power supply voltage VDD is input to one input terminals of the NAND circuits NAND1 to NAND7. Output signals of previous-stage NAND circuits are input to the other input terminals of the NAND circuits NAND1 to NAND7. During an operation period of the AD conversion circuit, the power supply voltage VDD is set to a high level. The output signal CK5 of the NAND circuit NAND5 is input to one input terminal of the NAND circuit NAND8. The output signal CK7 of the previous-stage NAND circuit NAND7 is input to the other input terminal of the NAND circuit NAND8. The output signal CK5 of the NAND circuit NAND5 is input to the NAND circuit NAND8 of a third subsequent stage in addition to the NAND circuit NAND6 of a first subsequent stage.

Figure 2:
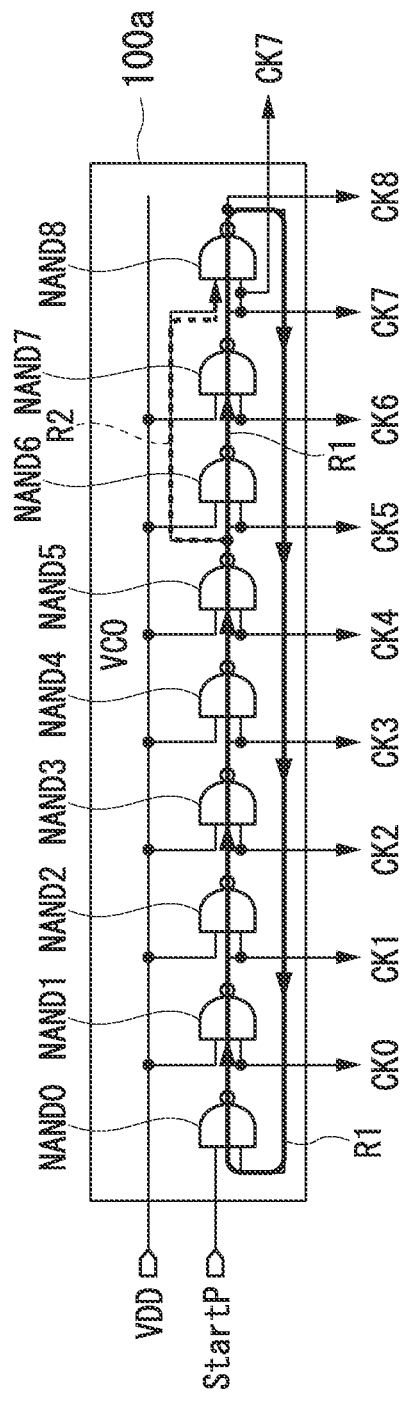
FIG. 2 is a circuit diagram illustrating a configuration of a VCO having the AD conversion circuit in accordance with the first embodiment of the present invention.

A signal based on the start pulse StartP input to the NAND circuit NAND0 is transferred in two types of paths, and passes through the NAND circuits NAND0 to NAND8. FIG. 2 illustrates a path in which a signal is transferred. A path R1 is a path in which the signal is transferred through a signal line that connects the other input terminal of each NAND circuit and an output terminal of a previous-stage NAND circuit. A path R2 is a path (bypass path) in which a signal output from the NAND circuit NAND5 is transferred through a signal line that connects an output terminal of the NAND circuit NAND5 and an input terminal of the NAND circuit NAND8. A signal transferred in the path R2 reaches the NAND circuit NAND8 by bypassing the NAND circuits NAND6 and NAND7 without passing through the NAND circuits NAND6 and NAND7 on the path R1.

An output signal of any one of the NAND circuits arranged between the NAND circuits NAND5 and NAND8 positioned at both ends of the path R2 among the NAND circuits on the path R1 becomes the count clock of the higher-order count unit 101. The NAND circuits arranged between the NAND circuits NAND5 and NAND8 refer to NAND circuits (the NAND circuits NAND6 and NAND7 in this embodiment) on the path R1 through which the signal passes until the signal output from the NAND circuit NAND5 is input to the NAND circuit NAND8 in the path R1. In this embodiment, the output signal CK7 of the NAND circuit NAND7 is the count clock of the higher-order count unit 101. According to the above-described configuration, a feed-forward loop is formed and a so-called "asymmetric oscillation circuit" is configured.

Figure 3:
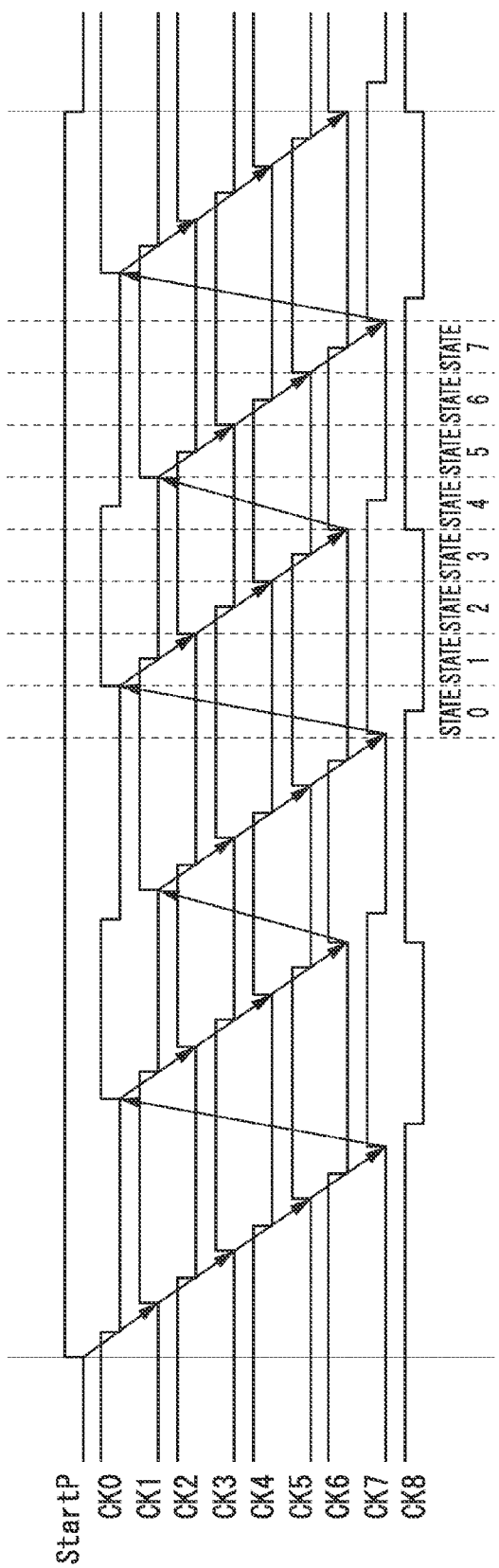
FIG. 3 is a timing chart illustrating an operation of the AD conversion circuit in accordance with the first embodiment of the present invention.

Next, an operation of the AD conversion circuit will be described. In FIG. 3, waveforms of the start pulse StartP and the output signals CK0 to CK8 of the VCO 100*a* are illustrated. First, a logic state of the start pulse StartP changes from an L (=Low) state to an H (=High) state, and hence the VCO 100*a* starts a transition operation. In this transition operation, logic states of signals output by the NAND circuits constituting the VCO 100*a* sequentially change. The higher-order count unit 101 starts the count operation simultaneously when the VCO 100*a* starts the transition operation. A reference signal generation unit (not illustrated) starts the generation of a ramp wave (reference signal). The ramp wave generated by the reference signal generation unit is a signal having a level that changes (increases or decreases) in one direction with the passage of time.

An analog signal serving as an AD conversion target and a ramp wave variant approximately in synchronization with operations of the VCO 100*a* and the higher-order count unit 101 are input to a comparison unit (not illustrated). In parallel with this, the output signals CK0 to CK8 of the VCO 100*a* are input to the latch unit 108, and the output signal CK7 of the VCO 100*a* is input to the higher-order count unit 101. If a magnitude relationship of two input signals input to the comparison unit is switched, an output signal CO of the comparison unit is inverted. At this time, the latch unit 108 holds (latches) the logic states of the output signals CK0 to CK8 of the VCO 100*a*, and the higher-order count unit 101 holds a count value.

The output signals CK0 to CK8 of the VCO 100*a* operate approximately in synchronization with the ramp wave input to the comparison unit. Thus, digital data corresponding to the analog signal serving as the AD conversion target is held in the latch unit 108 and the higher-order count unit 101. Thereafter, the calculation unit 106 detects a thermometer code which is data based on the logic state held by the latch unit 108. The calculation unit 106 generates a lower-order count signal based on the detected thermometer code. Details of the configurations and operations of the latch unit 108 and the calculation unit 106 will be described later. The lower-order count unit 103 performs binarization by performing the count operation using the lower-order count signal generated by the calculation unit 106 as the count clock. Digital data including data (lower-order data) binarized by the lower-order count unit 103 and data (higher-order data) based on a count value held by the higher-order count unit 101 is output as the AD conversion result.

States (combinations of the states of the output signals CK0 to CK8 of the VCO 100*a*) of lower-order phase signals (equivalent to the output signals CK0 to CK8 of the VCO 100*a*) latched in the latch unit 108 become, for example, a total of eight states, including states 0 to 7. The binarization is performed by encoding the output signals CK0 to CK8 of the VCO 100*a* in the eight states. When the higher-order count unit 101 performs the count operation at a rising edge of the output signal CK7 of the VCO 100*a*, combinations of the logic states of the output signals CK0 to CK8 become states 0 to 7 in eight equal periods into which a period (a period from the rising edge of the output signal CK7 to the next rising edge) in which the higher-order count unit 101 performs one count operation is divided.

Figure 4:
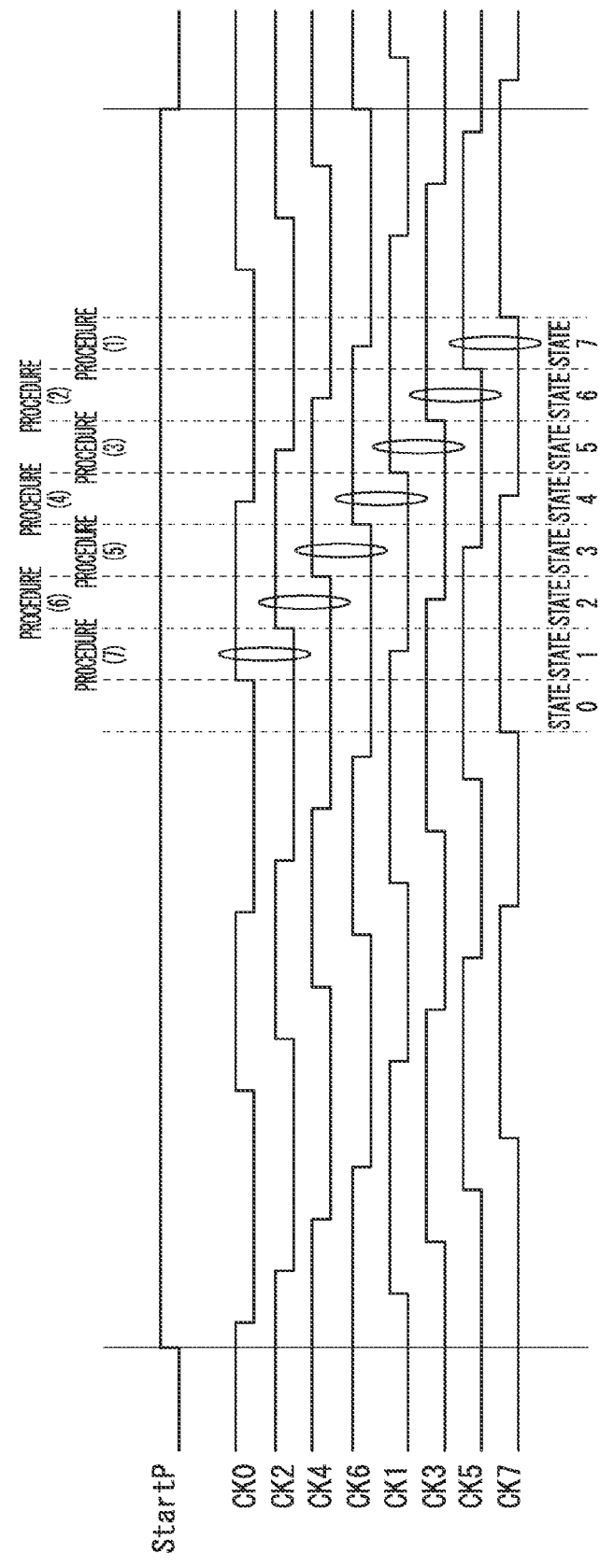
FIG. 4 is a timing chart illustrating a binarization procedure in the AD conversion circuit in accordance with the first embodiment of the present invention.

Hereinafter, content of a process in which the calculation unit 106 detects a thermometer code will be described. FIG. 4 is a timing chart illustrating a binarization procedure in the AD conversion circuit including the circuit of FIG. 1.

In FIG. 4, output signals of the VCO 100*a* illustrated in FIG. 3 are arranged to be a group of signals that sequentially rise (change from being in the L state to being in the H state)

at predetermined time intervals. Specifically, the output signals are arranged in the order of the output signals CK0, CK2, CK4, CK6, CK1, CK3, CK5, and CK7. As illustrated in FIG. 4, when a predetermined time (corresponding to a delay time for two NAND circuits) has elapsed after the output signal CK0 has changed from being in the L state to being in the H state, the output signal CK2 changes from being in the L state to being in the H state. When a predetermined time (corresponding to a delay time for two NAND circuits) has elapsed after the output signal CK2 has changed from being in the L state to being in the H state, the output signal CK4 changes from being in the L state to being in the H state. Thereafter, likewise, the output signals CK6, CK1, CK3, CK5, and CK7 sequentially change from being in the L state to being in the H state.

The lower-order phase signal is binarized, for example, using an output signal other than the output signal CK8. Specifically, the binarization is performed by performing the following <Procedure (1)> to <Procedure (7)> in time series. In the procedures, the state is determined according to a position at which the logic state changes from the H state to the L state in a signal group (signal stream) in which the output signals CK0, CK2, CK4, CK6, CK1, CK3, CK5, and CK7 latched in the latch unit 108 have been arranged in this order. That is, a thermometer code is detected and the state is determined according to the detected thermometer code. The "change of the logic state from the H state to the L state" indicates that a previous output signal is in the H state and a subsequent output signal is in the L state when the output signals constituting the above-described signal group are sequentially viewed.

For example, in the case of state 7, if the logic states of the output signals CK0, CK2, CK4, CK6, CK1, CK3, CK5, and CK7 are viewed in this order, the logic state between the output signal CK5 and the output signal CK7 changes from the H state to the L state. Even in the other states 0 to 6, the logic state between two output signals corresponding to each state changes from the H state to the L state. That is, it is possible to determine states by detecting positions at which the logic states of the output signals arranged as illustrated in FIG. 4 change.

Hereinafter, the procedures will be described.

<Procedure (1)> . . . Determination of whether or not the state is "state 7"

The logic states of the output signals CK7 and CK5 are compared. If there is a thermometer code here, the state is determined to be "state 7."

<Procedure (2)> . . . Determination of whether or not the state is "state 6"

The logic states of the output signals CK5 and CK3 are compared. If there is a thermometer code here, the state is determined to be "state 6."

<Procedure (3)> . . . Determination of whether or not the state is "state 5"

The logic states of the output signals CK3 and CK1 are compared. If there is a thermometer code here, the state is determined to be "state 5."

<Procedure (4)> . . . Determination of whether or not the state is "state 4"

The logic states of the output signals CK1 and CK6 are compared. If there is a thermometer code here, the state is determined to be "state 4."

<Procedure (5)> . . . Determination of whether or not the state is "state 3"

The logic states of the output signals CK6 and CK4 are compared. If there is a thermometer code here, the state is determined to be "state 3."

<Procedure (6)> . . . Determination of whether or not the state is "state 2"

The logic states of the output signals CK4 and CK2 are compared. If there is a thermometer code here, the state is determined to be "state 2."

<Procedure (7)> . . . Determination of whether or not the state is "state 1"

The logic states of the output signals CK2 and CK0 are compared. If there is a thermometer code here, the state is determined to be "state 1."

When it is determined that the state is not any one of "state 7" to "state 1" in <Procedure (1)> to <Procedure (7)>, the state is "state 0." Accordingly, it is not particularly necessary to determine whether or not the state is "state 0."

In this embodiment, the output signal CK7 of the outputs signals CK0 to CK8 of the VCO 100a becomes the count clock of the higher-order count unit 101. In addition, because the calculation unit 106 detects the states (states 0 to 7) of the output signals CK0 to CK8 defined based on the output signal CK7, the calculation unit 106 detects a change position of the logic state of each output signal, and generates a lower-order count signal based on the detected change position. In a procedure in which the change position is detected, the calculation unit 106 does not compare the logic states of the output signals CK0 and CK7, the falling edges of which are approximately simultaneous. Thus, the occurrence of an encoding error can be suppressed.

Figure 5:
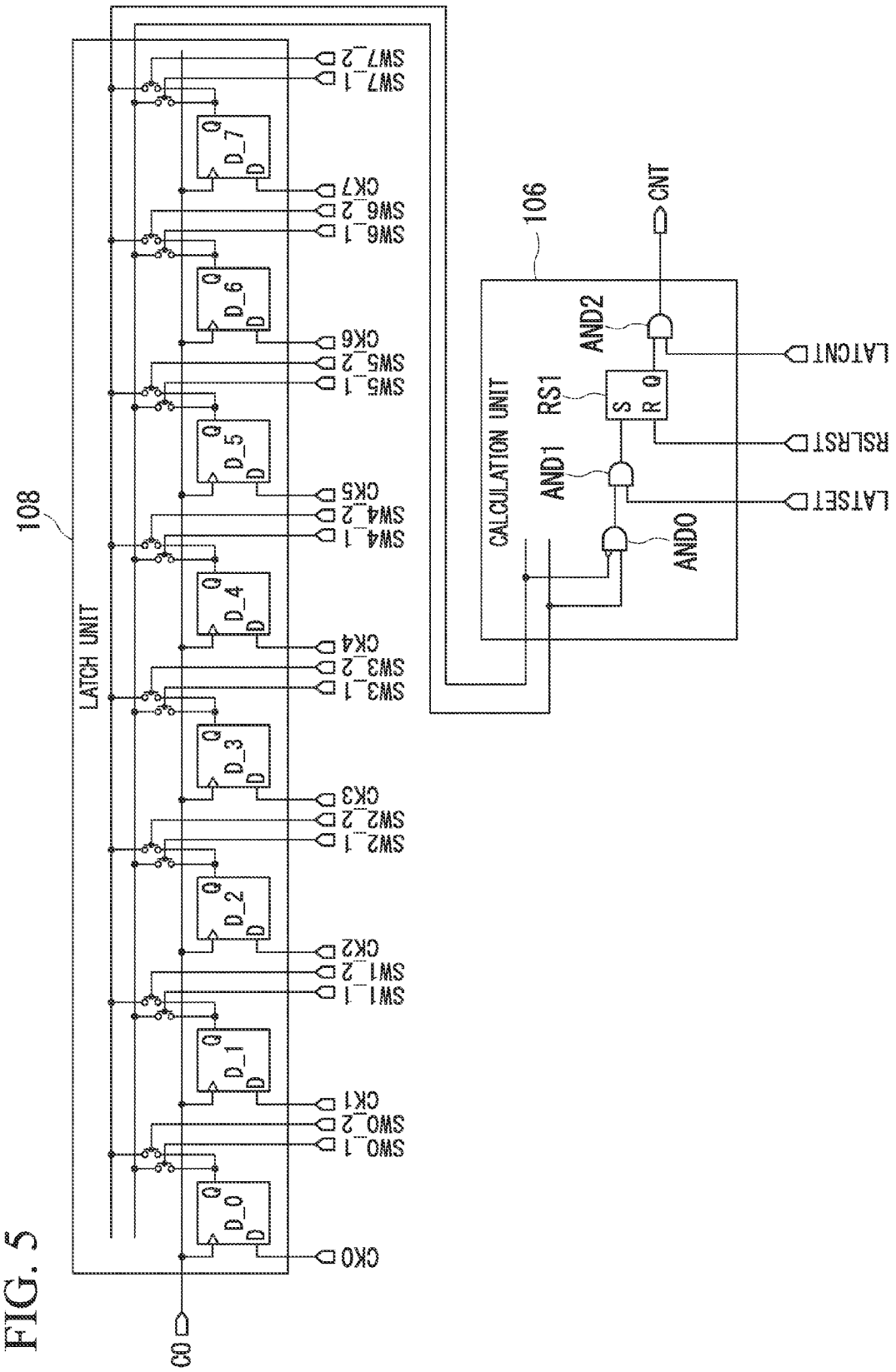
FIG. 5 is a circuit diagram illustrating configurations of a latch unit and a calculation unit in accordance with the first embodiment of the present invention.

Next, details of the latch unit 108 and the calculation unit 106 will be described. FIG. 5 illustrates an example of detailed configurations of the latch unit 108 and the calculation unit 106.

The latch unit 108 includes latch circuits D_0 to D_7 that latch the logic states of the output signals CK0 to CK7 of the VCO 100a when the output signal CO from the comparison unit has been inverted. The output signals CK0 to CK7 latched in the latch circuits D_0 to D_7 constitute a lower-order phase signal. As described above, the calculation unit 106 detects a thermometer code using an output signal other than the output signal CK8. Thus, in FIG. 5, a latch circuit D_8 that latches the output signal CK8 is not provided. In another embodiment, it is only necessary to provide necessary latch circuits among the latch circuits D_0 to D_8 according to an output signal to be used by the calculation unit 106 to detect the thermometer code in the latch unit 108. Control signals SW0_1 to SW7_1 and control signals SW0_2 to SW7_2 are signals that control switches for outputting desired output signals from the output signals CK0 to CK7 latched in the latch circuits D_0 to D_7 to the calculation unit 106.

The calculation unit 106 includes AND circuits AND0, AND1, and AND2 and a reset-set (RS) latch RS1. An output signal of any one of the latch circuits D_0 to D_7 and a signal obtained by inverting an output signal of another of the latch circuits D_0 to D_7 are input to the AND circuit AND0. The AND circuit AND0 performs an AND operation on the two input signals. An output signal of the AND circuit AND0 and a control signal LATSET are input to the AND circuit AND1. The AND circuit AND1 performs the AND operation on the two input signals.

An output signal of the AND circuit AND1 and a control signal RSLRST are input to the RS latch RS1. After the RS latch RS1 has been reset by the control signal RSLRST, an output signal Q changes from being in the L state to being in the H state when the output signal of the AND circuit AND1 changes from being in the L state to being in the H state. Thereafter, until the RS latch RS1 is reset by the control signal RSLRST, the output signal Q is kept in the H state regardless of the state of the output signal of the AND circuit AND1. An output signal of the RS latch RS1 and a count signal LATCNT are input to the AND circuit AND2. The AND circuit AND2 performs the AND operation on the two input signals. The AND circuit AND2 outputs the AND operation result as a lower-order count signal CNT to the lower-order count unit 103.

Figure 6:
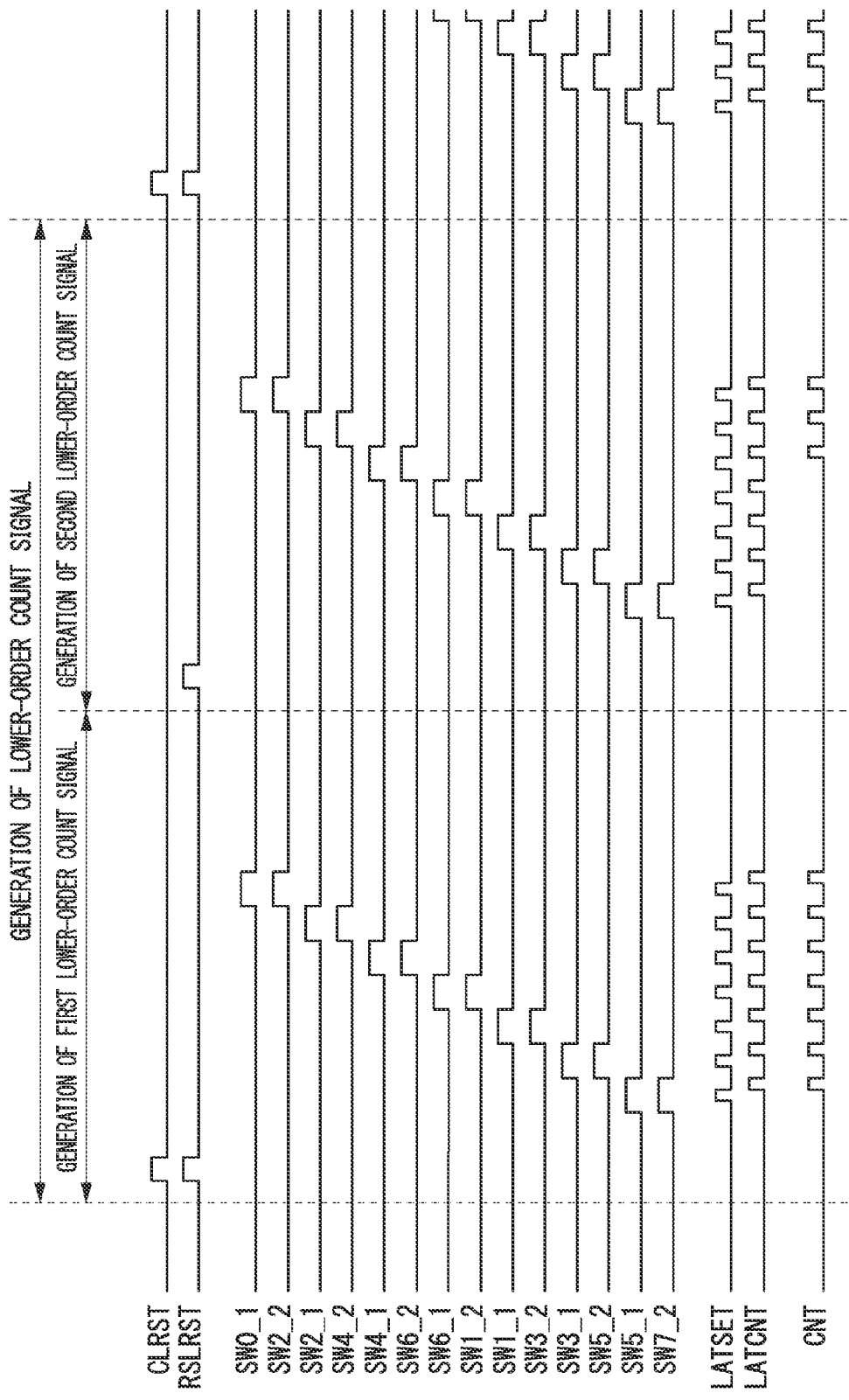
FIG. 6 is a timing chart illustrating an operation when a lower-order count signal is generated in accordance with the first embodiment of the present invention.

Next, an operation of the calculation unit 106 will be described. FIG. 6 illustrates the waveforms of signals related to an operation of generating a lower-order count signal. In FIG. 6, CLRST denotes a control signal that resets a count value of the lower-order count unit 103. Q denotes the output signal of the RS latch RS1. The state of each of the output signals CK0, CK2, CK4, CK6, CK1, CK3, CK5, and CK7 of the VCO 100a becomes any one of states 0 to 7 of FIG. 4.

Hereinafter, a specific example in which a first lower-order count signal is generated from a first lower-order phase signal and a second lower-order count signal is generated from a second lower-order phase signal will be described. When subtraction on two analog signals is performed as described in fifth to eighth embodiments, the first lower-order count signal and the second lower-order count signal are generated as illustrated in FIG. 6. Here, it is assumed that the state corresponding to the first lower-order phase signal is state 7 and the state corresponding to the second lower-order phase signal is state 3. In the case of this embodiment, the first lower-order count signal is generated as seven pulses from the first lower-order phase signal, and the second lower-order count signal is generated as three pulses from the second lower-order phase signal.

First, the operation will be schematically described. According to the control signals SW0_1 to SW7_1 and the control signals SW0_2 to SW7_2, the output signal Q of a latch circuit selected from among the latch circuits D_0 to D_7 in which the output signals CK0 to CK7 of the VCO 100a are held is input to the calculation unit 106. A thermometer code (an edge position that changes from being in the H state to being in the L state in the case of this embodiment) is detected based on the input output signal Q.

When the result of the AND operation on the output signal Q of a latch circuit D_* (* is any one of 0 to 7) and a signal obtained by inverting the output signal Q indicates the H state, the result of the AND operation on the H state and the control signal LATSET is input to the RS latch RS1 and hence the thermometer code is detected. In addition, a pulse of the lower-order count signal CNT is generated as the result of the AND operation on the output signal Q of the RS latch RS1 and the count signal LATCNT.

Hereinafter, detailed operations corresponding to the above-described <Procedure (1)> to <Procedure (7)> will be described. The output signal CO of the comparison unit changes at a first timing at which a predetermined condition is satisfied, and hence the logic states of the output signals CK0 to CK7 of the VCO 100a are held in the latch unit 108. At this time, the logic states held in the latch circuits D_0 to D_7 correspond to the first lower-order phase signal.

Subsequently, the generation of the lower-order count signal based on the first lower-order phase signal (state 7) starts. First, the count value of the lower-order count unit 103 is reset according to the control signal CLRST, and the RS latch RS1 is also reset according to the control signal RSLRST. At this time, the output signal Q of the RS latch RS1 is in the L state. Subsequently, a control signal SW*_1 (*: 0 to 7) and a control signal SW*_2 (*: 0 to 7) change to the H state in a predetermined order.

<Procedure (1)>

If the control signal SW5_1 and the control signal SW7_2 are in the H state, the output signal (the H state) of the latch circuit D_5 is input to the AND circuit AND0, and a signal obtained by inverting the output signal (the L state) of the latch circuit D_7 is input to the AND circuit AND0. Thereby, the output signal of the AND circuit AND0 is in the H state.

If the control signal LATSET changes from being in the L state to being in the H state, the output signal of the AND circuit AND1 is in the H state. Thereby, the output signal Q of the RS latch RS1 is in the H state. Subsequently, if the count signal LATCNT changes from being in the L state to being in the H state and is in the L state again, the first lower-order count signal for one pulse is output from the AND circuit AND2.

<Procedure (2)>

If the control signal SW5_1 and the control signal SW7_2 are in the L state and the control signal SW3_1 and the control signal SW5_2 are in the H state, the output signal (the H state) of the latch circuit D_3 is input to the AND circuit AND0, and a signal obtained by inverting the output signal (the H state) of the latch circuit D_5 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the first lower-order count signal for one pulse is output from the AND circuit AND2.

<Procedure (3)>

If the control signal SW3_1 and the control signal SW5_2 are in the L state and the control signal SW1_1 and the control signal SW3_2 are in the H state, the output signal (the H state) of the latch circuit D_1 is input to the AND circuit AND0, and a signal obtained by inverting the output signal (the H state) of the latch circuit D_3 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the first lower-order count signal for one pulse is output from the AND circuit AND2.

<Procedure (4)>

If the control signal SW1_1 and the control signal SW3_2 are in the L state and the control signal SW6_1 and the control signal SW1_2 are in the H state, the output signal (the H or L state) of the latch circuit D_6 is input to the AND circuit AND0, and a signal obtained by inverting the output signal (the H state) of the latch circuit D_1 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the first lower-order count signal for one pulse is output from the AND circuit AND2.

<Procedure (5)>

If the control signal SW6_1 and the control signal SW1_2 are in the L state and the control signal SW4_1 and the control signal SW6_2 are in the H state, the output signal (the L state) of the latch circuit D_4 is input to the AND circuit AND0, and a signal obtained by inverting the output signal (the H or L state) of the latch circuit D_6 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the first lower-order count signal for one pulse is output from the AND circuit AND2.

<Procedure (6)>

If the control signal SW4_1 and the control signal SW6_2 are in the L state and the control signal SW2_1 and the control signal SW4_2 are in the H state, the output signal (the L state) of the latch circuit D_2 is input to the AND circuit AND0, and a signal obtained by inverting the output signal (the L state) of the latch circuit D_4 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the first lower-order count signal for one pulse is output from the AND circuit AND2.

<Procedure (7)>

If the control signal SW2_1 and the control signal SW4_2 are in the L state and the control signal SW0_1 and the control signal SW2_2 are in the H state, the output signal (the L state) of the latch circuit D_0 is input to the AND circuit AND0, and a signal obtained by inverting the output signal (the L state) of the latch circuit D_2 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the first lower-order count signal for one pulse is output from the AND circuit AND2.

Thereafter, the control signal SW0_1 and the control signal SW2_2 are in the L state. According to the above-described operation, the first lower-order count signal serving as the count clock of the lower-order count unit 103 is generated as a total of seven pulses. According to the above, the generation of the first lower-order count signal ends.

Subsequently, the output signal CO of the comparison unit changes at a second timing at which a predetermined condition is satisfied, and hence the logic states of the output signals CK0 to CK7 of the VCO 100a are held in the latch unit 108. At this time, the logic states held in the latch circuits D_0 to D_7 correspond to the second lower-order phase signal.

Subsequently, the generation of the lower-order count signal based on the second lower-order phase signal (state 3) starts. First, the RS latch RS1 is reset according to the control signal RSLRST. Here, the lower-order count unit 103 is not reset. At this time, the output signal Q of the RS latch RS1 is in the L state. Subsequently, a control signal SW*_1 (*: 0 to 7) and a control signal SW*_2 (*: 0 to 7) change to the H state in a predetermined order.

<Procedure (1)>

If the control signal SW5_1 and the control signal SW7_2 are in the H state, the output signal (the H or L state) of the latch circuit D_5 is input to the AND circuit AND0, and a signal obtained by inverting the output signal (the H state) of the latch circuit D_7 is also input to the AND circuit AND0. Thereby, the output signal of the AND circuit AND0 is in the L state. Because the output signal of the AND circuit AND0 is in the L state, the output signal of the AND circuit AND1 is in the L state and the output signal Q of the RS latch RS1 is in the L state. Subsequently, the count signal LATCNT changes from being in the L state to being in the H state and is in the L state again, but the pulse of the second lower-order count signal is not output from the AND circuit AND2.

<Procedure (2)>

If the control signal SW5_1 and the control signal SW7_2 are in the L state and the control signal SW3_1 and the control signal SW5_2 are in the H state, the output signal (the L state) of the latch circuit D_3 is input to the AND circuit AND0, and a signal obtained by inverting the output signal (the H or L state) of the latch circuit D_5 is also input to the AND circuit AND0. Thereby, the output signal of the AND circuit AND0 is in the L state. Because the output signal of the AND circuit AND0 is in the L state, the output signal of the AND circuit AND1 is in the L state and the output signal Q of the RS latch RS1 is in the L state. Subsequently, the count signal LATCNT changes from being in the L state to being in the H state and is in the L state again, but the pulse of the second lower-order count signal is not output from the AND circuit AND2.

<Procedure (3)>

If the control signal SW3_1 and the control signal SW5_2 are in the L state and the control signal SW1_1 and the control signal SW3_2 are in the H state, the output signal (the L state) of the latch circuit D_1 is input to the AND circuit AND0, and a signal obtained by inverting the output signal (the L state) of the latch circuit D_3 is also input to the AND circuit AND0. Thereby, the output signal of the AND circuit AND0 is in the L state. Because the output signal of the AND circuit AND0 is in the L state, the output signal of the AND circuit AND1 is in the L state and the output signal Q of the RS latch RS1 is in the L state. Subsequently, the count signal LATCNT changes from being in the L state to being in the H state and is in the L state again, but the pulse of the second lower-order count signal is not output from the AND circuit AND2.

<Procedure (4)>

If the control signal SW1_1 and the control signal SW3_2 are in the L state and the control signal SW6_1 and the control signal SW1_2 are in the H state, the output signal (the L state) of the latch circuit D_6 is input to the AND circuit AND0, and a signal obtained by inverting the output signal (the L state) of the latch circuit D_1 is also input to the AND circuit AND0. Thereby, the output signal of the AND circuit AND0 is in the L state. Because the output signal of the AND circuit AND0 is in the L state, the output signal of the AND circuit AND1 is in the L state and the output signal Q of the RS latch RS1 is in the L state. Subsequently, the count signal LATCNT changes from being in the L state to being in the H state and is in the L state again, but the pulse of the second lower-order count signal is not output from the AND circuit AND2.

<Procedure (5)>

If the control signal SW6_1 and the control signal SW1_2 are in the L state and the control signal SW4_1 and the control signal SW6_2 are in the H state, the output signal (the H state)

of the latch circuit D_4 is input to the AND circuit AND0, and a signal obtained by inverting the output signal (the L state) of the latch circuit D_6 is also input to the AND circuit AND0. Thereby, the output signal of the AND circuit AND0 is in the H state. If the control signal LATSET changes from being in the L state to being in the H state, the output signal of the AND circuit AND1 is in the H state. Thereby, the output signal Q of the RS latch RS1 is in the H state. Subsequently, if the count signal LATCNT changes from being in the L state to being the H state and is in the L state again, the second lower-order count signal for one pulse is output from the AND circuit AND2.

<Procedure (6)>

If the control signal SW4_1 and the control signal SW6_2 are in the L state and the control signal SW2_1 and the control signal SW4_2 are in the H state, the output signal (the H state) of the latch circuit D_2 is input to the AND circuit AND0, and a signal obtained by inverting the output signal (the H state) of the latch circuit D_4 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the second lower-order count signal for one pulse is output from the AND circuit AND2.

<Procedure (7)>

If the control signal SW2_1 and the control signal SW4_2 are in the L state and the control signal SW0_1 and the control signal SW2_2 are in the H state, the output signal (the H state) of the latch circuit D_0 is input to the AND circuit AND0, and a signal obtained by inverting the output signal (the H state) of the latch circuit D_2 is also input to the AND circuit AND0. Thereby, the output signal of the AND circuit AND0 is in the L state. Because the output signal of the AND circuit AND0 is in the L state, the output signal of the AND circuit AND1 is in the L state. However, because the control signal RSLRST input to the RS latch RS1 is in the L state, the output signal Q of the RS latch RS1 is in the H state. Subsequently, if the count signal LATCNT changes from being in the L state to being in the H state and is in the L state again, the second lower-order count signal for one pulse is output from the AND circuit AND2.

Thereafter, the control signal SW0_1 and the control signal SW2_2 are in the L state. According to the above-described operation, the first lower-order count signal serving as the count clock of the lower-order count unit 103 is generated as a total of three pulses. According to the above, the generation of the second lower-order count signal ends. According to the configuration illustrated in FIG. 6, it is possible to implement a circuit that generates a lower-order count signal from a lower-order phase signal using a simple circuit configuration.

As described above, the occurrence of an encoding error can be suppressed according to this embodiment. Thus, in the AD conversion circuit, AD conversion can be performed with high accuracy even when the asymmetric oscillation circuit is used in a circuit that generates a clock.

In addition, it is possible to implement a circuit that detects a thermometer code using a simple circuit configuration by detecting a change position of a logic state of each signal after the output signals CK0 to CK8 of the VCO 100a have been arranged as illustrated in FIG. 4.

It is only necessary that the number of NAND circuits constituting the VCO 100a be an odd number greater than or equal to 3 in this embodiment. In addition, in FIG. 1, the output terminal of the NAND circuit NAND5 and the input terminal of the NAND circuit NAND8 are connected to form a path in which a signal bypasses some NAND circuits, and the output signal CK7 of the NAND circuit NAND7 becomes the count clock of the higher-order count unit 101. However, the embodiment of the present invention is not limited thereto. In FIG. 1, it is only necessary that an output terminal of a first NAND circuit (any one of the NAND circuits NAND0 to NAND8) be connected to an input terminal of a second NAND circuit located in a third stage after the first NAND circuit, and an output signal of a third NAND circuit located in a first or second stage after the first NAND circuit be the count clock of the higher-order count unit 101. When the output signal of the third NAND circuit located in the first stage after the first NAND circuit becomes the count clock of the higher-order count unit 101, it is only necessary to appropriately provide a configuration (for example, an inverter) that inverts the output signal of the third NAND circuit.

For example, the output terminal of the NAND circuit NAND3 may be connected to the input terminal of the NAND circuit NAND6, and the output signal CK4 of the NAND circuit NAND4 or the output signal CK5 of the NAND circuit NAND5 may be the count clock of the higher-order count unit 101. Alternatively, the output terminal of the NAND circuit NAND7 may be connected to the input terminal of the NAND circuit NAND1, and the output signal CK8 of the NAND circuit NAND8 or the output signal CK0 of the NAND circuit NAND0 may be the count clock of the higher-order count unit 101.

Second Embodiment

Figure 7:
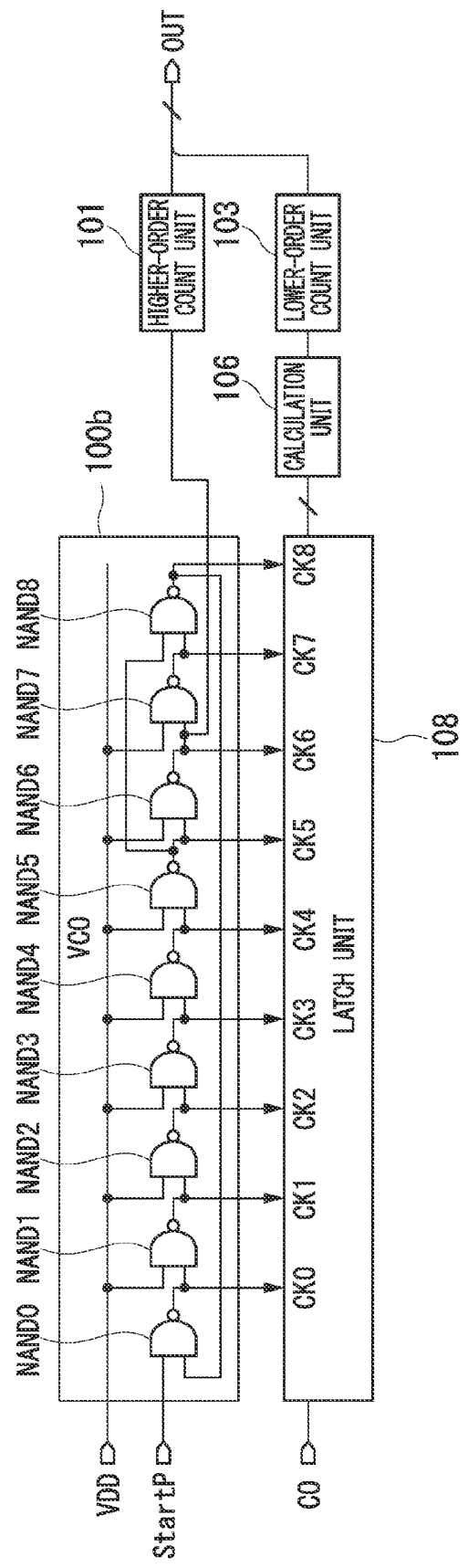
FIG. 7 is a block diagram illustrating a partial configuration of an AD conversion circuit in accordance with a second embodiment of the present invention.

Next, the second embodiment of the present invention will be described. FIG. 7 selectively illustrates part of a configuration of an AD conversion circuit in accordance with this embodiment. The circuit illustrated in FIG. 7 includes a VCO 100b (a clock generation unit), a latch unit 108, a calculation unit 106, a lower-order count unit 103, and a higher-order count unit 101. Description of the same elements as those illustrated in FIG. 1 among the elements illustrated in FIG. 7 is omitted. In this embodiment, a signal serving as a count clock of the higher-order count unit 101 is different from that of the first embodiment. In this embodiment, an output signal CK6 of a NAND circuit NAND6 becomes the count clock of the higher-order count unit 101. In addition, the higher-order count unit 101 of this embodiment performs a count operation at the falling edge of the output signal CK6.

A section formed by the VCO 100b, the latch unit 108, the calculation unit 106, the lower-order count unit 103, and the higher-order count unit 101 of FIG. 7, a ramp unit (not illustrated) (for example, corresponding to the ramp unit 19 illustrated in FIG. 16), and a comparison unit (not illustrated) (for example, corresponding to the comparison unit 109 illustrated in FIG. 16) is an example of the AD conversion circuit in accordance with this embodiment. Although output signals CK0 to CK8 of the VCO 100b are input to the latch unit 108 in FIG. 7, the calculation unit 106 detects a thermometer code using an output signal other than the output signal CK0. Thus, the output signal CK0 may not be input to the latch unit 108.

Figure 8:
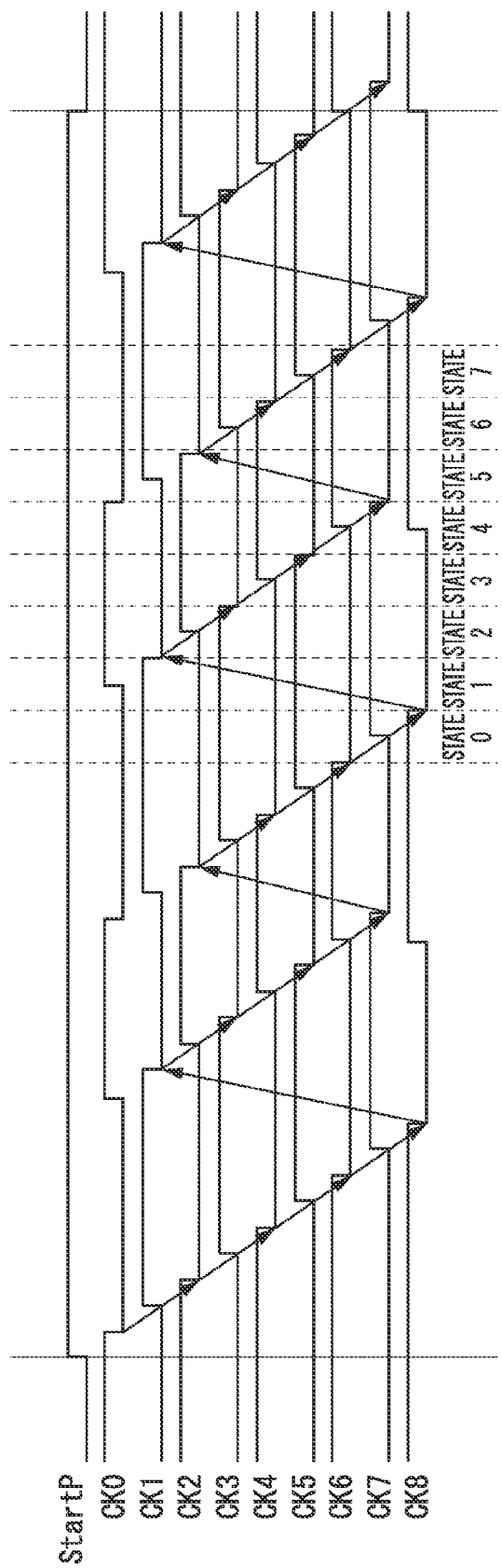
FIG. 8 is a timing chart illustrating an operation of the AD conversion circuit in accordance with the second embodiment of the present invention.

Next, an operation of the AD conversion circuit will be described. Description of operations that are the same as the operations of the AD conversion circuit in accordance with the first embodiment is omitted. FIG. 8 illustrates the waveforms of a start pulse StartP and the output signals CK0 to CK8 of the VCO 100b. In the second embodiment, states (combinations of states of the output signals CK0 to CK8 of the VCO 100b) of lower-order phase signals (equivalent to the output signals CK0 to CK8 of the VCO 100b) latched in the latch unit 108 become, for example, a total of eight states including states 0 to 7. Binarization is performed by encoding the output signals CK0 to CK8 of the VCO 100b in the eight states. For example, when the higher-order count unit 101 performs a count operation at the falling edge of the output signal CK6 of the VCO 100b, combinations of the logic states of the output signals CK0 to CK8 become states 0 to 7 in eight equal periods into which a period (a period from the falling edge of the output signal CK6 to the next falling edge) in which the higher-order count unit 101 performs one count operation is divided.

Figure 9:
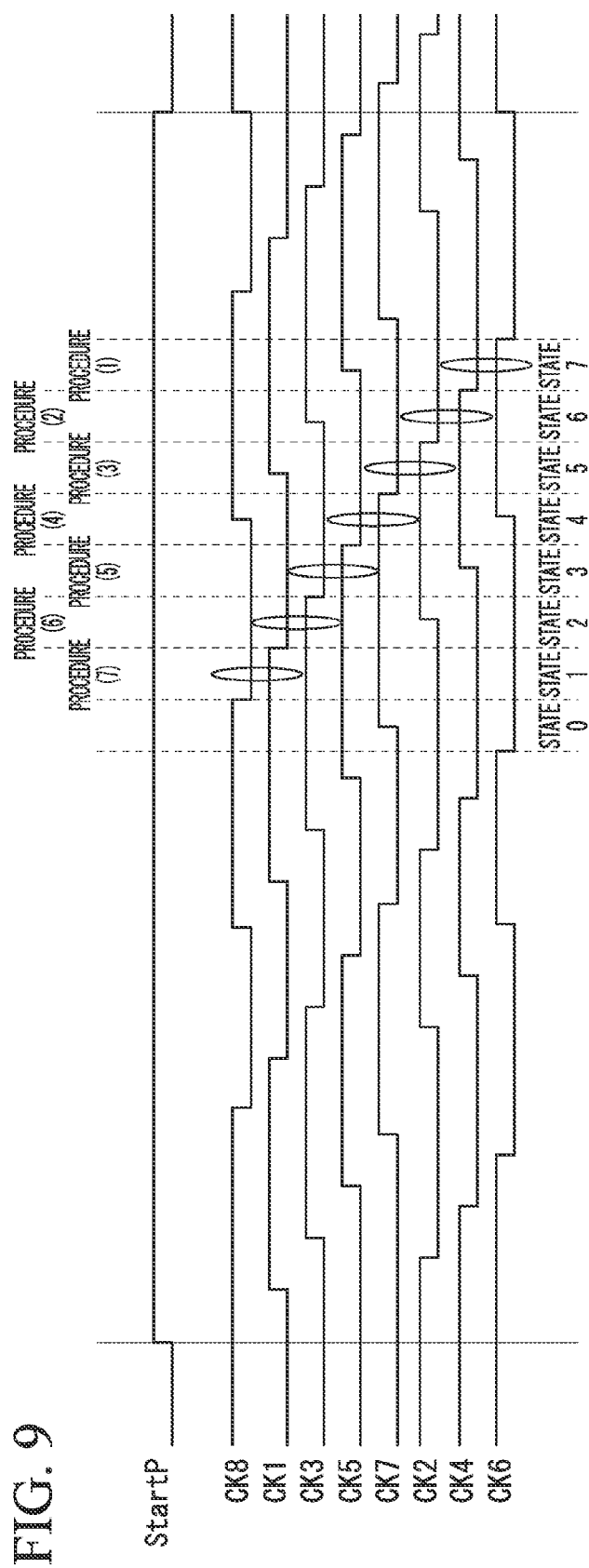
FIG. 9 is a timing chart illustrating a binarization procedure in the AD conversion circuit in accordance with the second embodiment of the present invention.

Hereinafter, content of a process in which the calculation unit 106 detects a thermometer code will be described. FIG. 9 is a timing chart illustrating a binarization procedure in the AD conversion circuit including the circuit of FIG. 7.

In FIG. 9, output signals of the VCO 100b illustrated in FIG. 8 are arranged to be a group of signals that sequentially fall (change from being in an H state to being in an L state) at predetermined time intervals. Specifically, the output signals are arranged in the order of the output signals CK8, CK1, CK3, CK5, CK7, CK2, CK4, and CK6. As illustrated in FIG. 9, when a predetermined time (corresponding to a delay time for two NAND circuits) has elapsed after the output signal CK8 has changed from being in the H state to being in the L state, the output signal CK1 changes from being in the H state to being in the L state. When a predetermined time (corresponding to a delay time for two NAND circuits) has elapsed after the output signal CK1 has changed from being in the H state to being in the L state, the output signal CK3 changes from being in the H state to being in the L state. Thereafter, likewise, the output signals CK5, CK7, CK2, CK4, and CK6 sequentially change from being in the H state to being in the L state.

A lower-order phase signal is binarized, for example, using an output signal other than the output signal CK0. Specifically, the binarization is performed by performing the following <Procedure (1)> to <Procedure (7)> in time series.

In the procedures, the state is determined according to a position at which the logic state changes from the L state to the H state in a signal group (signal stream) in which the output signals CK8, CK1, CK3, CK5, CK7, CK2, CK4, and CK6 latched in the latch unit 108 have been arranged in this order. That is, a thermometer code is detected and the state is determined according to the detected thermometer code. The "change of the logic state from the L state to the H state" indicates that a previous output signal is in the L state and a subsequent output signal is in the H state when the output signals constituting the above-described signal group are sequentially viewed.

For example, in the case of state 7, if the logic states of the output signals CK8, CK1, CK3, CK5, CK7, CK2, CK4, and CK6 are viewed in this order, the logic state between the output signal CK4 and the output signal CK6 changes from the L state to the H state. Even in the other states 0 to 6, the logic state between two output signals corresponding to each state changes from the L state to the H state. That is, it is possible to determine states by detecting positions at which the logic states of the output signals arranged as illustrated in FIG. 9 change.

Hereinafter, the procedures will be described.

<Procedure (1)> . . . Determination of whether or not the state is "state 7"

The logic states of the output signals CK6 and CK4 are compared. If there is a thermometer code here, the state is determined to be "state 7."

<Procedure (2)> . . . Determination of whether or not the state is "state 6"

The logic states of the output signals CK4 and CK2 are compared. If there is a thermometer code here, the state is determined to be "state 6."

<Procedure (3)> . . . Determination of whether or not the state is "state 5"

The logic states of the output signals CK2 and CK7 are compared. If there is a thermometer code here, the state is determined to be "state 5."

<Procedure (4)> . . . Determination of whether or not the state is "state 4"

The logic states of the output signals CK7 and CK5 are compared. If there is a thermometer code here, the state is determined to be "state 4."

<Procedure (5)> . . . Determination of whether or not the state is "state 3"

The logic states of the output signals CK5 and CK3 are compared. If there is a thermometer code here, the state is determined to be "state 3."

<Procedure (6)> . . . Determination of whether or not the state is "state 2"

The logic states of the output signals CK3 and CK1 are compared. If there is a thermometer code here, the state is determined to be "state 2."

<Procedure (7)> . . . Determination of whether or not the state is "state 1"

The logic states of the output signals CK1 and CK8 are compared. If there is a thermometer code here, the state is determined to be "state 1."

When it is determined that the state is not any one of "state 7" to "state 1" in <Procedure (1)> to <Procedure (7)>, the state is "state 0." Accordingly, it is not particularly necessary to determine whether or not the state is "state 0."

The configurations of the latch unit 108 and the calculation unit 106 may be substantially the same as those illustrated in FIG. 5. When the calculation unit 106 detects the thermometer code, a control signal SW*_1 (*: 0 to 7) and a control signal SW*_2 (*: 0 to 7) are controlled so that the above-described binarization procedure is implemented.

In this embodiment, the output signal CK6 of the output signals CK0 to CK8 of the VCO 100b becomes the count clock signal of the higher-order count unit 101. In addition, in order to detect states (states 0 to 7) of the output signals CK0 to CK8 defined based on the output signal CK6, the calculation unit 106 detects a change position of the logic state of each output signal. The calculation unit 106 generates a lower-order count signal based on the detected change position. In a procedure in which the calculation unit 106 detects the change position, the logic states of the output signals CK8 and CK6, the rising edges of which are approximately simultaneous, are not compared. Thus, the occurrence of an encoding error can be suppressed. Therefore, in the AD conversion circuit, AD conversion can be performed with high accuracy even when an asymmetric oscillation circuit is used in a circuit that generates a clock signal.

In addition, it is possible to implement a circuit that detects a thermometer code using a simple circuit configuration by detecting a change position of a logic state of each signal after the output signals CK0 to CK8 of the VCO 100b have been arranged as illustrated in FIG. 9.

It is only necessary that the number of NAND circuits constituting the VCO 100b be an odd number greater than or equal to 3 in this embodiment. In addition, in FIG. 7, the output terminal of the NAND circuit NAND5 and the input terminal of the NAND circuit NAND8 are connected to form a path in which a signal bypasses some NAND circuits, and the output signal CK6 of the NAND circuit NAND6 becomes the count clock signal of the higher-order count unit 101. However, the embodiment of the present invention is not limited thereto. In FIG. 7, it is only necessary that an output terminal of a first NAND circuit (any one of the NAND circuits NAND0 to NAND8) be connected to an input terminal of a second NAND circuit located in a third stage after the first NAND circuit, and an output signal of a third NAND circuit located in a first or second stage after the first NAND circuit be the count clock signal of the higher-order count unit 101. When the output signal of the third NAND circuit located in the second stage after the first NAND circuit becomes the count clock signal of the higher-order count unit 101, it is only necessary to appropriately provide a configuration (for example, an inverter) that inverts the output signal of the third NAND circuit.

For example, the output terminal of the NAND circuit NAND3 may be connected to the input terminal of the NAND circuit NAND6 and the output signal CK4 of the NAND circuit NAND4 or the output signal CK5 of the NAND circuit NAND5 may be the count clock signal of the higher-order count unit 101. Alternatively, the output terminal of the NAND circuit NAND7 may be connected to the input terminal of the NAND circuit NAND1 and the output signal CK8 of the NAND circuit NAND8 or the output signal CK0 of the NAND circuit NAND0 may be the count clock signal of the higher-order count unit 101.

Third Embodiment

Figure 10:
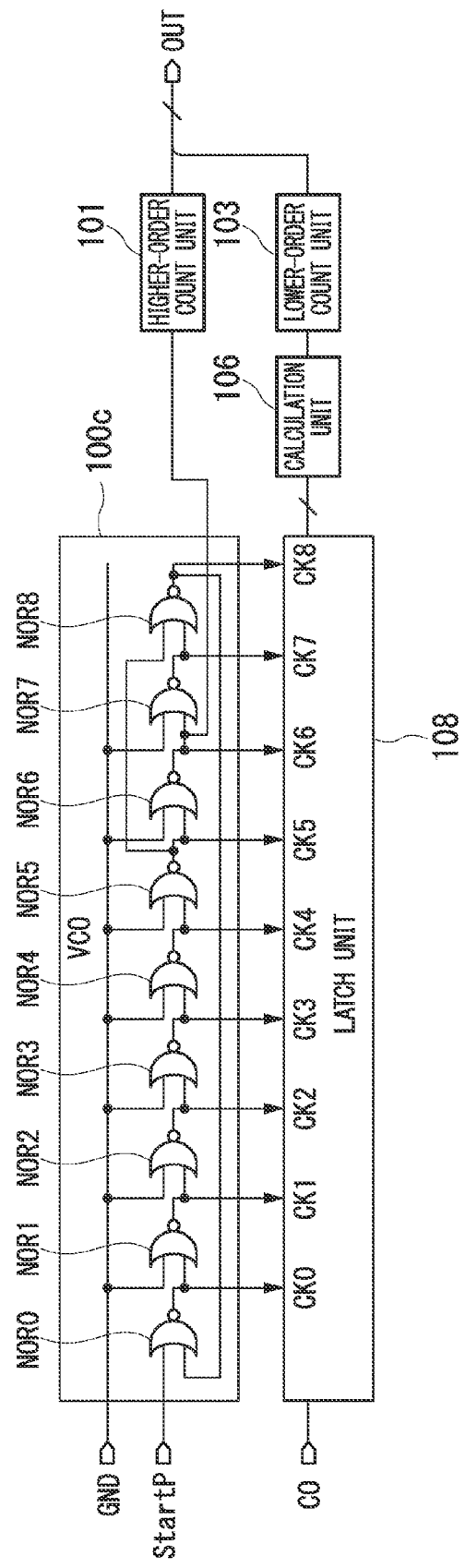
FIG. 10 is a block diagram illustrating a partial configuration of an AD conversion circuit in accordance with a third embodiment of the present invention.

Next, the third embodiment of the present invention will be described. FIG. 10 selectively illustrates part of a configuration of an AD conversion circuit in accordance with this embodiment. The circuit illustrated in FIG. 10 includes a VCO 100c (a clock signal generation unit), a latch unit 108, a calculation unit 106, a lower-order count unit 103, and a higher-order count unit 101. Description of the same elements as those illustrated in FIG. 1 among the elements illustrated in FIG. 10 is omitted.

The VCO 100c has an oscillation circuit in which nine delay units (not OR (NOR) circuits NOR0 to NOR8) are connected. A start pulse StartP is input to one input terminal of the NOR circuit NOR0 constituting the VCO 100c. An output signal CK8 of the NOR circuit NOR8 is input to the other input terminal of the NOR circuit NOR0. A ground voltage GND is input to one input terminals of the NOR circuits NOR1 to NOR7. Output signals of previous-stage NOR circuits are input to the other input terminals of the NOR circuits NOR1 to NOR7. During an operation period of the AD conversion circuit, the ground voltage GND is set to a low level. An output signal CK5 of the NOR circuit NOR5 is input to one input terminal of the NOR circuit NOR8. An output signal CK7 of the previous-stage NOR circuit NOR7 is input to the other input terminal of the NOR circuit NOR8. The output signal CK5 of the NOR circuit NOR5 is input to the NOR circuit NOR8 of a third subsequent circuit in addition to the NOR circuit NOR6 of a first subsequent circuit.

A signal based on the start pulse StartP input to the NOR circuit NOR0 is transferred through the NOR circuits NOR0 to NOR8 in two types of paths including a bypass path in which the signal reaches the NOR circuit NOR8 by bypassing the NOR circuits NOR6 and NOR7 without passing though the NOR circuits NOR6 and NOR7. According to the above-described configuration, a feed-forward loop is formed and a so-called "asymmetric oscillation circuit" is configured.

In this embodiment, the output signal CK6 of the NOR circuit NOR6 becomes the count clock signal of the higher-order count unit 101. In addition, the higher-order count unit 101 of this embodiment performs a count operation at a rising edge of the output signal CK6.

A section formed by the VCO 100c, the latch unit 108, the calculation unit 106, the lower-order count unit 103, and the higher-order count unit 101 of FIG. 10, a ramp unit (not illustrated) (for example, corresponding to the ramp unit 19 illustrated in FIG. 16), and a comparison unit (not illustrated) (for example, corresponding to the comparison unit 109 illustrated in FIG. 16) is an example of the AD conversion circuit in accordance with this embodiment. Output signals CK0 to CK8 of the VCO 100c are input to the latch unit 108 in FIG. 10. However, because the calculation unit 106 detects a thermometer code using an output signal other than the output signal CK0 as will be described later, the output signal CK0 may not be input to the latch unit 108.

Figure 11:
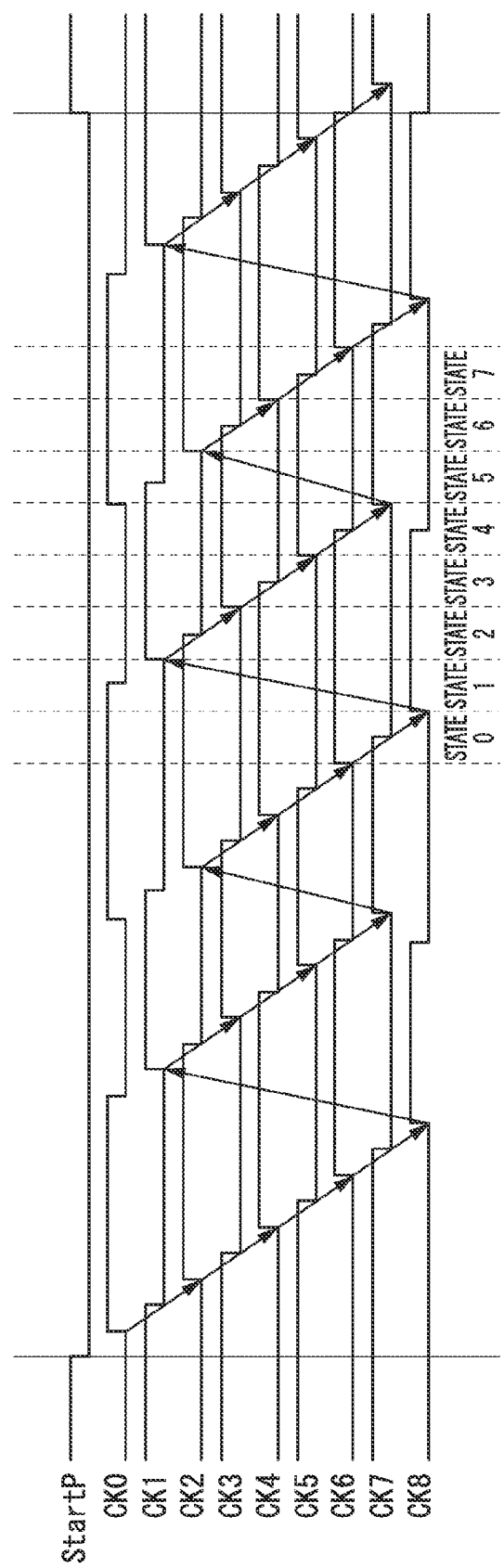
FIG. 11 is a timing chart illustrating an operation of the AD conversion circuit in accordance with the third embodiment of the present invention.

Next, an operation of the AD conversion circuit will be described. Description of operations that are the same as the operations of the AD conversion circuit in accordance with the first embodiment is omitted. FIG. 11 illustrates the waveforms of the start pulse StartP and the output signals CK0 to CK8 of the VCO 100c. In the third embodiment, states (combinations of states of the output signals CK0 to CK8 of the VCO 100c) of lower-order phase signals (equivalent to the output signals CK0 to CK8 of the VCO 100c) latched in the latch unit 108 become, for example, a total of eight states including states 0 to 7. Binarization is performed by encoding the output signals CK0 to CK8 of the VCO 100c in the eight states. For example, when the higher-order count unit 101 performs the count operation at the rising edge of the output signal CK6 of the VCO 100c, combinations of the logic states of the output signals CK0 to CK8 become states 0 to 7 in eight equal periods into which a period (a period from the rising edge of the output signal CK6 to the next rising edge) in which the higher-order count unit 101 performs one count operation is divided.

Figure 12:
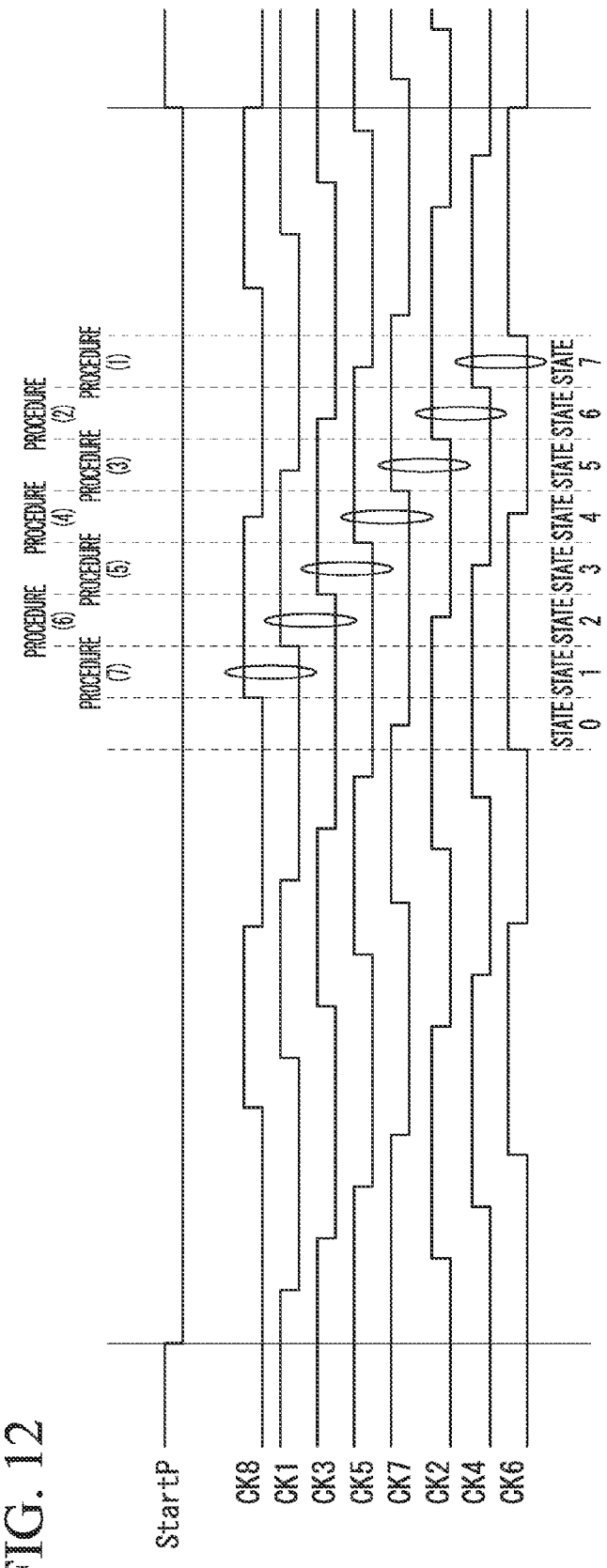
FIG. 12 is a timing chart illustrating a binarization procedure in the AD conversion circuit in accordance with the third embodiment of the present invention.

Hereinafter, content of a process in which the calculation unit 106 detects a thermometer code will be described. FIG. 12 is a timing chart illustrating a binarization procedure in the AD conversion circuit including the circuit of FIG. 10.

In FIG. 12, output signals of the VCO 100c illustrated in FIG. 11 are arranged to be a group of signals that sequentially rise (change from an L state to an H state) at predetermined time intervals. Specifically, the output signals are arranged in the order of the output signals CK8, CK1, CK3, CK5, CK7, CK2, CK4, and CK6. As illustrated in FIG. 12, when a predetermined time (corresponding to a delay time for two NOR circuits) has elapsed after the output signal CK8 has changed from being in the L state to being in the H state, the output signal CK1 changes from being in the L state to being in the H state. When a predetermined time (corresponding to a delay time for two NOR circuits) has elapsed after the output signal CK1 has changed from being in the L state to being in the H state, the output signal CK3 changes from being in the L state to being in the H state. Thereafter, likewise, the output signals CK5, CK7, CK2, CK4, and CK6 sequentially change from being in the L state to being in the H state.

The lower-order phase signal is binarized, for example, using an output signal other than the output signal CK0. Specifically, the binarization is performed by performing the following <Procedure (1)> to <Procedure (7)> in time series. In the procedures, the state is determined according to a position at which the logic state changes from the H state to the L state in a signal group (signal stream) in which the output signals CK8, CK1, CK3, CK5, CK7, CK2, CK4, and CK6 latched in the latch unit 108 have been arranged in this order. That is, a thermometer code is detected and the state is determined according to the detected thermometer code. The "change of the logic state from the H state to the L state" indicates that a previous output signal is in the H state and a subsequent output signal is in the L state when the output signals constituting the above-described signal group are sequentially viewed.

For example, in the case of state 7, if the logic states of the output signals CK8, CK1, CK3, CK5, CK7, CK2, CK4, and CK6 are viewed in this order, the logic state between the output signal CK4 and the output signal CK6 changes from being in the H state to being in the L state. Even in the other states 0 to 6, the logic state between two output signals corresponding to each state changes from the H state to the L state. That is, it is possible to determine states by detecting positions at which the logic states of the output signals arranged as illustrated in FIG. 12 change.

Hereinafter, the procedures will be described.

<Procedure (1)> . . . Determination of whether or not the state is "state 7"

The logic states of the output signals CK6 and CK4 are compared. If there is a thermometer code here, the state is determined to be "state 7."

<Procedure (2)> . . . Determination of whether or not the state is "state 6"

The logic states of the output signals CK4 and CK2 are compared. If there is a thermometer code here, the state is determined to be "state 6."

<Procedure (3)> . . . Determination of whether or not the state is "state 5"

The logic states of the output signals CK2 and CK7 are compared. If there is a thermometer code here, the state is determined to be "state 5."

<Procedure (4)> . . . Determination of whether or not the state is "state 4"

The logic states of the output signals CK7 and CK5 are compared. If there is a thermometer code here, the state is determined to be "state 4."

<Procedure (5)> . . . Determination of whether or not the state is "state 3"

The logic states of the output signals CK5 and CK3 are compared. If there is a thermometer code here, the state is determined to be "state 3."

<Procedure (6)> . . . Determination of whether or not the state is "state 2"

The logic states of the output signals CK3 and CK1 are compared. If there is a thermometer code here, the state is determined to be "state 2."

<Procedure (7)> . . . Determination of whether or not the state is "state 1"

The logic states of the output signals CK1 and CK8 are compared. If there is a thermometer code here, the state is determined to be "state 1."

When it is determined that the state is not any one of "state 7" to "state 1" in <Procedure (1)> to <Procedure (7)>, the state is "state 0." Accordingly, it is not particularly necessary to determine whether or not the state is "state 0."

The configurations of the latch unit 108 and the calculation unit 106 may be substantially the same as those illustrated in FIG. 5. When the calculation unit 106 detects the thermometer code, a control signal SW*_1 (*: 0 to 7) and a control signal SW*_2 (*: 0 to 7) are controlled so that the above-described binarization procedure is implemented.

In this embodiment, the output signal CK6 of the output signals CK0 to CK8 of the VCO 100c becomes a count clock signal of the higher-order count unit 101. In addition, in order to detect states (states 0 to 7) of the output signals CK0 to CK8 defined based on the output signal CK6, the calculation unit 106 detects a change position of the logic state of each output signal. The calculation unit 106 generates a lower-order count signal based on the detected change position. In a procedure in which the calculation unit 106 detects the change position, the logic states of the output signals CK8 and CK6, the falling edges of which are approximately simultaneous, are not compared. Thus, the occurrence of an encoding error can be suppressed. Therefore, in the AD conversion circuit, AD conversion can be performed with high accuracy even when an asymmetric oscillation circuit is used in a circuit that generates a clock signal.

In addition, it is possible to implement a circuit that detects a thermometer code using a simple circuit configuration by detecting a change position of a logic state of each signal after the output signals CK0 to CK8 of the VCO 100c have been arranged as illustrated in FIG. 12.

It is only necessary that the number of NOR circuits constituting the VCO 100c be an odd number greater than or equal to 3 in this embodiment. In addition, in FIG. 10, the output terminal of the NOR circuit NOR5 and the input terminal of the NOR circuit NOR8 are connected to form a path in which a signal bypasses some NOR circuits, and the output signal CK6 of the NOR circuit NOR6 becomes a count clock signal of the higher-order count unit 101. However, the embodiment of the present invention is not limited thereto. In FIG. 10, it is only necessary that an output terminal of a first NOR circuit (any one of the NOR circuits NOR0 to NOR8) be connected to an input terminal of a second NOR circuit located in a third stage after the first NOR circuit, and the output signal of a third NOR circuit located in a first or second stage after the first NOR circuit be the count clock signal of the higher-order count unit 101. When the output signal of the third NOR circuit located in the second stage after the first NOR circuit becomes the count clock signal of the higher-order count unit 101, it is only necessary to appropriately provide a configuration (for example, an inverter) that inverts the output signal of the third NOR circuit.

For example, the output terminal of the NOR circuit NOR3 may be connected to the input terminal of the NOR circuit NOR6 and the output signal CK4 of the NOR circuit NOR4 or the output signal CK5 of the NOR circuit NOR5 may be the count clock signal of the higher-order count unit 101. Alternatively, the output terminal of the NOR circuit NOR7 may be connected to the input terminal of the NOR circuit NOR1, and the output signal CK8 of the NOR circuit NOR8 or the output signal CK0 of the NOR circuit NOR0 may be the count clock signal of the higher-order count unit 101.

Fourth Embodiment

Figure 13:
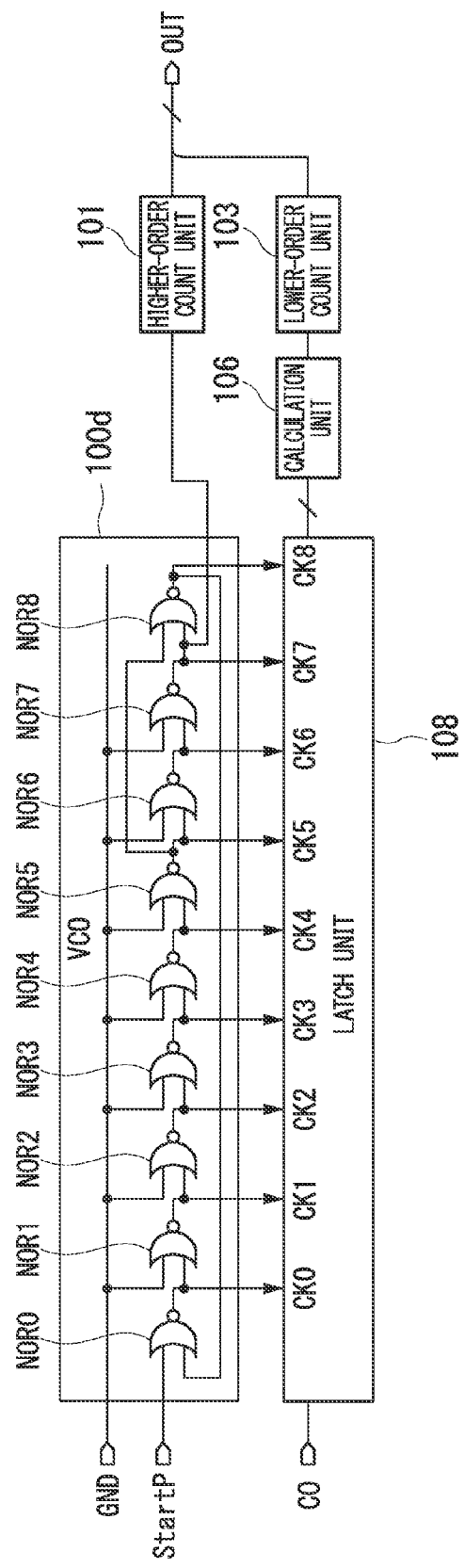
FIG. 13 is a block diagram illustrating a partial configuration of an AD conversion circuit in accordance with a fourth embodiment of the present invention.

Next, the fourth embodiment of the present invention will be described. FIG. 13 selectively illustrates part of a configuration of an AD conversion circuit in accordance with this embodiment. The circuit illustrated in FIG. 13 includes a VCO 100d (a clock signal generation unit), a latch unit 108, a calculation unit 106, a lower-order count unit 103, and a higher-order count unit 101. Description of the same elements as those illustrated in FIG. 10 among the elements illustrated in FIG. 13 is omitted. In this embodiment, a signal serving as the count clock signal of the higher-order count unit 101 is different from that of the third embodiment. In this embodiment, an output signal CK7 of a NOR circuit NOR6 becomes the count clock signal of the higher-order count unit 101. In addition, the higher-order count unit 101 of this embodiment performs a count operation at a falling edge of the output signal CK7.

A section formed by the VCO 100*d*, the latch unit 108, the calculation unit 106, the lower-order count unit 103, and the higher-order count unit 101 of FIG. 13, a ramp unit (not illustrated) (for example, corresponding to the ramp unit 19 illustrated in FIG. 16), and a comparison unit (not illustrated) (for example, corresponding to the comparison unit 109 illustrated in FIG. 16) is an example of the AD conversion circuit in accordance with this embodiment. Although output signals CK0 to CK8 of the VCO 100*d* are input to the latch unit 108 in FIG. 7, the calculation unit 106 detects a thermometer code using an output signal other than the output signal CK8 as will be described later. Thus, the output signal CK8 may not be input to the latch unit 108.

Figure 14:
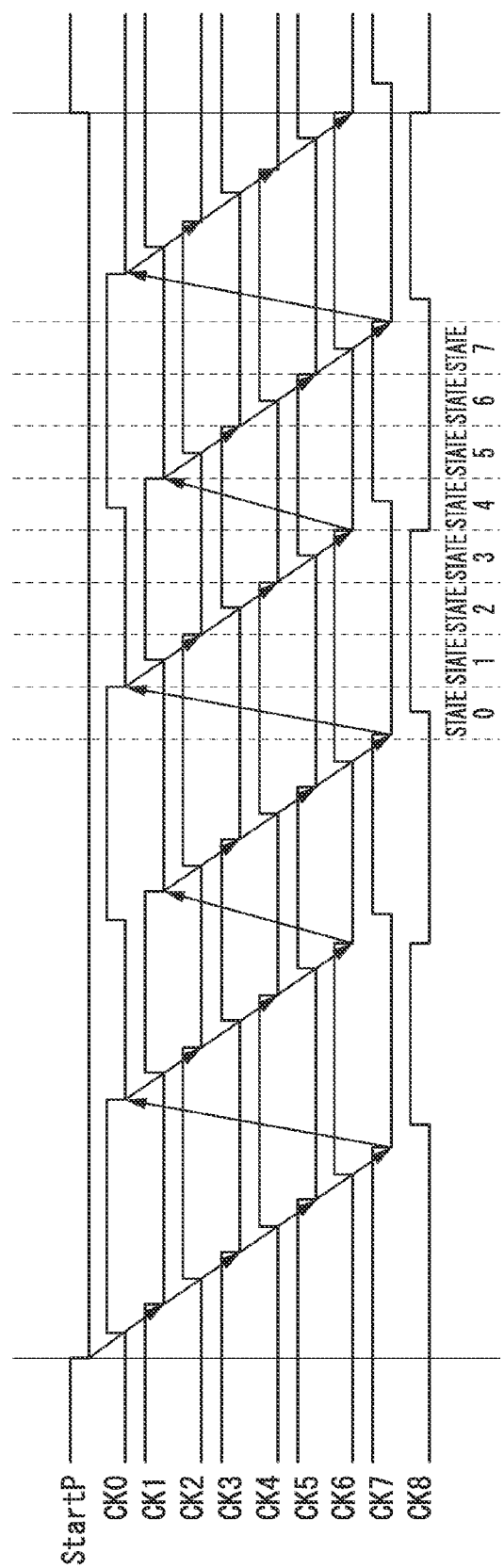
FIG. 14 is a timing chart illustrating an operation of the AD conversion circuit in accordance with the fourth embodiment of the present invention.

Next, an operation of the AD conversion circuit will be described. Description of operations that are the same as the operations of the AD conversion circuit in accordance with the first embodiment is omitted. FIG. 14 illustrates the waveforms of a start pulse StartP and the output signals CK0 to CK8 of the VCO 100*d*. In the fourth embodiment, states (combinations of states of the output signals CK0 to CK8 of the VCO 100*d*) of lower-order phase signals (equivalent to the output signals CK0 to CK8 of the VCO 100*d*) latched in the latch unit 108 become, for example, a total of eight states including states 0 to 7. Binarization is performed by encoding the output signals CK0 to CK8 of the VCO 100*d* in the eight states. For example, when the higher-order count unit 101 performs the count operation at the falling edge of the output signal CK7 of the VCO 100*d*, combinations of the logic states of the output signals CK0 to CK8 become states 0 to 7 in eight equal periods into which a period (a period from the falling edge of the output signal CK7 to the next falling edge) in which the higher-order count unit 101 performs one count operation is divided.

Figure 15:
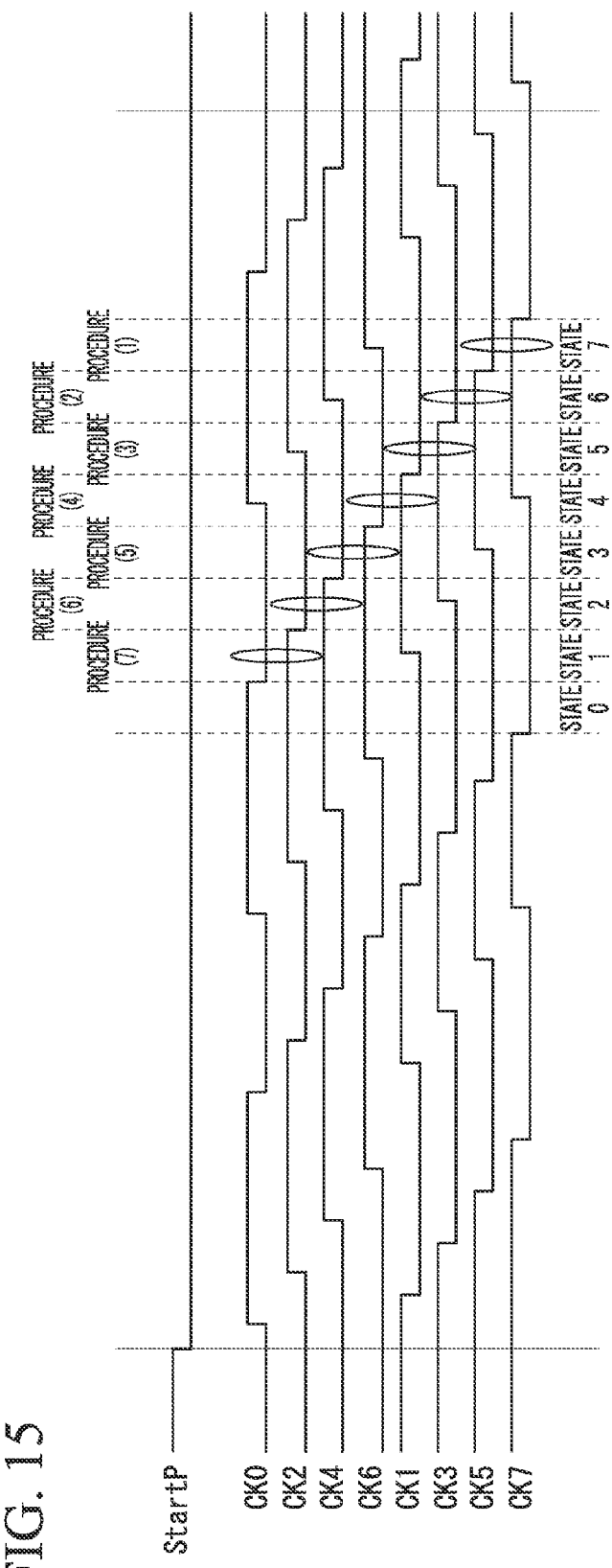
FIG. 15 is a timing chart illustrating a binarization procedure in the AD conversion circuit in accordance with the fourth embodiment of the present invention.

Hereinafter, content of a process in which the calculation unit 106 detects a thermometer code will be described. FIG. 15 is a timing chart illustrating a binarization procedure in the AD conversion circuit including the circuit of FIG. 13.

In FIG. 15, output signals of the VCO 100*d* illustrated in FIG. 14 are arranged to be a group of signals that sequentially fall (change from being in an H state to being in an L state) at predetermined time intervals. Specifically, the output signals are arranged in the order of the output signals CK0, CK2, CK4, CK6, CK1, CK3, CK5, and CK7. As illustrated in FIG. 15, when a predetermined time (corresponding to a delay time for two NOR circuits) has elapsed after the output signal CK0 has changed from being in the H state to being in the L state, the output signal CK2 changes from being in the H state to being in the L state. When a predetermined time (corresponding to a delay time for two NOR circuits) has elapsed after the output signal CK2 has changed from being in the H state to being in the L state, the output signal CK4 changes from being in the H state to being in the L state. Thereafter, likewise, the output signals CK6, CK1, CK3, CK5, and CK7 sequentially change from being in the H state to being in the L state.

The lower-order phase signal is binarized, for example, using an output signal other than the output signal CK8. Specifically, the binarization is performed by performing the following <Procedure (1)> to <Procedure (7)> in time series.

In the procedures, the state is determined according to a position at which the logic state changes from the L state to the H state in a signal group (signal stream) in which the output signals CK0, CK2, CK4, CK6, CK1, CK3, CK5, and CK7 latched in the latch unit 108 have been arranged in this order. That is, a thermometer code is detected and the state is determined according to the detected thermometer code. The "change of the logic state from the L state to the H state" indicates that a previous output signal is in the L state and a subsequent output signal is in the H state when the output signals constituting the above-described signal group are sequentially viewed.

For example, in the case of state 7, if the logic states of the output signals CK0, CK2, CK4, CK6, CK1, CK3, CK5, and CK7 are viewed in this order, the logic state between the output signal CK5 and the output signal CK7 changes from being in the L state to being in the H state. Even in the other states 0 to 6, the logic state between two output signals corresponding to each state changes from being in the L state to being in the H state. That is, it is possible to determine states by detecting positions at which the logic states of the output signals arranged as illustrated in FIG. 15 change.

Hereinafter, the procedures will be described.

<Procedure (1)> . . . Determination of whether or not the state is "state 7"

The logic states of the output signals CK7 and CK5 are compared. If there is a thermometer code here, the state is determined to be "state 7."

<Procedure (2)> . . . Determination of whether or not the state is "state 6"

The logic states of the output signals CK5 and CK3 are compared. If there is a thermometer code here, the state is determined to be "state 6."

<Procedure (3)> . . . Determination of whether or not the state is "state 5"

The logic states of the output signals CK3 and CK1 are compared. If there is a thermometer code here, the state is determined to be "state 5."

<Procedure (4)> . . . Determination of whether or not the state is "state 4"

The logic states of the output signals CK1 and CK6 are compared. If there is a thermometer code here, the state is determined to be "state 4."

<Procedure (5)> . . . Determination of whether or not the state is "state 3"

The logic states of the output signals CK6 and CK4 are compared. If there is a thermometer code here, the state is determined to be "state 3."

<Procedure (6)> . . . Determination of whether or not the state is "state 2"

The logic states of the output signals CK4 and CK2 are compared. If there is a thermometer code here, the state is determined to be "state 2."

<Procedure (7)> . . . Determination of whether or not the state is "state 1"

The logic states of the output signals CK2 and CK0 are compared. If there is a thermometer code here, the state is determined to be "state 1."

When it is determined that the state is not any one of "state 7" to "state 1" in <Procedure (1)> to <Procedure (7)>, the state is "state 0." Accordingly, it is not particularly necessary to determine whether or not the state is "state 0."

The configurations of the latch unit 108 and the calculation unit 106 may be substantially the same as those illustrated in FIG. 5. When the calculation unit 106 detects the thermometer code, a control signal SW*_1 (*: 0 to 7) and a control signal SW*_2 (*: 0 to 7) are controlled so that the above-described binarization procedure is implemented.

In this embodiment, the output signal CK7 of the outputs signals CK0 to CK8 of the VCO 100*d* becomes the count clock signal of the higher-order count unit 101. In addition, the calculation unit 106 detects states (states 0 to 7) of the output signals CK0 to CK8 defined based on the output signal CK7. Thus, the calculation unit 106 detects a change position of the logic state of each output signal, and generates a lower-order count signal based on the detected change position. In a procedure in which the calculation unit 106 detects the change position, the logic states of the output signals CK0 and CK7, the rising edges of which are approximately simultaneous, are not compared. Thus, the occurrence of an encoding error can be suppressed. Therefore, in the AD conversion circuit, AD conversion can be performed with high accuracy even when an asymmetric oscillation circuit is used in a circuit that generates a clock signal.

In addition, it is possible to implement a circuit that detects a thermometer code using a simple circuit configuration by detecting a change position of a logic state of each signal after the output signals CK0 to CK8 of the VCO 100d have been arranged as illustrated in FIG. 15.

It is only necessary that the number of NOR circuits constituting the VCO 100d be an odd number greater than or equal to 3 in this embodiment. In addition, in FIG. 13, the output terminal of the NOR circuit NOR5 and the input terminal of the NOR circuit NOR8 are connected to form a path in which a signal bypasses some NOR circuits, and the output signal CK7 of the NOR circuit NOR7 becomes the count clock signal of the higher-order count unit 101. However, the embodiment of the present invention is not limited thereto. In FIG. 13, it is only necessary that an output terminal of a first NOR circuit (any one of the NOR circuits NOR0 to NOR8) be connected to an input terminal of a second NOR circuit located in a third stage after the first NOR circuit, and an output signal of a third NOR circuit located in a first or second stage after the first NOR circuit be the count clock signal of the higher-order count unit 101. When the output signal of the third NOR circuit located in the first stage after the first NOR circuit becomes the count clock signal of the higher-order count unit 101, it is only necessary to appropriately provide a configuration (for example, an inverter) that inverts the output signal of the third NOR circuit.

For example, the output terminal of the NOR circuit NOR3 may be connected to the input terminal of the NOR circuit NOR6, and the output signal CK4 of the NOR circuit NOR4 or the output signal CK5 of the NOR circuit NOR5 may be the count clock signal of the higher-order count unit 101. Alternatively, the output terminal of the NOR circuit NOR7 may be connected to the input terminal of the NOR circuit NOR1, and the output signal CK8 of the NOR circuit NOR8 or the output signal CK0 of the NOR circuit NOR0 may be the count clock signal of the higher-order count unit 101.

Fifth Embodiment

Next, the fifth embodiment of the present invention will be described. FIG. 16 illustrates an example of a configuration of a (complementary) metal oxide semiconductor ((C)MOS) imaging apparatus in accordance with this embodiment. The imaging apparatus 1 illustrated in FIG. 16 includes an imaging unit 2, a vertical selection unit 12, a read current source unit 5, a clock signal generation unit 18, the ramp unit 19 (a reference signal generation unit), a column processing unit 15, a horizontal selection unit 14, an output unit 17, and a control unit 20.

The imaging unit 2 has a plurality of unit pixels 3 arranged in a matrix to generate and output signals corresponding to the amounts of incident electromagnetic waves. The vertical selection unit 12 selects each row of the imaging unit 2. The read current source unit 5 reads a signal from the imaging unit 2 as a voltage signal. The clock signal generation unit 18 generates and outputs a clock signal of a predetermined frequency. The ramp unit 19 generates a reference signal (ramp wave), which increases or decreases with the passage of time.

The column processing unit 15 is connected to the ramp unit 19 via a reference signal line. The horizontal selection unit 14 reads data after AD conversion to a horizontal signal line. The output unit 17 is connected to the horizontal selection unit 14. The control unit 20 controls each part.

The imaging unit 2 including unit pixels 3 in 4 rows×6 columns illustrated for simplicity in FIG. 16 will be described. However, several tens to several tens of thousands of unit pixels 3 are actually arranged in each row or column of the imaging unit 2. Although not illustrated, the unit pixel 3 constituting the imaging unit 2 includes a photoelectric conversion element such as a photodiode/photo gate/photo transistor and a transistor circuit.

Hereinafter, each part will be described in further detail. In the imaging unit 2, the unit pixels 3 in four rows and six columns are arranged two-dimensionally and a row control line 11 is wired for every row in a pixel array of the four rows and the six columns. One end of the row control line 11 is connected to each output terminal corresponding to each row of the vertical selection unit 12. The vertical selection unit 12 includes a shift register, a decoder, or the like. The vertical selection unit 12 controls row addressing or row scanning of the imaging unit 2 via the row control line 11 when each unit pixel 3 of the imaging unit 2 is driven. In addition, a vertical signal line 13 is wired for every column in the pixel array of the imaging unit 2.

The read current source unit 5 includes a current source for reading a pixel signal from the imaging unit 2 as a voltage signal.

The column processing unit 15 has a column AD conversion unit 16, for example, provided for every pixel column of the imaging unit 2, that is, for every vertical signal line 13. The column processing unit 15 converts an analog pixel signal read via the vertical signal line 13 for every pixel column from each unit pixel 3 of the imaging unit 2 into digital data. The column AD conversion unit 16 is configured to be arranged for a pixel column of the imaging unit 2 in a one-to-one correspondence relationship in this embodiment. However, this is only exemplary and the present invention is not limited to the above-described layout relationship. For example, one column AD conversion unit 16 can be arranged for a plurality of pixel columns, and the one column AD conversion unit 16 can be configured to be used by time division among the plurality of pixel columns. The column processing unit 15 includes an AD conversion means for converting an analog pixel signal read from the unit pixel 3 of a selected pixel row of the imaging unit 2 into digital pixel data, along with the ramp unit 19 and the clock signal generation unit 18 to be described later. Details of the column processing unit 15, particularly the column AD conversion unit 16, will be described later.

The ramp unit 19 includes, for example, an integral circuit. The ramp unit 19 generates a so-called ramp wave having a level that changes in an inclined shape with the passage of time according to control by the control unit 20. The ramp unit 19 supplies the ramp wave to one of input terminals of the comparison unit 109 via the reference signal line. A digital-to-analog converter (DAC) circuit as well as the integral circuit may be used as the ramp unit 19. When a digital ramp wave is configured to be generated using the DAC circuit, it is necessary to finely form the step of the ramp wave or use a configuration equivalent thereto.

The horizontal selection unit 14 includes a shift register, a decoder, or the like. The horizontal selection unit 14 controls column addressing or column scanning of the column AD conversion unit 16 of the column processing unit 15. According to control by the horizontal selection unit 14, digital data after AD conversion by the column AD conversion unit 16 is sequentially read to the horizontal signal line.

The clock signal generation unit 18 includes the VCO 100. This VCO 100, for example, is the VCO 100b of FIG. 7.

Because NAND circuits, which are the delay units constituting the VCO 100b, are connected in nine stages, the VCO 100b outputs output signals CK1, CK2, CK3, CK4, CK5, CK6, CK7, and CK8, which are eight phase clock signals. In the case of this embodiment, an output signal CK0 is not used to detect a thermometer code.

The output unit 17 outputs binary digital data. In addition, in the output unit 17, signal processing functions, for example, black level adjustment, column variation correction, color processing, and the like, may be embedded in addition to a buffering function. Further, n-bit parallel digital data may be converted into serial data to be output.

The control unit 20 includes a functional block of a timing generator (TG), which supplies at least one of a clock signal and a pulse signal of a predetermined timing necessary for an operation of each part such as the ramp unit 19, the clock signal generation unit 18, the vertical selection unit 12, the horizontal selection unit 14, or the output unit 17, and a functional block for communicating with the TG.

Next, a configuration of the column AD conversion unit 16 will be described. Each column AD conversion unit 16 generates a pulse signal having a magnitude (pulse width) of a time-axis direction corresponding to each magnitude (voltage) of a reset level (reference level) or a signal level by comparing an analog pixel signal read from each unit pixel 3 of the imaging unit 2 via the vertical signal line 13 with a ramp wave for AD conversion applied from the ramp unit 19. The AD conversion is performed by converting data corresponding to a period of the pulse width of the pulse signal into digital data corresponding to the magnitude (voltage) of the pixel signal.

Hereinafter, details of the configuration of the column AD conversion unit 16 will be described. The column AD conversion unit 16 is provided for every column. In FIG. 1, six column AD conversion units 16 are provided. The column AD conversion units 16 for the columns have the same configuration. The column AD conversion unit 16 includes the comparison unit 109, a latch unit 108, a calculation unit 106, a lower-order count unit 103, a switching unit MUX, and a higher-order count unit 101. Here, the lower-order count unit 103 and higher-order count unit 101 are assumed to be binary counter circuits each having a latch function that holds a count value.

The comparison unit 109 converts a magnitude of a pixel signal into information (a pulse width of a pulse signal) of a time-axis direction by comparing a signal voltage corresponding to an analog pixel signal output from the unit pixel 3 of the imaging unit 2 via the vertical signal line 13 with a ramp voltage of a ramp wave supplied from the ramp unit 19. For example, a comparison output of the comparison unit 109 has an H level when the ramp voltage is greater than the signal voltage, and has an L level when the ramp voltage is less than or equal to the signal voltage.

The latch unit 108 receives the comparison output of the comparison unit 109, and latches (holds/stores) a logic state (lower-order phase signal) generated by the clock signal generation unit 18 at the timing at which the comparison output is inverted. The calculation unit 106 generates a lower-order count signal serving as a count clock signal of the lower-order count unit 103 based on the lower-order phase signal latched in the latch unit 108. The lower-order count unit 103 performs a count operation using the lower-order count signal as a count clock signal. Thereby, the lower-order count value constituting lower-order bits of digital data is obtained.

The higher-order count unit 101 performs the count operation using a clock signal (higher-order count signal) output from the clock signal generation unit 18 and input through the latch unit 108 as the count clock signal. In addition, the higher-order count unit 101 performs the count operation based on carrying or borrowing of a lower-order count value using an output signal of the lower-order count unit 103 as the count clock signal (higher-order count clock signal). Thereby, the higher-order count value constituting higher-order bits of digital data is obtained. The switching unit MUX switches the count clock signal to be input to the higher-order count unit 101 between the output signal CK6 of the VCO 100 to be output via the latch unit 108 and the output signal of the lower-order count unit 103.

Here, the lower-order phase signal latched in the latch unit 108, for example, is eight-bit data. In such a case, the lower-order count unit 103 is a three-bit counter circuit. In addition, the higher-order count unit 101, for example, is a nine-bit counter circuit. However, these are only exemplary. The present invention is not limited thereto.

Next, the operation of the imaging apparatus 1 according to this embodiment will be described. Here, a specific operation of the unit pixel 3 will not be described. However, as is well known, a reset level and a signal level are output from the unit pixel 3.

The A/D conversion is performed as follows. For example, a ramp wave falling at a predetermined slope is compared with each voltage of the reset level or the signal level, which is a pixel signal from the unit pixel 3. A period until each voltage of the reset level or the signal level coincides with the ramp wave (a ramp voltage) from when the ramp wave to be used in the above-described comparison process is generated is counted by the output signal CK6 of the VCO 100 output through the latch unit 108. Along with this, measurement is performed in the logic states of multi-phase clock signals (CK1 to CK8) having a constant phase difference and hence digital data corresponding to each magnitude of the reset level or the signal level is obtained.

Here, a reset level including noise of a pixel signal is read from each unit pixel 3 of a selected row of the imaging unit 2 as an analog pixel signal in a first read operation. Thereafter, a signal level is read in a second read operation. The reset level and the signal level are input to the column AD conversion unit 16 through the vertical signal line 13 in time series. The signal level may be read in the first read operation and then the reset level may be read in the second read operation. Hereinafter, the first and second read operations and subsequent subtraction (a correlated double sampling (CDS) process) will be described in detail. For ease of description, it is assumed that count modes of the higher-order count unit 101 and the lower-order count unit 103 are count-down modes and the higher-order count unit 101 and the lower-order count unit 103 perform count operations at the falling edge timing of the count clock signal.

<First Reading>

Initially, the higher-order count unit 101 and the lower-order count unit 103 are reset. After the first reading from the unit pixel 3 of an arbitrary pixel row to the vertical signal line 13 has been stabilized, the control unit 20 supplies control data for ramp wave generation to the ramp unit 19. After the control data is received, the ramp unit 19 outputs a ramp wave, the waveform of which temporally changes in a ramp form as a whole, as a comparison voltage to be applied to one input terminal of the comparison unit 109. The comparison unit 109 compares the ramp wave with the reset level. During this time, the higher-order count unit 101 performs the count operation using the output signal CK6 of the VCO 100 as the count clock signal. Preferably, the output start timing of the output signal of the VCO 100 and the output start timing of the ramp wave are approximately simultaneous. However, the present invention is not limited thereto.

The comparison unit 109 compares the ramp wave applied from the ramp unit 19 with the reset level. The comparison unit 109 inverts a comparison output when both voltages approximately coincide with each other (at a first timing). At the first timing, the latch unit 108 holds the logic state of the VCO 100 as a first lower-order phase signal. In addition, at the first timing, the higher-order count unit 101 stops the count operation to hold the counted value as a first higher-order count value. If a predetermined period has elapsed, the control unit 20 stops the supply of the control data to the ramp unit 19 and the output from the clock signal generation unit 18. Accordingly, the ramp unit 19 stops the generation of the ramp wave.

Subsequently, the count clock signal input to the higher-order count unit 101 is switched. The switched count clock signal is a third-bit output signal of the lower-order count unit 103. In order to suppress the occurrence of an erroneous count operation, an operation mode of the higher-order count unit 101 changes to a data protection mode, and the count clock signal is switched.

Thereafter, the calculation unit 106 detects a thermometer code of the first lower-order phase signal held in the latch unit 108. The calculation unit 106 generates a first lower-order count signal based on the detected thermometer code, and outputs the first lower-order count signal to the lower-order count unit 103. The lower-order count unit 103 performs the count operation using the first lower-order count signal as the count clock signal. Thereby, a first lower-order count value is obtained. While the lower-order count unit 103 performs the count operation, the higher-order count unit 101 performs the count operation according to a change in the third-bit output signal of the lower-order count unit 103.

Subsequently, values of bits constituting the first lower-order count value held by the lower-order count unit 103 and the first higher-order count value held by the higher-order count unit 101 are inverted. Thereafter, the count clock signal input to the higher-order count unit 101 is switched. The switched count clock signal is the output signal CK6 of the VCO 100. In order to suppress the occurrence of an erroneous count operation, the operation mode of the higher-order count unit 101 changes to the data protection mode, and the count clock signal is switched.

<Second Reading>

Subsequently, during the second reading, a signal level corresponding to the amount of incident light of each unit pixel 3 is read, and an operation that is substantially the same as that of the first reading is performed. After the second reading from the unit pixel 3 of an arbitrary pixel row to the vertical signal line 13 has been stabilized, the control unit 20 supplies control data for ramp wave generation to the ramp unit 19. After the control data is received, the ramp unit 19 outputs a ramp wave, the waveform of which temporally changes in a ramp form as a whole, as a comparison voltage to be applied to one input terminal of the comparison unit 109. The comparison unit 109 compares the ramp wave with the signal level. During this time, the higher-order count unit 101 performs the count operation using the output signal CK6 of the VCO 100 as the count clock signal. Preferably, the output start timing of the clock signal of the VCO 100 and the output start timing of the ramp wave are approximately simultaneous. However, the present invention is not limited thereto.

The comparison unit 109 compares the ramp wave applied from the ramp unit 19 with the signal level, and inverts a comparison output when both voltages approximately coincide with each other (at a second timing). At the second timing, the latch unit 108 holds the logic state of the VCO 100 as a second lower-order phase signal. In addition, at the second timing, the higher-order count unit 101 stops the count operation to hold the counted count value as a second higher-order count value. Thereby, a higher-order count value corresponding to the difference between the reset level and the signal level is obtained. When a predetermined period has elapsed, the control unit 20 stops the supply of the control data to the ramp unit 19 and the output from the clock signal generation unit 18. Accordingly, the ramp unit 19 stops the generation of the ramp wave.

Subsequently, the count clock signal input to the higher-order count unit 101 is switched. The switched count clock signal is a third-bit output signal of the lower-order count unit 103. In order to suppress the occurrence of an erroneous count operation, the operation mode of the higher-order count unit 101 changes to the data protection mode, and the count clock signal is switched.

Thereafter, the calculation unit 106 detects a thermometer code of a second lower-order phase signal held in the latch unit 108. The calculation unit 106 generates a second lower-order count signal based on the detected thermometer code, and outputs the second lower-order count signal to the lower-order count unit 103. The lower-order count unit 103 performs the count operation using the second lower-order count signal as the count clock signal. Thereby, a second lower-order count value, which is a lower-order count value corresponding to the difference between the reset level and the signal level, is obtained. While the lower-order count unit 103 performs the count operation, the higher-order count unit 101 performs the count operation according to a change in the third-bit output signal of the lower-order count unit 103.

Thus, the second lower-order count value and the second higher-order count value each corresponding to the difference between the reset level and the signal level are obtained. Ultimately, values of bits constituting the second lower-order count value held by the lower-order count unit 103 and the second higher-order count value held by the higher-order count unit 101 are inverted, and digital data including the second lower-order count value and the second higher-order count value is transferred by the horizontal selection unit 14 to the output unit 17 via the horizontal signal line.

In this embodiment, subtraction (a CDS process) is performed on a first pixel signal and a second pixel signal subsequent to the first pixel signal according to binary subtraction using a complement of 2. Assuming that a digital value obtained by performing AD conversion on the first pixel signal is A and a digital value obtained by performing AD conversion on the second pixel signal is B, an obtained subtraction result is B−A.

In this embodiment, the lower-order count unit 103 and the higher-order count unit 101 perform the count operation in the count-down mode. Thus, the lower-order count unit 103 and the higher-order count unit 101 perform the count operation based on the first pixel signal during the first reading. Further, after the inversion has been performed, a count value including the lower-order count value and the higher-order count value corresponds to the digital value A. However, because the complement of 2 is used, it is necessary to add 1 to the count value. Subsequently, the lower-order count unit 103 and the higher-order count unit 101 perform the count operation based on the second pixel signal during the second reading. Further, after the inversion has been performed, a count value including the lower-order count value and the higher-order count value corresponds to the digital value B−A. However, because the complement of 2 is used, it is necessary to add 1 to the count value. Because a change in a value due to the addition of 1 necessary after the inversion during the first reading and the addition of 1 necessary after the inversion during the second reading is offset, the addition of 1 after the inversion is not performed.

Figure 17:
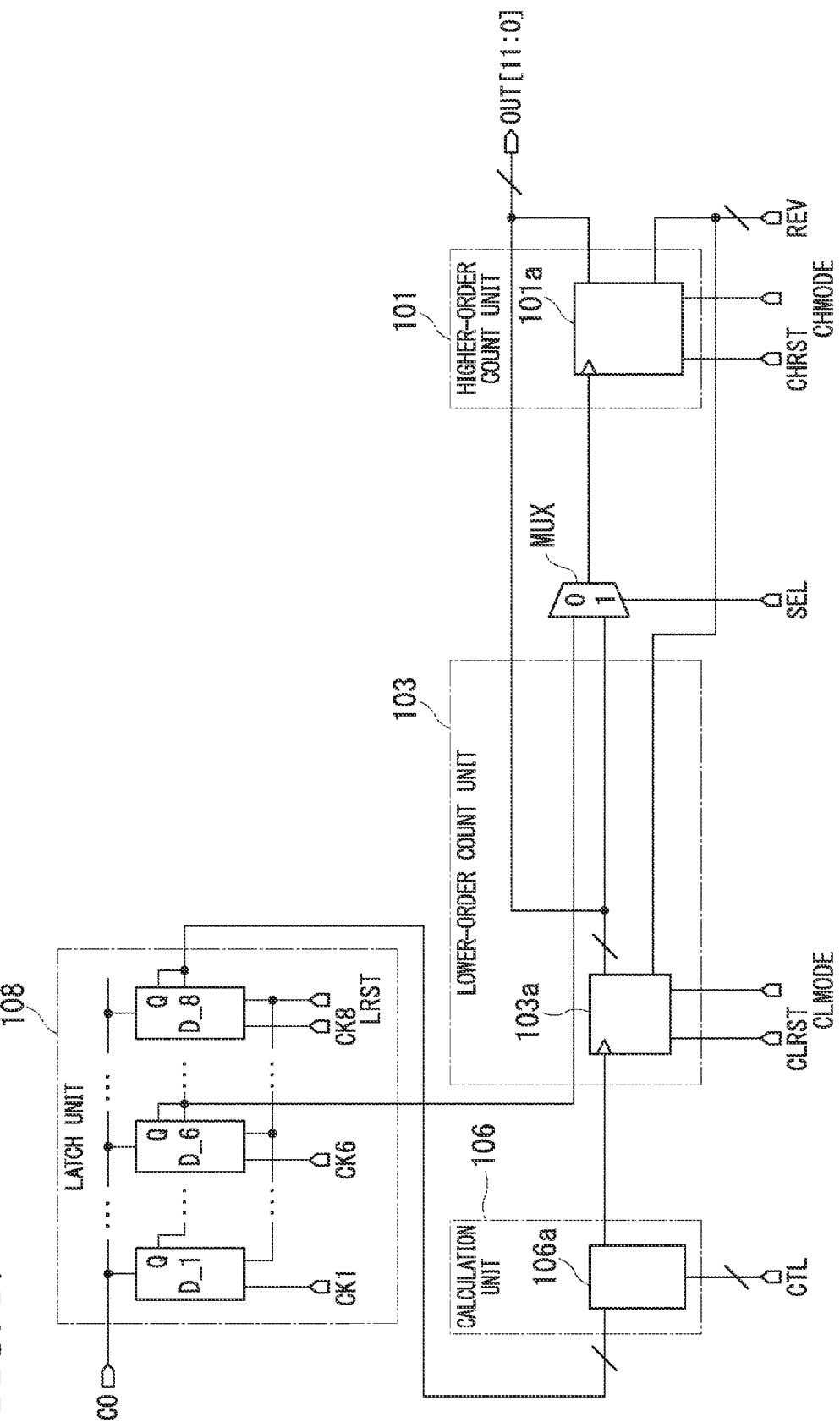
FIG. 17 is a block diagram illustrating a partial configuration of an AD conversion circuit in accordance with the fifth embodiment of the present invention.

Next, details of elements of the column AD conversion unit 16 will be described. FIG. 17 illustrates an example of a detailed configuration in which some parts excluding the comparison unit 109 have been selected to further describe the column AD conversion unit 16 of FIG. 16. Hereinafter, elements illustrated in FIG. 17 will be described. The elements illustrated in FIG. 17 correspond to those within the column AD conversion unit 16 illustrated in FIG. 16. The latch unit 108, the calculation unit 106, the lower-order count unit 103, the switching unit MUX, and the higher-order count unit 101 are provided. A section formed by the ramp unit 19, the VCO 100, and the comparison unit 109 of FIG. 16 and the elements illustrated in FIG. 17 is an example of the AD conversion circuit of this embodiment.

The latch unit 108 has latch circuits D_1 to D_8 that latch the logic states (lower-order phase signals) at predetermined timings of the output signals CK0 to CK8 of the VCO 100 according to a control signal CO corresponding to the comparison output from the comparison unit 109. The logic states of the latch circuits D_1 to D_8 are reset according to a control signal LRST. The lower-order phase signal latched by the latch unit 108 is output to the calculation unit 106. In addition, the output signal CK6 of the VCO 100 input to the latch circuit D_6 of the latch unit 108 is output to the switching unit MUX as the count clock signal for the higher-order count unit 101 to perform the count operation. Because the calculation unit 106 detects the thermometer code using an output signal other than the output signal CK0, the latch circuit D_0, which latches the output signal CK0 of the VCO 100, is not provided in FIG. 17.

The calculation unit 106 includes a calculation circuit 106a (for example, the AND circuits AND0, AND1, and AND2, and the RS circuit RS1 of FIG. 5) that generates a lower-order count signal based on the lower-order phase signal output from the latch unit 108 by a control signal CTL. The lower-order count unit 103 and the higher-order count unit 101 include a lower-order counter 103a and a higher-order counter 101a, which are binary counters that perform the count operation in the count-down mode, respectively. The switching unit MUX switches the count clock signal input to the higher-order count unit 101.

Control signals CLRST/CHRST, control signals CLMODE/CHMODE, and a control signal REV are input to the lower-order count unit 103/higher-order count unit 101. The control signals CLRST/CHRST are used to reset the lower-order count value/higher-order count value of the lower-order count unit 103/higher-order count unit 101. The control signals CLMODE/CHMODE are used to switch the operations of the lower-order count unit 103/higher-order count unit 101 between the count mode and the data protection mode. The control signal REV is used to invert the lower-order count value/higher-order count value of the lower-order count unit 103/higher-order count unit 101. In this embodiment, the counter circuit constituting the higher-order count unit 101 may also be provided with a counter circuit for a flag for determining a positive or negative. Details of the lower-order count unit 103 and the higher-order count unit 101 will be described later with reference to FIG. 20.

A control signal SEL is input to the switching unit MUX. The control signal SEL is used to switch the count clock signal to be input to the higher-order count unit 101. When the control signal SEL has been set to the L state, the signal from the latch circuit D_6 (the output signal CK6 of the VCO 100) is input to the higher-order count unit 101. When the control signal SEL has been set to the H state, the signal from the lower-order count unit 103 is input to the higher-order count unit 101.

Next, the operation of the configuration illustrated in FIG. 17 will be described using a specific example. As described above, it is assumed that count modes of the lower-order count unit 103 and the higher-order count unit 101 are count-down modes, and the lower-order count unit 103 and the higher-order count unit 101 perform count operations at the falling edge timing of the count clock signal. In the present description, the case in which a three-bit down-counter circuit is used as the lower-order count unit 103 and a nine-bit down-counter circuit is used as the higher-order count unit 101 will be described. The total number of states of the lower-order phase signal based on the eight output signals CK1 to CK8 of the VCO 100 is 8 (states 0 to 7). When the count operation has been performed in the count-down mode, a count value is 3'b000, for example, in state 0 and a count value is 3'b001, for example, in state 7.

Expressions of the above-described count values will be described. "3'b" indicates a three-bit binary number. "000" indicates the output of the lower-order count unit 103. Expressions that are approximately the same as the above-described expressions are used for the count value of the higher-order count unit 101.

Figure 18:
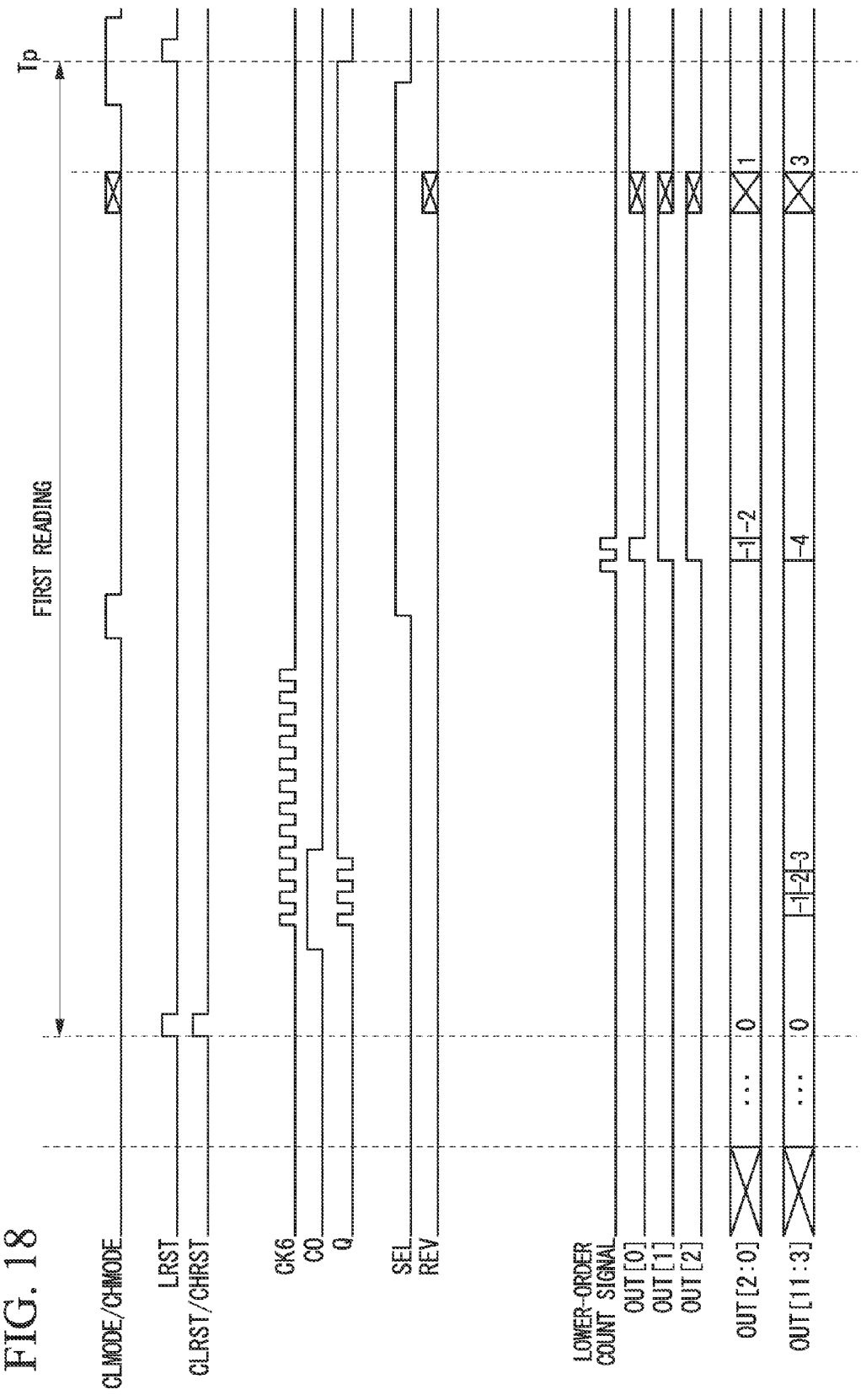
FIG. 18 is a timing chart illustrating an operation during subtraction in accordance with the fifth embodiment of the present invention.
Figure 19:
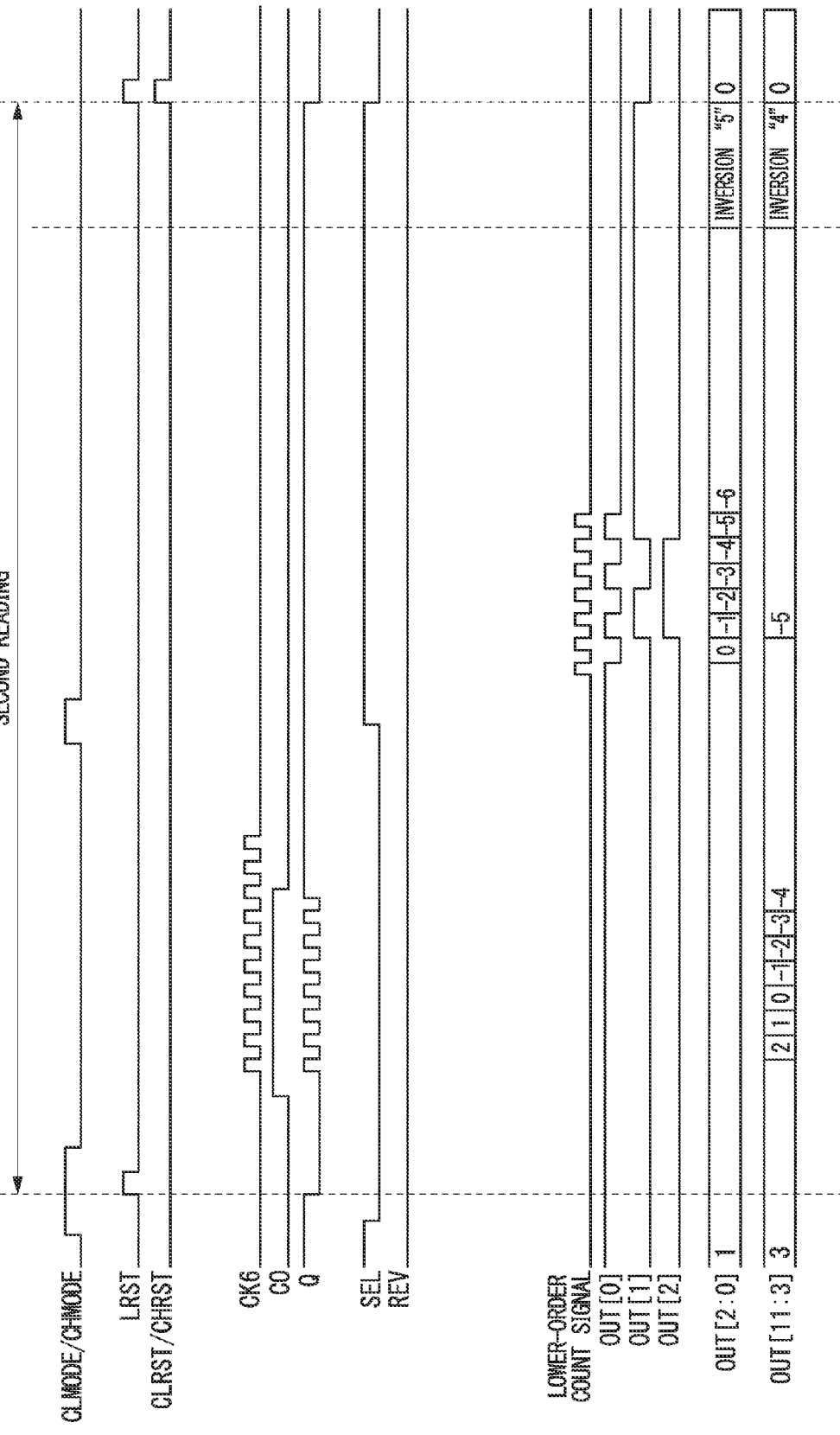
FIG. 19 is a timing chart illustrating an operation during subtraction in accordance with the fifth embodiment of the present invention.

FIGS. 18 and 19 illustrate the waveforms of signals related to the operation of the imaging apparatus 1 in accordance with this embodiment. FIG. 18 illustrates the waveforms of signals during the first reading and FIG. 19 illustrates the waveforms of signals during the second reading. In FIGS. 18 and 19, OUT[0], OUT[1], and OUT[2] indicate output signals of the lower-order count unit 103. OUT[2:0] indicates lower-order bits (from a $0^{th}$ bit to a second bit) constituting twelve-bit digital data, and OUT[11:3] indicates higher-order bits (from a third bit to an eleventh bit) constituting digital data.

Here, it is assumed that a state corresponding to the lower-order phase signal of the first pixel signal is state 2 and a higher-order count value based on the first pixel signal is 3. It is assumed that a state corresponding to the lower-order phase signal of the second pixel signal is state 7 and a higher-order count value based on the second pixel signal is 7. That is, the first pixel signal corresponds to 26 (=2+8×3), the second pixel signal corresponds to 63 (=7+8×7), and a value obtained by subtracting (a CDS process) the first pixel signal from the second pixel signal becomes 37.

<<First Reading>>

Initially, the control signals CLMODE/CHMODE are in the L state and the operation modes of the lower-order count unit 103 and the higher-order count unit 101 are set to the count modes. Subsequently, the logic states of the latch circuits D_1 to D_8 are reset according to the control signal LRST. Simultaneously, the count values of the lower-order count unit 103 and the higher-order count unit 101 are reset by the control signals CLRST/CHRST. Because the control signal SEL has been set to the L state, the count clock signal of the higher-order count unit 101 is set to the output of the latch circuit D_6 of the latch unit 108. Accordingly, until the end of a comparison process, the output signal CK6 is input to the higher-order count unit 101 via the latch circuit D_6 and the switching unit MUX, and the higher-order count unit 101 performs the count operation using the output signal CK6 as the count clock signal. At the initiation of the comparison process, a value held by the lower-order count unit 103 is 3'b000 and a value held by the higher-order count unit 101 is 9'b0000_0000_0. If these values are expressed in 12 bits, 12'b0000_0000_0000 is obtained.

At a first timing (the first timing related to the comparison of the ramp wave applied from the ramp unit 19 and the reset level in the above-described operation) at which a predetermined condition is satisfied, the output signal CO of the comparison unit 109 is inverted, and the states of the output signals CK1 to CK8, which are the logic states of the VCO 100 at that time, are held (the first lower-order phase signal). Simultaneously, the higher-order count unit 101 stops the count operation. At this time, a value held by the lower-order count unit 103 is 3'b000 and a value held by the higher-order count unit 101 is 9'b1111_1110_1 (corresponding to −3). If these values are expressed in 12 bits, 12'b1111_1110_1000 is obtained.

Subsequently, the control signals CLMODE/CHMODE are in the H state. Thereby, the operation modes of the lower-order count unit 103 and the higher-order count unit 101 become the data protection modes. Thereafter, the control signal SEL is set to the H state. At this time, the count clock signal of the higher-order count unit 101 is a third-bit output signal of the lower-order count unit 103. In this embodiment, the inverted output of the third bit of the lower-order count unit 103 is input to the higher-order count unit 101. At this time, a value held by the lower-order count unit 103 is 3'b000 and a value held by the higher-order count unit 101 is 9'b1111_1110_1 (corresponding to −3). If these values are expressed in 12 bits, 12'b1111_1110_1000 is obtained.

Subsequently, the control signals CLMODE/CHMODE are in the L state. Thereby, the operation modes of the lower-order count unit 103 and the higher-order count unit 101 become the count modes. Thereafter, a binarization process on the first lower-order phase signal is performed. Through the binarization process on the first lower-order phase signal, the count clock signal (first lower-order count signal) is output from the calculation unit 106 to the lower-order count unit 103, so that the lower-order count unit 103 performs the count operation.

At the timing at which the third-bit output of the lower-order count unit 103 changes from "0" to "1," the inverted output of the third bit of the lower-order count unit 103 changes from "1" to "0." According to this change, 1 is subtracted from the count value of the higher-order count unit 101. At the end of the binarization process on the first lower-order phase signal, a value held by the lower-order count unit 103 is 3'b110 (corresponding to −2), and a value held by the higher-order count unit 101 is 9'b1111_1110_0 (corresponding to −4). If these values are expressed in 12 bits, 12'b1111_1110_0110 is obtained.

Subsequently, the count values of the lower-order count unit 103 and the higher-order count unit 101 are inverted. At this time, a value held by the lower-order count unit 103 is 3'b001 (corresponding to 1), and a value held by the higher-order count unit 101 is 9'b0000_0001_1 (corresponding to 3). If these values are expressed in 12 bits, 12'b0000_0001_1001 is obtained.

Subsequently, the control signals CLMODE/CHMODE are in the H state. Thereby, the operation modes of the lower-order count unit 103 and the higher-order count unit 101 become the data protection modes. Thereafter, the control signal SEL is set to the L state, and the count clock signal of the higher-order count unit 101 is set to the output of the latch circuit D_6 of the latch unit 108. At this time, a value held by the lower-order count unit 103 is 3'b001 (corresponding to 1), and a value held by the higher-order count unit 101 is 9'b0000_0001_1 (corresponding to 3). If these values are expressed in 12 bits, 12'b0000_0001_1001 is obtained.

<<Second Reading>>

Subsequently, the latch circuits D_1 to D_8 are reset by the control signal LRST. Here, the count values of the lower-order count unit 103 and the higher-order count unit 101 are not reset according to the control signals CLRST/CHRST. Thereafter, the control signals CLMODE/CHMODE are in the L state. Thereby, the operation modes of the lower-order count unit 103 and the higher-order count unit 101 become the count modes. At this time, a value held by the lower-order count unit 103 is 3'b001 (corresponding to 1), and a value held by the higher-order count unit 101 is 9'b0000_0001_1 (corresponding to 3). If these values are expressed in 12 bits, 12'b0000_0001_1001 is obtained.

At a second timing (the second timing related to the comparison of the ramp wave applied from the ramp unit 19 and the signal level in the above-described operation) at which a predetermined condition is satisfied, the output signal CO of the comparison unit 109 is inverted, and the states of the output signals CK1 to CK8, which are the logic states of the VCO 100 at that time, are held (the second lower-order phase signal). Simultaneously, the higher-order count unit 101 stops the count operation. At this time, a value held by the lower-order count unit 103 is 3'b001 (corresponding to 1), and a value held by the higher-order count unit 101 is 9'b1111_1110_0 (corresponding to −4). If these values are expressed in 12 bits, 12'b1111_1110_0001 is obtained.

Subsequently, the control signals CLMODE/CHMODE are in the H state. Thereby, the operation modes of the lower-order count unit 103 and the higher-order count unit 101 become the data protection modes. Thereafter, the control signal SEL is set to the H state. At this time, the count clock signal of the higher-order count unit 101 is the third-bit output signal of the lower-order count unit 103. In this embodiment, the inverted output of the third bit of the lower-order count unit 103 is input to the higher-order count unit 101. At this time, a value held by the lower-order count unit 103 is 3'b001 (corresponding to 1), and a value held by the higher-order count unit 101 is 9'b1111_1110_0 (corresponding to −4). If these values are expressed in 12 bits, 12'b1111_1110_0001 is obtained.

Subsequently, the control signals CLMODE/CHMODE are in the L state. Thereby, the operation modes of the lower-order count unit 103 and the higher-order count unit 101 are set to the count modes. Thereafter, a binarization process on the second lower-order phase signal is performed. Through the binarization process on the second lower-order phase signal, a count clock signal (second lower-order count signal) is output from the calculation unit 106 to the lower-order count unit 103, so that the lower-order count unit 103 performs the count operation.

At the timing at which the third-bit output of the lower-order count unit 103 changes from "0" to "1," the inverted output of the third bit of the lower-order count unit 103 changes from "1" to "0." According to this change, 1 is subtracted from the count value of the higher-order count unit 101. At the point in time at which the binarization process on the second lower-order phase signal ends, a value held by the lower-order count unit 103 is 3'b010 (corresponding to −6), and a value held by the higher-order count unit 101 is 9'b1111_1101_1 (corresponding to −5). If these values are expressed in 12 bits, 12'b1111_1101_1010 is obtained.

Ultimately, the count values of the lower-order count unit 103 and the higher-order count unit 101 are inverted (not illustrated in FIG. 19).

At this time, a value held by the lower-order count unit 103 is 3'b101 (corresponding to 5), and a value held by the higher-order count unit 101 is 9'b0000_0010_0 (corresponding to 4). If these values are expressed in 12 bits, 12'b0000_0010_0101 (corresponding to 37) is obtained.

Digital data including the second lower-order count value and the second higher-order count value is transferred by the horizontal selection unit 14 to the output unit 17 via the horizontal signal line. The digital data during the second reading may be inverted even after the digital data is transferred to the output unit 17. Through the above operation, binary data corresponding to the difference between the first pixel signal and the second pixel signal is obtained.

Figure 20:
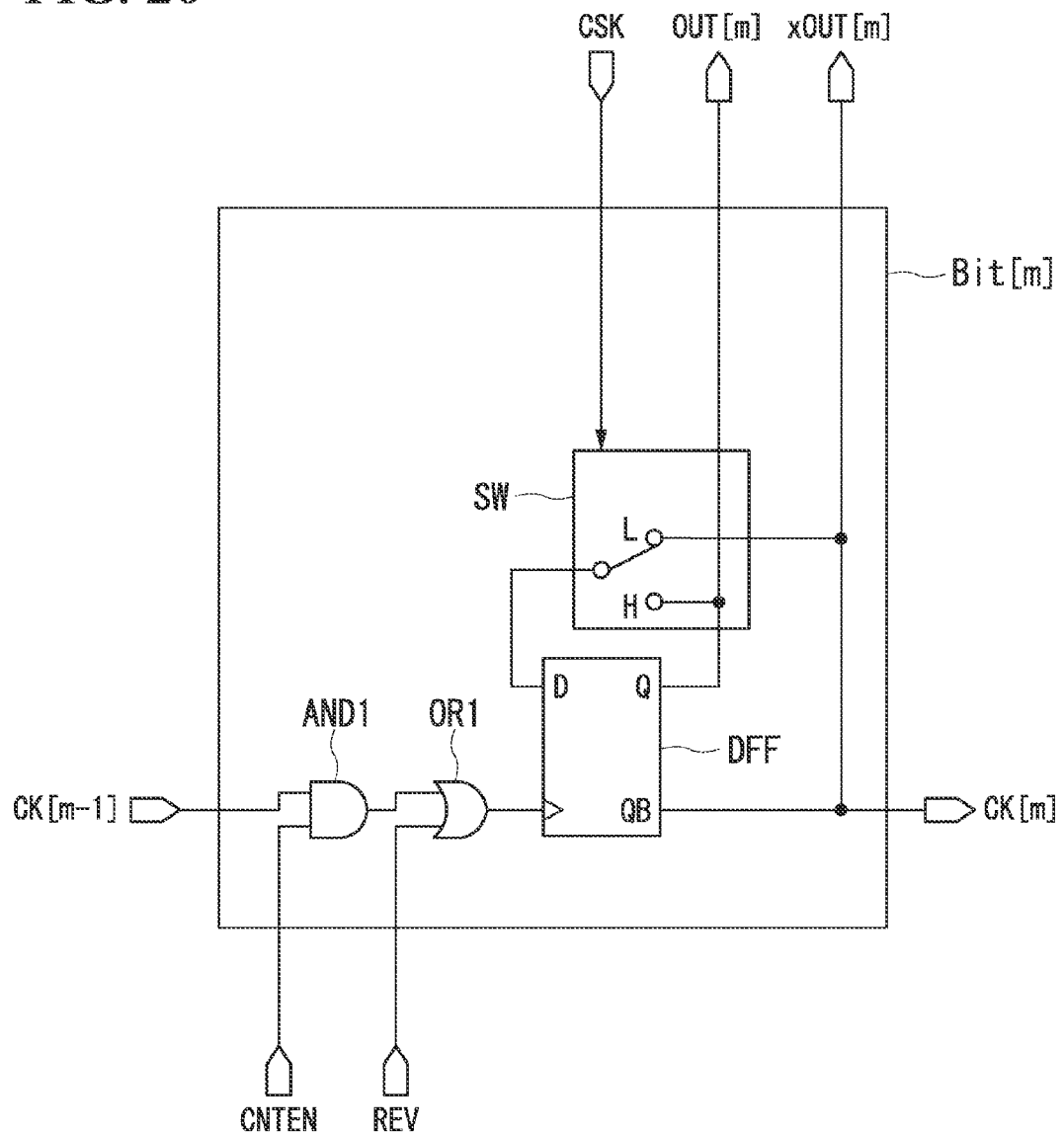
FIG. 20 is a circuit diagram illustrating a configuration of a binary counter circuit in accordance with the fifth embodiment of the present invention.

Next, details of counter circuits used in the lower-order count unit 103 and the higher-order count unit 101 will be described. FIG. 20 illustrates an example of the configuration of a counter circuit Bit[m] (m: 0 to n−1) for one bit. The counter circuit Bit[m] illustrated in FIG. 20 includes a flip-flop circuit DFF, an AND circuit AND1, an OR circuit OR1, and a changeover switch SW.

The flip-flop circuit DFF includes a D flip-flop. The AND circuit AND1 performs an AND operation on an output signal CK[m−1] of a counter circuit Bit[m−1] of a previous stage and a control signal CNTEN, thereby outputting a pulse for validating/invalidating the count clock signal. The OR circuit OR1 performs an OR operation on an output signal of the AND circuit AND1 and a control signal REV, thereby generating a pulse for inverting bits. The changeover switch SW switches a connection state of an input terminal D and an output terminal Q and a connection state of the input terminal D and an inverting output terminal QB based on a control signal CKS (corresponding to the control signals CLMODE/CHMODE of FIGS. 18 and 19) in order to protect bit values. If n counter circuits Bit[m] are connected, an n-bit counter circuit is configured. Preferably, bit configurations of the counter circuits are approximately the same. However, the present invention is not limited thereto.

Figure 21:
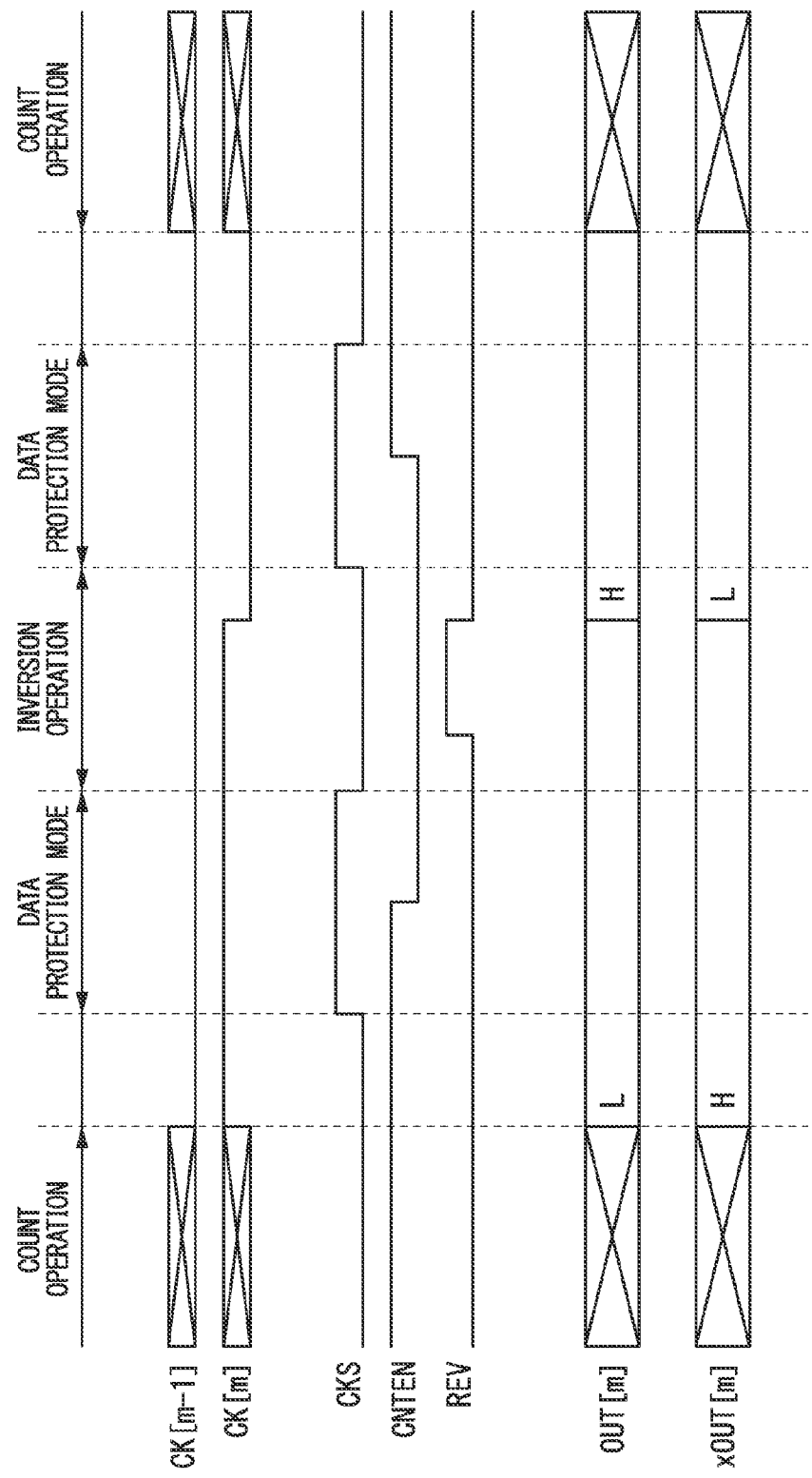
FIG. 21 is a timing chart illustrating an operation of the binary counter circuit in accordance with the fifth embodiment of the present invention.

Next, the operation of the counter circuit Bit[m], specifically, a bit inversion operation, will be described. FIG. 21 illustrates the waveforms of signals according to the operation of the counter circuit Bit[m]. Specifically, FIG. 21 illustrates the waveforms of signals according to the operation based on the bit inversion operation. During the count operation, the control signal CKS is in the L state, the control signal CNTEN is in the H state, and the control signal REV is in the L state.

After the count operation, the control signal CKS is in the H state. Thereby, because the output terminal Q and the input terminal D of the counter circuit Bit[m] are connected, the output of the counter circuit Bit[m] holds a constant state with no change, so that each bit value is protected. Subsequently, the control signal CNTEN is in the L state. Thereby, the input of the count clock signal is invalidated.

Subsequently, the control signal CKS is in the L state, so that the inverting output terminal QB and the input terminal D of the counter circuit Bit[m] are connected. Thereby, the state of a signal input to the input terminal D is inverted. Thereafter, the control signal REV changes from being in the L state to being in the H state, and further changes to the L state. At the point in time at which the control signal REV changes from being in the H state to being in the L state, the flip-flop circuit DFF holds the signal input to the input terminal D, and outputs the signal from the output terminal Q. As described above, because the state of the signal input to the input terminal D at the point in time at which the control signal CKS is in the L state is inverted, the control signal REV changes from being in the H state to being in the L state, so that the output of the counter circuit Bit[m], that is, each bit value, is inverted.

Thereafter, the control signal CKS is in the H state. Thereby, because the output terminal Q and the input terminal D of the counter circuit Bit[m] are connected, the output of the counter circuit Bit[m] holds a constant state with no change, so that each bit value is protected. Subsequently, the control signal CNTEN is in the H state. Thereby, the input of the count clock signal is validated. Ultimately, the control signal CKS is in the L state, so that the inverting output terminal QB and the input terminal D of the counter circuit Bit[m] are connected. Through the above operation, it is possible to perform the count operation again using a value obtained by inverting each bit value as an initial value. An operation of the data protection mode when the count clock signal input to the higher-order count unit 101 is switched is substantially the same as an operation of a period written as the "data protection mode" in FIG. 21.

As described above, in accordance with this embodiment, it is possible to perform subtraction (a CDS process) suppressing an encoding error in an imaging apparatus using a TDC type AD conversion circuit. Therefore, a high-quality image signal can be obtained. In addition, the subtraction (CDS process) can be performed on the first analog signal based on the first pixel signal and the second analog signal based on the second pixel signal in a digital domain.

In addition, because it is only necessary that the lower-order count unit 103 and the higher-order count unit 101 have one type of count mode (the count-down mode in this embodiment), the AD conversion circuit can be implemented using a simple circuit configuration.

Sixth Embodiment

Next, the sixth embodiment of the present invention will be described. The configuration of the imaging apparatus in accordance with this embodiment is substantially the same as that illustrated in FIG. 16, except for the column AD conversion unit 16. Because the remaining configuration is substantially the same, a description thereof is omitted here.

Figure 22:
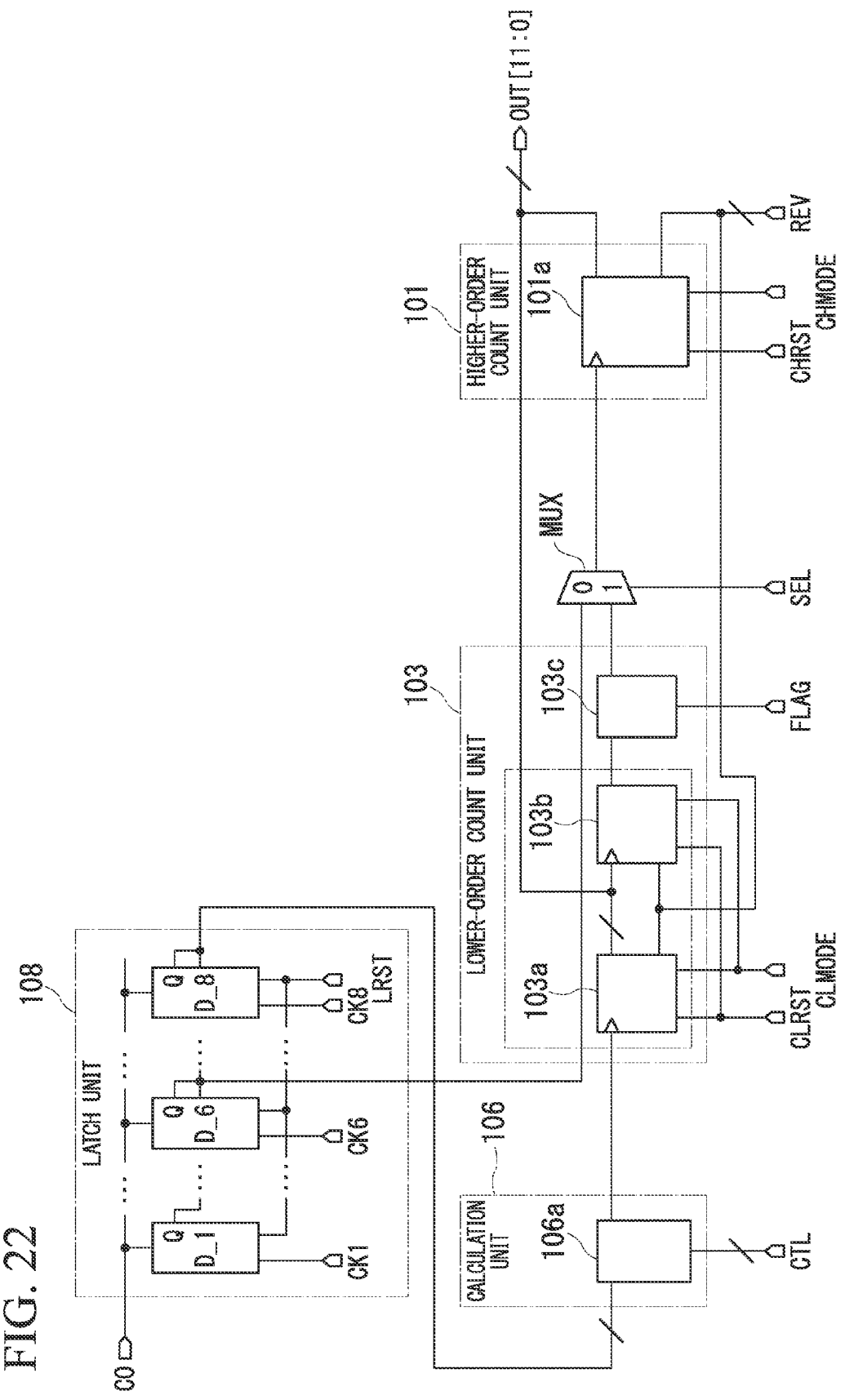
FIG. 22 is a block diagram illustrating a partial configuration of a column AD conversion unit in accordance with a sixth embodiment of the present invention.

FIG. 22 illustrates an example of a detailed configuration in which some parts excluding the comparison unit 109 have been selected further illustrating the column AD conversion unit 16 of FIG. 16. Hereinafter, the configuration illustrated in FIG. 22 will be described. As illustrated in FIG. 22, the AD conversion unit 16 in accordance with this embodiment includes a latch unit 108, a calculation unit 106, a lower-order count unit 103, a switching unit MUX, and a higher-order count unit 101. Because the elements other than the lower-order count unit 103 are substantially the same as those illustrated in FIG. 17, a description thereof is omitted here.

The lower-order count unit 103 includes lower-order counters 103a and 103b and a determination unit 103c. The lower-order counters 103a and 103b constitute a four-bit binary counter circuit. The lower-order counter 103a counts count values of first to third bits. The lower-order counter 103b counts a count value of a fourth bit (a flag bit). The lower-order counter 103b is a flag counter, which performs the count operation according to carrying or borrowing occurring when the lower-order counter 103a has performed the count operation. In this embodiment, the inverted output of the third bit of the lower-order counter 103a is input to the lower-order counter 103b.

The determination unit 103c determines whether or not it is necessary to adjust a higher-order count value based on the output signal of the lower-order counter 103b in a period designated by a control signal FLAG. When determining that it is necessary to adjust the higher-order count value, the determination unit 103c outputs a count clock signal for adjusting the higher-order count value to the switching unit MUX. A section formed by the ramp unit 19, the VCO 100, and the comparison unit 109 of FIG. 1 and elements illustrated in FIG. 22 is an example of the A/D conversion circuit of this embodiment.

Next, the operation of the imaging apparatus in accordance with this embodiment will be described. Hereinafter, first and second read operations and subsequent subtraction (a CDS process) will be described in detail. For ease of description, it is assumed that the count mode of the higher-order count unit 101 is a count-up mode and the count mode of the lower-order count unit 103 is a count-down mode. In addition, the higher-order count unit 101 and the lower-order count unit 103 perform the count operation at the timing of the falling edge of the count clock signal. In addition, description of operations that are substantially the same as the above-described operations is appropriately omitted. Although the count clock signal is switched during the first reading and the second reading in the fifth embodiment, the count clock signal is switched only during the second reading in the sixth embodiment.

<First Reading>

Initially, the higher-order count unit 101 and the lower-order count unit 103 are reset. After the first reading from the unit pixel 3 of an arbitrary pixel row to the vertical signal line 13 has been stabilized, the ramp unit 19 outputs a ramp wave. The comparison unit 109 compares the ramp wave with a reset level. During this time, the higher-order count unit 101 performs the count operation using the output signal CK6 of the VCO 100 as the count clock signal.

The comparison unit 109 compares the ramp wave applied from the ramp unit 19 with the reset level, and inverts a comparison output when both voltages approximately coincide with each other (at a first timing). At the first timing, the latch unit 108 holds the logic state of the VCO 100 as a first lower-order phase signal. In addition, at the first timing, the higher-order count unit 101 stops the count operation to hold the logic state as a first higher-order count value. Subsequently, the ramp unit 19 stops the generation of the ramp wave.

Thereafter, the calculation unit 106 detects a thermometer code of the first lower-order phase signal held in the latch unit 108. The calculation unit 106 generates a first lower-order count signal based on the detected thermometer code, and outputs the first lower-order count signal to the lower-order count unit 103. The lower-order counter 103a of the lower-order count unit 103 performs the count operation using the first lower-order count signal as the count clock signal. The lower-order counter 103b counts the third-bit output signal of the lower-order counter 103a as the count clock signal. Thereby, a first lower-order count value is obtained. Subsequently, values of bits constituting the first lower-order count value held by the lower-order count unit 103 and the first higher-order count value held by the higher-order count unit 101 are inverted.

<Second Reading>

Subsequently, during the second reading, a signal level corresponding to the amount of incident light of each unit pixel 3 is read, and an operation that is substantially the same as that of the first reading is performed. After the second reading from the unit pixel 3 of an arbitrary pixel row to the vertical signal line 13 has been stabilized, the ramp unit 19 outputs a ramp wave. The comparison unit 109 compares the ramp wave with the signal level. During this time, the higher-order count unit 101 performs the count operation using the output signal CK6 from the VCO 100 as the count clock signal.

The comparison unit 109 compares the ramp wave applied from the ramp unit 19 with the signal level, and inverts a comparison output when both voltages approximately coincide with each other (at a second timing). At the second timing, the latch unit 108 holds the logic state of the VCO 100 as a second lower-order phase signal. Further, at the second timing, the higher-order count unit 101 stops the count operation to hold the logic state as a second higher-order count value. Thereby, a higher-order count value corresponding to the difference between the reset level and the signal level is obtained. Subsequently, the ramp unit 19 stops the generation of the ramp wave.

Thereafter, the calculation unit 106 detects a thermometer code of the second lower-order phase signal held in the latch unit 108. The calculation unit 106 generates a second lower-order count signal based on the detected thermometer code, and outputs the second lower-order count signal to the lower-order count unit 103. The lower-order counter 103a of the lower-order count unit 103 performs the count operation using the second lower-order count signal as the count clock signal. The lower-order counter 103b performs the count operation using a third-bit output signal of the lower-order counter 103a as the count clock signal. Thereby, a second lower-order count value, which is a lower-order count value corresponding to the difference between the reset level and the signal level, is obtained.

Subsequently, the count clock signal input to the higher-order count unit 101 is switched. The switched count clock signal is the output signal of the determination unit 103c based on the output signal of the lower-order counter 103b. In order to suppress the occurrence of an erroneous count operation, the operation mode of the higher-order count unit 101 changes to the data protection mode, and the count clock signal is switched. The determination unit 103c outputs the count clock signal when the output signal of the lower-order counter 103b is in the H state, and does not output the count clock signal when the output signal of the lower-order counter 103b is in the L state. When the count clock signal has been output from the determination unit 103c, 1 is added to the higher-order count value of the higher-order count unit 101.

Thus, the second lower-order count value and the second higher-order count value each corresponding to the difference between the reset level and the signal level are obtained. Ultimately, only values of bits constituting the second lower-order count value held by the lower-order count unit 103 are inverted, and digital data including the second lower-order count value and the second higher-order count value is transferred by the horizontal selection unit 14 to the output unit 17 via the horizontal signal line.

In this embodiment, subtraction (a CDS process) is performed on a first pixel signal and a second pixel signal subsequent to the first pixel signal according to binary subtraction using a complement of 2. Assuming that a digital value obtained by performing AD conversion on the first pixel signal is A and a digital value obtained by performing AD conversion on the second pixel signal is B, an obtained subtraction result is B−A. In this embodiment, the lower-order count unit 103 and the higher-order count unit 101 separately perform count operations, and digital data including the lower-order count value, which is the count result of the lower-order count unit 103, and the higher-order count value, which is the count result of the higher-order count unit 101, is obtained.

In this embodiment, the lower-order count unit 103 performs the count operation in the count-down mode. Thus, the lower-order count unit 103 performs the count operation based on the first pixel signal during the first reading. Further, after the inversion has been performed, a lower-order count value corresponds to lower-order bits of the digital value A. However, because the complement of 2 is used, it is necessary to add 1 to the lower-order count value. Subsequently, the lower-order count unit 103 performs the count operation based on the second pixel signal during the second reading. Further, after the inversion has been performed, the lower-order count value corresponds to lower-order bits of the digital value B−A. However, because the complement of 2 is used, it is necessary to add 1 to the lower-order count value. Because a change in a value due to the addition of 1 necessary after the inversion during the first reading and the addition of 1 necessary after the inversion during the second reading is offset, the addition of 1 after the inversion is not performed.

On the other hand, in this embodiment, because the higher-order count unit 101 performs the count operation in the count-up mode, the higher-order count unit 101 performs the count operation based on the first pixel signal during the first reading, and the higher-order count value further corresponds to higher-order bits of the digital value−A after the inversion has been performed. However, because the complement of 2 is used, it is necessary to add 1 to the higher-order count value. Subsequently, after the higher-order count unit 101 has performed the count operation based on the second pixel signal during the second reading, the higher-order count value corresponds to higher-order bits of the digital value B−A. However, the addition of 1 necessary during the first reading after the inversion and the adjustment of the higher-order count value according to carrying/borrowing of the lower-order count value are necessary. When the lower-order count unit 103 performs the count operation based on the lower-order count signal, the adjustment of the higher-order count value due to the carrying/borrowing of the lower-order count value is necessary because the higher-order count unit 101 does not perform the count operation. In the case of this example, when the count clock signal is switched, both the adjustment of the higher-order count value according to binary subtraction performed using the complement of 2 and the adjustment of the higher-order count value according to the carrying/borrowing of the lower-order count value are performed.

Next, the operation of the configuration illustrated in FIG. 22 will be described using a specific example. As described above, it is assumed that count mode of the higher-order count unit 101 is a count-up mode and the count mode of the lower-order count unit 103 is a count-down mode and the higher-order count unit 101 and the lower-order count unit 103 perform count operations at the falling edge timing of the count clock signal. In the present description, the case in which a four-bit down-counter circuit is used as the lower-order count unit 103 and a nine-bit up-counter circuit is used as the higher-order count unit 101 will be described. The total number of states of the lower-order phase signal based on eight output signals CK1 to CK8 of the VCO 100 is 8 (states 0 to 7). When the count operation has been performed in the count-down mode, a count value is 3'b[0]000, for example, in state 0 and a count value is 3'b[1]001, for example, in state 7.

Expressions of the above-described count values will be described. "3'b" indicates a three-bit binary number. For example, "[0]000" indicates the output of the lower-order count unit 103. "[0]" indicates the output of the lower-order counter 103b, and "000" indicates the output of the lower-order counter 103a. Expressions that are approximately the same as the above-described expressions are used for the count value of the higher-order count unit 101.

Figure 23:
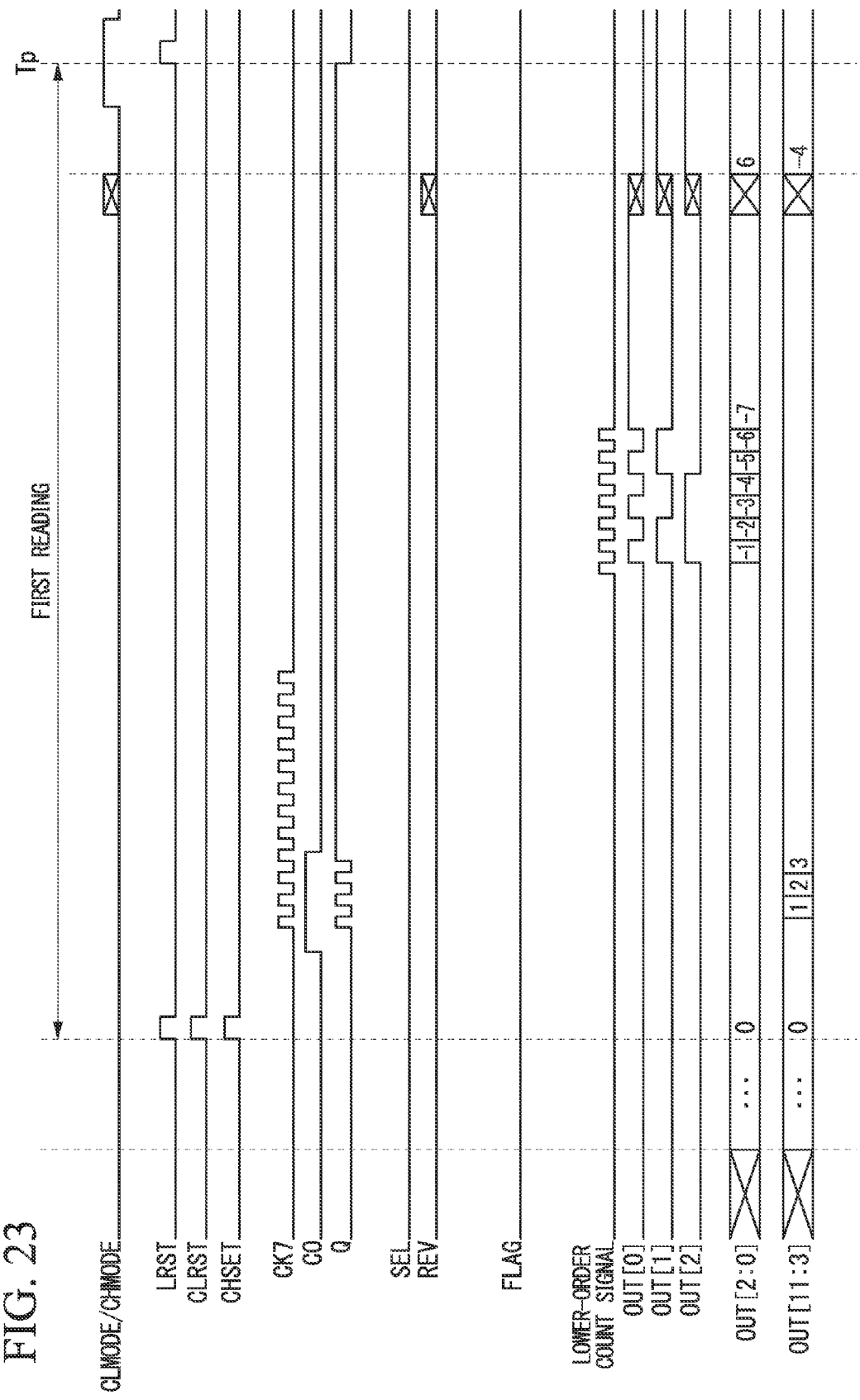
FIG. 23 is a timing chart illustrating an operation during subtraction in accordance with the sixth embodiment of the present invention.
Figure 24:
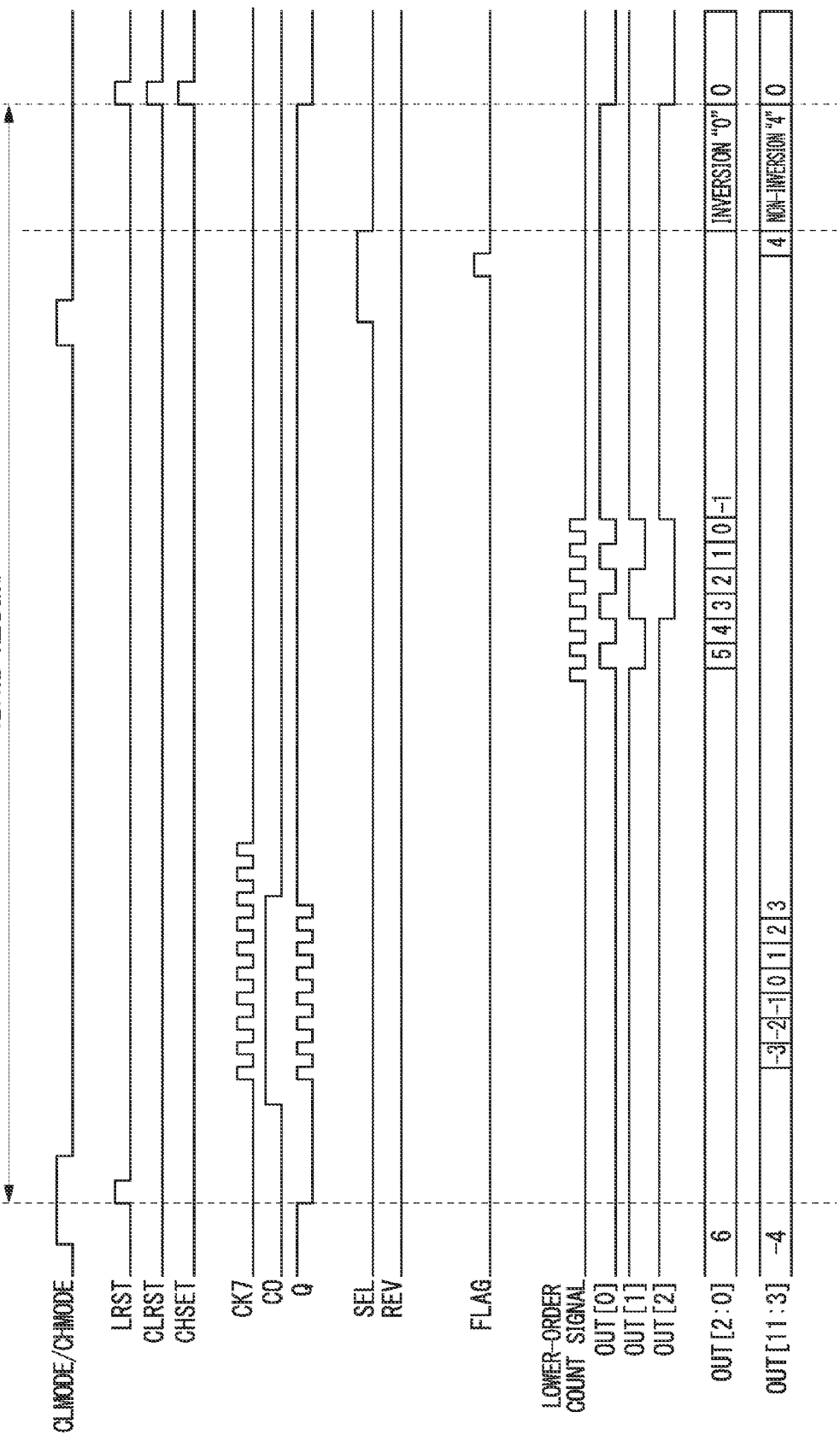
FIG. 24 is a timing chart illustrating an operation during subtraction in accordance with the sixth embodiment of the present invention.
Figure 25:
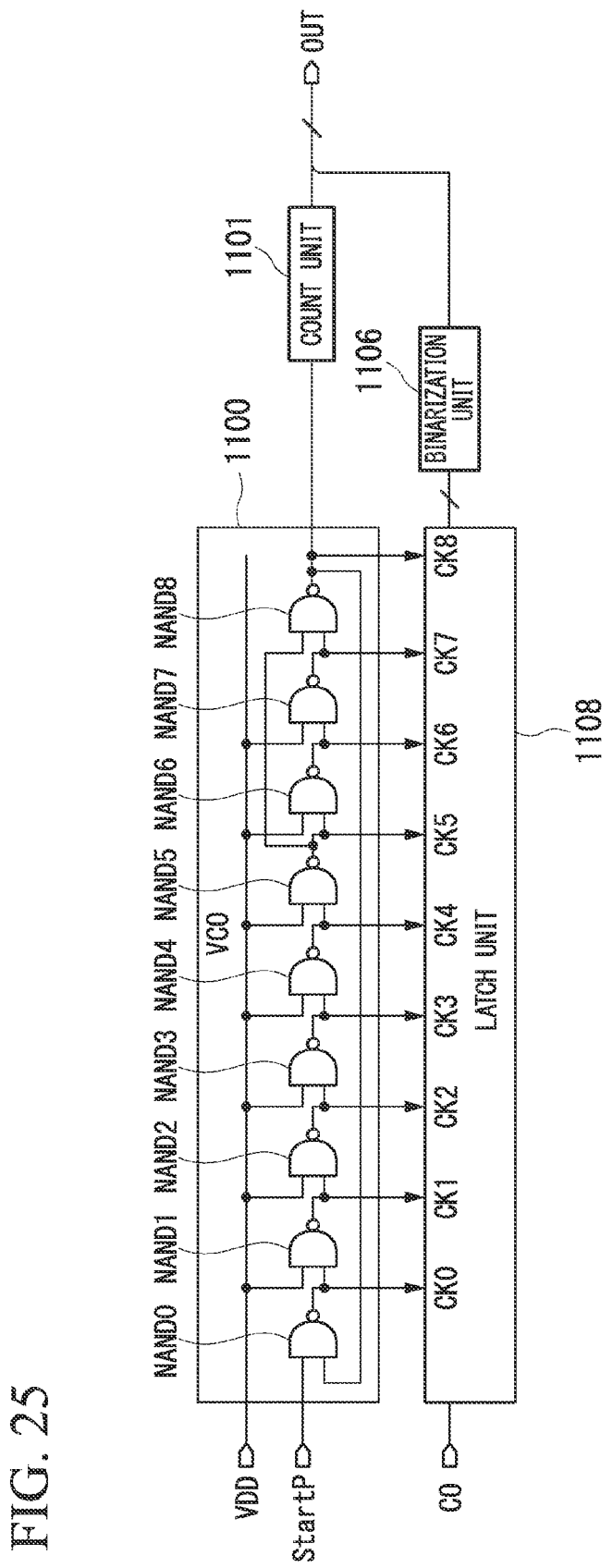
FIG. 25 is a block diagram illustrating a partial configuration of an AD conversion circuit in accordance with the related art.
Figure 26:
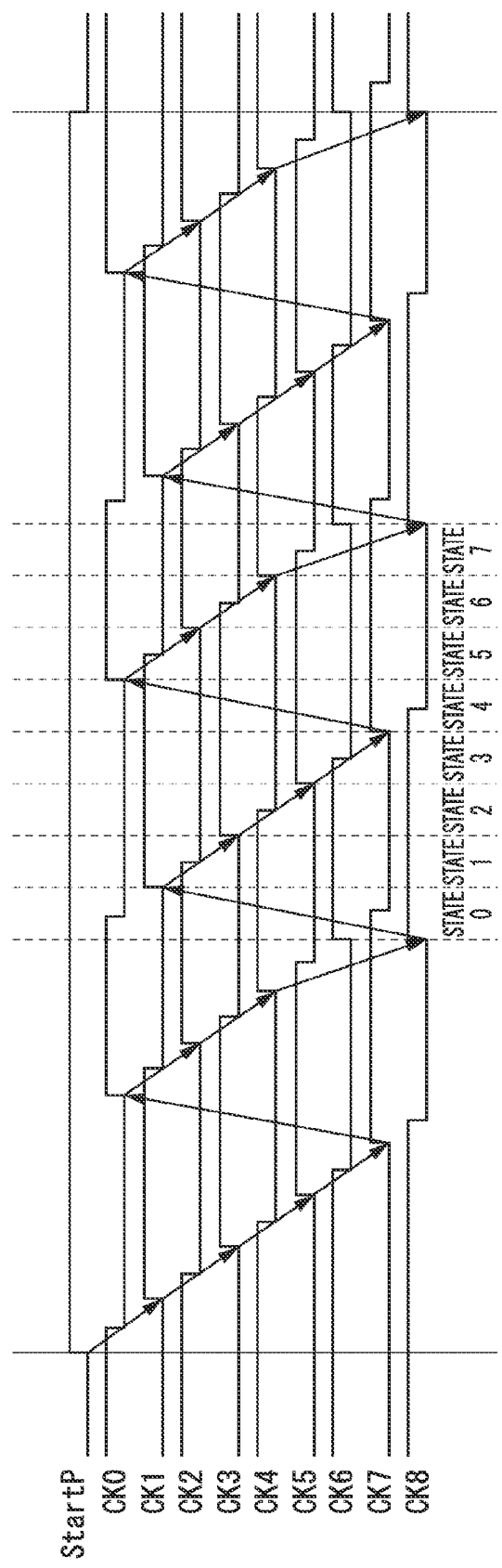
FIG. 26 is a timing chart illustrating an operation of the AD conversion circuit in accordance with the related art.
Figure 27:
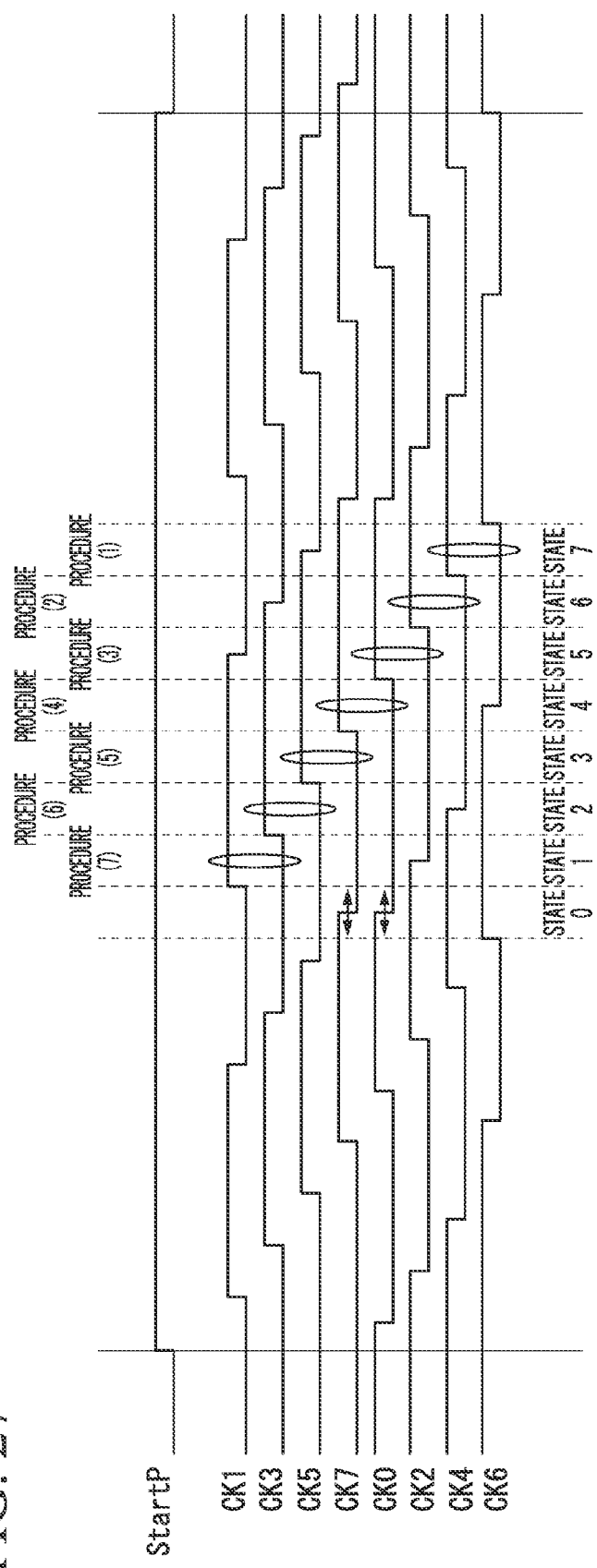
FIG. 27 is a timing chart illustrating a binarization procedure in the AD conversion circuit in accordance with the related art.
Figure 28:
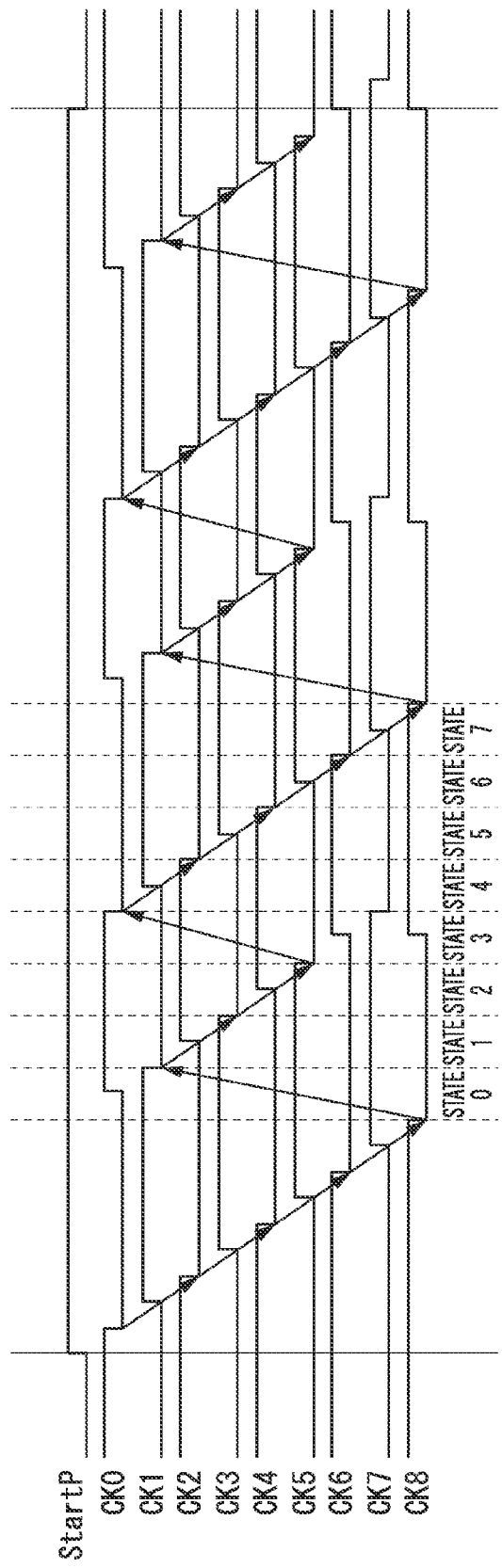
FIG. 28 is a timing chart illustrating an operation of the AD conversion circuit in accordance with the related art.
Figure 29:
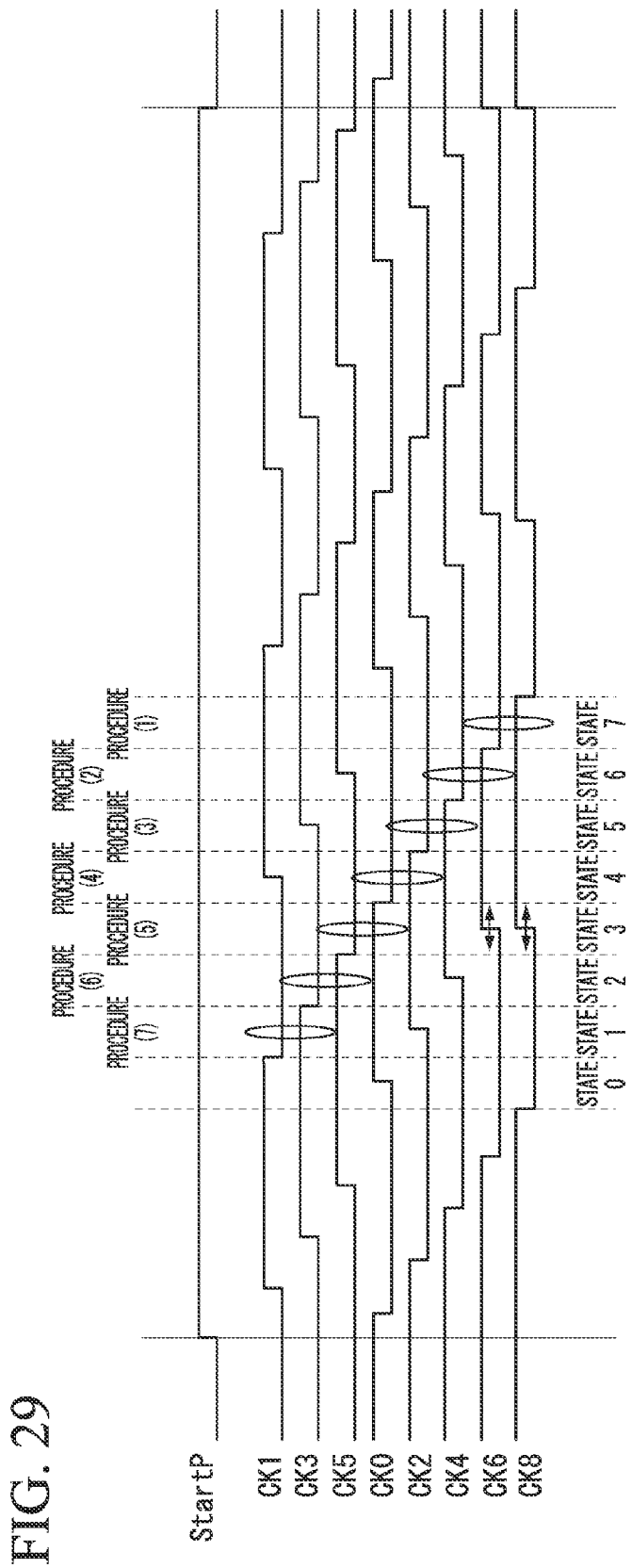
FIG. 29 is a timing chart illustrating a binarization procedure in the AD conversion circuit in accordance with the related art.

FIGS. 23 and 24 illustrate the waveforms of signals related to the operation of this embodiment. FIG. 23 illustrates the waveforms of signals during the first reading, and FIG. 24 illustrates the waveforms of signals during the second reading. In FIGS. 23 and 24, OUT[0], OUT[1], and OUT[2] indicate output signals of the lower-order count unit 103. OUT[2:0] indicates lower-order bits (from a $0^{th}$ bit to a second bit) constituting twelve-bit digital data, and OUT[11:3] indicates higher-order bits (from a third bit to an eleventh bit) constituting digital data.

Here, it is assumed that a state corresponding to the lower-order phase signal of the first pixel signal is state 7, a higher-order count value based on the first pixel signal is 3, a state corresponding to the lower-order phase signal of the second pixel signal is state 7, and a higher-order count value based on the second pixel signal is 7. That is, the first pixel signal corresponds to 31 (=7+8×3), the second pixel signal corresponds to 63 (=7+8×7), and a value obtained by subtracting (a CDS process) the first pixel signal from the second pixel signal becomes 32.

<<First Reading>>

Initially, the control signals CLMODE/CHMODE are in the L state and the operation modes of the lower-order count unit 103 and the higher-order count unit 101 are set to the count modes. Subsequently, the latch circuits D_1 to D_8 are reset according to the control signal LRST. Simultaneously, the count values of the lower-order count unit 103 and the higher-order count unit 101 are reset according to the control signals CLRST/CHRST. Because the control signal SEL has been set to the L state, the count clock signal of the higher-order count unit 101 is set to the output of the latch circuit D_6 of the latch unit 108. Accordingly, until the end of a comparison process, the output signal CK6 is input to the higher-order count unit 101 through the latch circuit D_6 and the switching unit MUX, and the higher-order count unit 101 performs the count operation using the output signal CK6 as the count clock signal. At the initiation of the comparison process, a value held by the lower-order count unit 103 is 3'b[0]000, and a value held by the higher-order count unit 101 is 9'b0000_0000_0. If these values are expressed in 12 bits, 12' b0000_0000_0000 is obtained.

At a first timing (the first timing related to the comparison of the ramp wave applied from the ramp unit 19 and the reset level in the above-described operation) at which a predetermined condition is satisfied, the output signal CO of the comparison unit 109 is inverted, and the states of the output signals CK1 to CK8, which are the logic states of the VCO 100 at that time, are held (the first lower-order phase signal). Simultaneously, the higher-order count unit 101 stops the count operation. At this time, a value held by the lower-order count unit 103 is 3'b[0]000 and a value held by the higher-order count unit 101 is 9'b0000_0001_1 (corresponding to 3). If these values are expressed in 12 bits, 12'b0000_0001_1000 is obtained.

Subsequently, a binarization process on the first lower-order phase signal is performed. Through the binarization process on the first lower-order phase signal, a count clock signal (first lower-order count signal) is output from the calculation unit 106 to the lower-order counter 103a, so that the lower-order counter 103a performs the count operation. In this embodiment, the inverted output of the third bit of the lower-order counter 103a is input to the lower-order counter 103b. At the timing at which the third-bit output of the lower-order counter 103a changes from "0" to "1," the inverted output of the third bit of the lower-order counter 103a changes from "1" to "0." According to this change, 1 is subtracted from the count value of the lower-order counter 103b. At the end of the binarization process on the first lower-order phase signal, a value held by the lower-order count unit 103 is 3'b[1]001 (corresponding to −7), and a value held by the higher-order count unit 101 is 9'b0000_0001_1 (corresponding to 3). If these values are expressed in 12 bits, 12'b0000_0001_1001 is obtained.

Subsequently, the count values of the lower-order count unit 103 and the higher-order count unit 101 are inverted. At this time, a value held by the lower-order count unit 103 is 3'b[0]110 (corresponding to 6), and a value held by the higher-order count unit 101 is 9'b1111_1110_0 (corresponding to −4). If these values are expressed in 12 bits, 12'b1111_1110_0110 is obtained. In this embodiment, as in the fifth embodiment, 1 is not added after the value has been inverted.

Subsequently, the control signals CLMODE/CHMODE are in the H state. Thereby, the operation modes of the lower-order count unit 103 and the higher-order count unit 101 become the data protection modes.

<<Second Reading>>

Subsequently, the latch circuits D_1 to D_8 are reset according to the control signal LRST. Here, the count values of the lower-order count unit 103 and the higher-order count unit 101 are not reset according to the control signals CLRST/CHRST. Thereafter, the control signals CLMODE/CHMODE are in the L state. Thereby, the operation modes of the lower-order count unit 103 and the higher-order count unit 101 become the count modes. At this time, a value held by the lower-order count unit 103 is 3'b[0]110 (corresponding to 6), and a value held by the higher-order count unit 101 is 9'b1111_1110_0 (corresponding to −4). If these values are expressed in 12 bits, 12'b1111_1110_0110 is obtained.

At a second timing (the second timing related to the comparison of the ramp wave applied from the ramp unit 19 and the signal level in the above-described operation) at which a predetermined condition is satisfied, the output signal CO of the comparison unit 109 is inverted, and the states of the output signals CK1 to CK8, which are the logic states of the VCO 100 at that time, are held (the second lower-order phase signal). Simultaneously, the higher-order count unit 101 stops the count operation. At this time, a value held by the lower-order count unit 103 is 3'b[0]110 (corresponding to 6), and a value held by the higher-order count unit 101 is 9'b0000_0001_1 (corresponding to 3). If these values are expressed in 12 bits, 12'b0000_0001_1110 is obtained.

Thereafter, a binarization process on the second lower-order phase signal is performed. Through the binarization process on the second lower-order phase signal, a count clock signal (second lower-order count signal) is output from the calculation unit 106 to the lower-order counter 103a, so that the lower-order counter 103a performs the count operation. In this embodiment, the inverted output of the third bit of the lower-order counter 103a is input to the lower-order counter 103b. At the timing at which the third-bit output of the lower-order counter 103a changes from "0" to "1," the inverted output of the third bit of the lower-order counter 103a changes from "1" to "0." According to this change, 1 is subtracted from the count value of the lower-order counter 103b. At the end of the binarization process on the second lower-order phase signal, a value held by the lower-order count unit 103 is 3'b[1]111 (corresponding to −1), and a value held by the higher-order count unit 101 is 9'b0000_0001_1 (corresponding to 3). If these values are expressed in 12 bits, 12'b0000_0001_1111 is obtained.

Thereafter, it is necessary to adjust the higher-order count value according to a count value of the lower-order count unit 103. In this embodiment, when the count value of the lower-order counter 103b is 1, it is necessary to add 1 to the count value of the higher-order count unit 101. In addition, when the count value of the lower-order counter 103b is 0, it is not necessary to adjust the count value of the higher-order count unit 101.

According to the above description, the determination by the determination unit 103c and the addition of the higher-order count value are performed. First, the control signals CLMODE/CHMODE are in the H state. Thereby, the operation modes of the lower-order count unit 103 and the higher-order count unit 101 become the data protection modes. Thereafter, the control signal SEL is set to the H state. At this time, the count clock signal of the higher-order count unit 101 is an output signal of the determination unit 103c.

Subsequently, the control signals CLMODE/CHMODE are in the L state. Thereby, the operation modes of the lower-order count unit 103 and the higher-order count unit 101 become the count modes. Thereafter, the control signal FLAG is in the H state. Thereby, the determination unit 103c determines the count value of the lower-order counter 103b, and outputs the count clock signal according to the determination result. The determination unit 103c outputs the count clock signal for addition when the count value of the lower-order counter 103b is 1, and does not output the count clock signal when the count value of the lower-order counter 103b is 0.

In the case of this embodiment, because the count value of the lower-order counter 103b is 1, the determination unit 103c outputs the count clock signal. Thus, the count value of the higher-order count unit 101 is incremented by 1. At this time, a value held by the lower-order count unit 103 is 3'b[1]111 (corresponding to −1), and a value held by the higher-order count unit 101 is 9'b0000_0010_0 (corresponding to 4). If these values are expressed in 12 bits, 12'b0000_0010_0111 is obtained.

In this embodiment, only the count value of the lower-order count unit 103 is inverted (not illustrated in FIG. 24). At this time, a value held by the lower-order count unit 103 is 3'b[0]000 (corresponding to 0), and a value held by the higher-order count unit 101 is 9'b0000_0010_0 (corresponding to 4). If these values are expressed in 12 bits, 12'b0000_0010_0000 (corresponding to 32) is obtained. Although it is necessary to add 1 after a value has been inverted in binary subtraction, a change in a value due to the addition of 1 after each inversion is offset because the value is inverted even during the first reading as described above. Accordingly, in this embodiment, 1 is not added after the value has been inverted in relation to the lower-order count value.

Digital data including the second lower-order count value and the second higher-order count value is transferred by the horizontal selection unit 14 to the output unit 17 via the horizontal signal line. The inversion of the second lower-order count value during the second reading may be performed even after the digital data has been transferred to the output unit 17. According to the above-described operation, binary data corresponding to a difference between the first pixel signal and the second pixel signal is obtained.

As described above, in accordance with this embodiment, it is possible to perform subtraction (a CDS process) suppressing an encoding error in an imaging apparatus using a TDC type AD conversion circuit. Therefore, a high-quality image signal can be obtained. In addition, the subtraction (CDS process) can be performed on the first analog signal based on the first pixel signal and the second analog signal based on the second pixel signal in a digital domain.

In addition, because it is only necessary that the lower-order count unit 103 and the higher-order count unit 101 have one type of count mode (the lower-order count unit 103 has the count-down mode and the higher-order count unit 101 has the count-up mode in this embodiment), the AD conversion circuit can be implemented using a simple circuit configuration.

Seventh Embodiment

Next, the seventh embodiment of the present invention will be described. Because the configuration of the imaging apparatus in accordance with this embodiment is substantially the same as that illustrated in FIG. 16 and the configuration of the column AD conversion unit 16 is substantially the same as that illustrated in FIG. 17, a description thereof is omitted here.

Next, the operation of the imaging apparatus in accordance with this embodiment will be described. Hereinafter, first and second read operations and subsequent subtraction (a CDS process) will be described in detail. For ease of description, it is assumed that the count modes of the higher-order count unit 101 and the lower-order count unit 103 are the count-down modes during the first read operation and are the count-up modes during the second read operation. The higher-order count unit 101 and the lower-order count unit 103 perform the count operation at the timing of the falling edge of the count clock signal. In addition, description of operations that are substantially the same as the above-described operations is appropriately omitted.

<First Reading>

Initially, the higher-order count unit 101 and the lower-order count unit 103 are reset. After the first reading from the unit pixel 3 of an arbitrary pixel row to the vertical signal line 13 has been stabilized, the ramp unit 19 outputs a ramp wave. The comparison unit 109 compares the ramp wave with a reset level. During this time, the higher-order count unit 101 performs the count operation using the output signal CK6 of the VCO 100 as the count clock signal.

The comparison unit 109 compares the ramp wave applied from the ramp unit 19 with the reset level. The comparison unit 109 inverts a comparison output when both voltages approximately coincide with each other (at a first timing). At the first timing, the latch unit 108 holds the logic state of the VCO 100 as a first lower-order phase signal. In addition, at the first timing, the higher-order count unit 101 stops the count operation to hold the logic state as a first higher-order count value. Subsequently, the ramp unit 19 stops the generation of the ramp wave.

Subsequently, the count clock signal input to the higher-order count unit 101 is switched. The switched count clock signal is a third-bit output signal of the lower-order count unit 103. Thereafter, the calculation unit 106 detects a thermometer code of the first lower-order phase signal held in the latch unit 108, generates a first lower-order count signal based on the detected thermometer code, and outputs the first lower-order count signal to the lower-order count unit 103. The lower-order count unit 103 performs the count operation using the first lower-order count signal as the count clock signal. Thereby, a first lower-order count value is obtained. While the lower-order count unit 103 performs the count operation, the higher-order count unit 101 performs the count operation according to a change in the third-bit output signal of the lower-order count unit 103.

Thereafter, the count clock signal input to the higher-order count unit 101 is switched. The switched count clock signal is the output signal CK6 of the VCO 100.

<Second Reading>

Subsequently, during the second reading, a signal level corresponding to the amount of incident light of each unit pixel 3 is read, and an operation that is substantially the same as that of the first reading is performed. After the second reading from the unit pixel 3 of an arbitrary pixel row to the vertical signal line 13 has been stabilized, the ramp unit 19 outputs a ramp wave. The comparison unit 109 compares the ramp wave with the signal level. During this time, the higher-order count unit 101 performs the count operation using the output signal CK6 of the VCO 100 as the count clock signal.

The comparison unit 109 compares the ramp wave applied from the ramp unit 19 with the signal level, and inverts a comparison output when both voltages approximately coincide with each other (at a second timing). At the second timing, the latch unit 108 holds the logic state of the VCO 100 as a second lower-order phase signal. In addition, at the second timing, the higher-order count unit 101 stops the count operation to hold the logic state as a second higher-order count value. Thereby, a higher-order count value corresponding to the difference between the reset level and the signal level is obtained. Subsequently, the ramp unit 19 stops the generation of the ramp wave.

Subsequently, the count clock signal input to the higher-order count unit 101 is switched. The switched count clock signal is a third-bit output signal of the lower-order count unit 103. Thereafter, the calculation unit 106 detects a thermometer code of the second lower-order phase signal held in the latch unit 108, generates a second lower-order count signal based on the detected thermometer code, and outputs the second lower-order count signal to the lower-order count unit 103. The lower-order count unit 103 performs the count operation using the second lower-order count signal as the count clock signal. Thereby, a second lower-order count value, which is a lower-order count value corresponding to the difference between the reset level and the signal level, is obtained. While the lower-order count unit 103 performs the count operation, the higher-order count unit 101 performs the count operation according to a change in a third-bit output signal of the lower-order count unit 103.

Thus, the second lower-order count value and the second higher-order count value each corresponding to the difference between the reset level and the signal level are obtained. Ultimately, digital data including the second lower-order count value and the second higher-order count value is transferred by the horizontal selection unit 14 to the output unit 17 via the horizontal signal line.

In this embodiment, subtraction (a CDS process) is performed on a first pixel signal and a second pixel signal subsequent to the first pixel signal by switching the count mode to perform the count operation. Assuming that a digital value obtained by performing AD conversion on the first pixel signal is A and a digital value obtained by performing AD conversion on the second pixel signal is B, an obtained subtraction result is B−A.

In this embodiment, because the lower-order count unit 103 and the higher-order count unit 101 perform the count operation in the count-down mode during the first reading, a count value including the lower-order count value and the higher-order count value corresponds to a digital value−A after the lower-order count unit 103 and the higher-order count unit 101 have performed the count operation based on the first pixel signal during the first reading. Subsequently, because the lower-order count unit 103 and the higher-order count unit 101 perform the count operation in the count-up mode during the second reading, a count value including the lower-order count value and the higher-order count value corresponds to a digital value B−A after the lower-order count unit 103 and the higher-order count unit 101 have performed the count operation based on the second pixel signal during the second reading.

As described above, in accordance with this embodiment, it is possible to perform subtraction (a CDS process) suppressing an encoding error in an imaging apparatus using a TDC type AD conversion circuit. Therefore, a high-quality image signal can be obtained. In addition, the subtraction (CDS process) can be performed on the first analog signal based on the first pixel signal and the second analog signal based on the second pixel signal in a digital domain.

Eighth Embodiment

Next, the eighth embodiment of the present invention will be described. Because the configuration of the imaging apparatus in accordance with this embodiment is substantially the same as that illustrated in FIG. 16 and the configuration of the column AD conversion unit 16 are substantially the same as that illustrated in FIG. 22, a description thereof is omitted here.

Next, an operation of the imaging apparatus in accordance with this embodiment will be described. Hereinafter, first and second read operations and subsequent subtraction (a CDS process) will be described in detail. For ease of description, it is assumed that count modes of the higher-order count unit 101 and the lower-order count unit 103 are count-down modes during the first read operation and are count-up modes during the second read operation. The higher-order count unit 101 and the lower-order count unit 103 perform a count operation at the timing of a falling edge of a count clock signal. In addition, a description of operations that are substantially the same as the above-described operations is appropriately omitted here. Although the count clock signal is switched during each of the first reading and the second reading in the seventh embodiment, the count clock signal is switched only during the second reading in the eighth embodiment.

<First Reading>

Initially, the higher-order count unit 101 and the lower-order count unit 103 are reset. After the first reading from the unit pixel 3 of an arbitrary pixel row to the vertical signal line 13 has been stabilized, the ramp unit 19 outputs a ramp wave. The comparison unit 109 compares the ramp wave with a reset level. During this time, the higher-order count unit 101 performs the count operation using the output signal CK6 of the VCO 100 as the count clock signal.

The comparison unit 109 compares the ramp wave applied from the ramp unit 19 with the reset level. The comparison unit 109 inverts comparison output when both voltages approximately coincide with each other (at a first timing). At the first timing, the latch unit 108 holds a logic state of the VCO 100 as a first lower-order phase signal. In addition, at the first timing, the higher-order count unit 101 stops the count operation to hold the logic state as a first higher-order count value. Subsequently, the ramp unit 19 stops the generation of the ramp wave.

Thereafter, the calculation unit 106 detects a thermometer code of the first lower-order phase signal held in the latch unit 108. The calculation unit 106 generates a first lower-order count signal based on the detected thermometer code, and outputs the first lower-order count signal to the lower-order count unit 103. The lower-order counter 103*a* of the lower-order count unit 103 performs the count operation using the first lower-order count signal as the count clock signal, and the lower-order counter 103*b* performs the count operation using a third-bit output signal of the lower-order counter 103*a* as the count clock signal. Thereby, a first lower-order count value is obtained.

<Second Reading>

Subsequently, during the second reading, a signal level corresponding to the amount of incident light of each unit pixel 3 is read, and an operation that is substantially the same as that of the first reading is performed. After the second reading from the unit pixel 3 of an arbitrary pixel row to the vertical signal line 13 has been stabilized, the ramp unit 19 outputs a ramp wave. The comparison unit 109 compares the ramp wave with the signal level. During this time, the higher-order count unit 101 performs the count operation using the output signal CK6 of the VCO 100 as the count clock signal.

The comparison unit 109 compares the ramp wave applied from the ramp unit 19 with the signal level, and inverts a comparison output when both voltages approximately coincide with each other (at a second timing). At the second timing, the latch unit 108 holds the logic state of the VCO 100 as a second lower-order phase signal. In addition, at the second timing, the higher-order count unit 101 stops the count operation to hold the logic state as a second higher-order count value. Thereby, a higher-order count value corresponding to the difference between the reset level and the signal level is obtained. Subsequently, the ramp unit 19 stops the generation of the ramp wave.

Thereafter, the calculation unit 106 detects a thermometer code of the second lower-order phase signal held in the latch unit 108. The calculation unit 106 generates a second lower-order count signal based on the detected thermometer code, and outputs the second lower-order count signal to the lower-order count unit 103. The lower-order counter 103*a* of the lower-order count unit 103 performs the count operation using the second lower-order count signal as the count clock signal. The lower-order counter 103*b* performs a third-bit output signal of the lower-order counter 103*a* as the count clock signal. Thereby, a second lower-order count value, which is a lower-order count value corresponding to the difference between the reset level and the signal level, is obtained.

Subsequently, the count clock signal input to the higher-order count unit 101 is switched. The switched count clock signal is the output signal of the determination unit 103*c* based on the output signal of the lower-order counter 103*b*. The determination unit 103*c* outputs the count clock signal when the output signal of the lower-order counter 103*b* is in the H state, and does not output the count clock signal when the output signal of the lower-order counter 103*b* is in the L state. When the count clock signal has been output from the determination unit 103*c*, 1 is subtracted from the higher-order count value of the higher-order count unit 101.

Thus, the second lower-order count value and the second higher-order count value each corresponding to the difference between the reset level and the signal level are obtained. Ultimately, digital data including the second lower-order count value and the second higher-order count value is transferred by the horizontal selection unit 14 to the output unit 17 via the horizontal signal line.

In this embodiment, subtraction (a CDS process) is performed on a first pixel signal and a second pixel signal subsequent to the first pixel signal by switching the count mode to perform the count operation. Assuming that a digital value obtained by performing AD conversion on the first pixel signal is A and a digital value obtained by performing AD conversion on the second pixel signal is B, an obtained subtraction result is B−A. In this embodiment, the lower-order count unit 103 and the higher-order count unit 101 separately perform count operations, and digital data including the lower-order count value, which is the count result of the lower-order count unit 103, and the higher-order count value, which is the count result of the higher-order count unit 101, is obtained.

In this embodiment, because the lower-order count unit 103 performs the count operation in the count-down mode during the first reading, the lower-order count value corresponds to lower-order bits of a digital value−A after the lower-order count unit 103 has performed the count operation based on the first pixel signal during the first reading. Subsequently, because the lower-order count unit 103 performs the count operation in the count-up mode during the second reading, the lower-order count value corresponds to lower-order bits of a digital value B−A after the lower-order count unit 103 has performed the count operation based on the second pixel signal during the second reading.

On the other hand, in this embodiment, because the higher-order count unit 101 performs the count operation in the count-down mode during the first reading, the higher-order count value further corresponds to higher-order bits of the digital value−A after the higher-order count unit 101 has performed the count operation based on the first pixel signal during the first reading. Subsequently, because the higher-order count unit 101 performs the count operation in the count-up mode during the second reading, the higher-order count value corresponds to higher-order bits of the digital value B−A after the higher-order count unit 101 has performed the count operation based on the second pixel signal during the second reading. However, when the lower-order count unit 103 performs the count operation based on the lower-order count signal, the adjustment of the higher-order count value according to the carrying/borrowing of the lower-order count value is necessary because the higher-order count unit 101 does not perform the count operation. In the case of this embodiment, when the count clock signal is switched, the higher-order count value is adjusted according to the carrying/borrowing of the lower-order count value.

Next, an operation of the configuration illustrated in FIG. 22 will be described using a specific example. As described above, it is assumed that the count modes of the higher-order count unit 101 and the lower-order count unit 103 are the count-down modes during the first read operation and are the count-up modes during the second read operation. The higher-order count unit 101 and the lower-order count unit 103 perform the count operation at the timing of the falling edge of the count clock signal. In the present description, the case in which a four-bit up/down-counter circuit is used as the lower-order count unit 103 and a nine-bit up/down-counter circuit is used as the higher-order count unit 101 will be described. The total number of states of the lower-order phase signal based on eight output signals CK1 to CK8 of the VCO 100 is 8 (states 0 to 7). The expressions of the count values of the higher-order count unit 101 and the lower-order count unit 103 are substantially the same as those used in the sixth embodiment.

Here, it is assumed that a state corresponding to the lower-order phase signal of the first pixel signal is state 7, a higher-order count value based on the first pixel signal is 3, a state corresponding to the lower-order phase signal of the second pixel signal is state 7, and a higher-order count value based on the second pixel signal is 7. That is, the first pixel signal corresponds to 31 (=7+8×3), the second pixel signal corresponds to 63 (=7+8×7), and a value obtained by subtracting (a CDS process) the first pixel signal from the second pixel signal becomes 32.

<<First Reading>>

Initially, the control signals CLMODE/CHMODE are in the L state and the operation modes of the lower-order count unit 103 and the higher-order count unit 101 are set to the count modes. The count modes of the lower-order count unit 103 and the higher-order count unit 101 are set to the count-down modes. Subsequently, the latch circuits D_1 to D_8 are reset according to the control signal LRST. Simultaneously, the count values of the lower-order count unit 103 and the higher-order count unit 101 are reset according to the control signals CLRST/CHRST. Because the control signal SEL has been set to the L state, the count clock signal of the higher-order count unit 101 is set to the output of the latch circuit D_6 of the latch unit 108. Accordingly, until the end of a comparison process, the output signal CK6 is input to the higher-order count unit 101 through the latch circuit D_6 and the switching unit MUX, and the higher-order count unit 101 performs the count operation using the output signal CK6 as the count clock signal. At the initiation of the comparison process, a value held by the lower-order count unit 103 is 3'b[0]000, and a value held by the higher-order count unit 101 is 9'b0000_0000_0. If these values are expressed in 12 bits, 12' b0000_0000_0000 is obtained.

At a first timing (the first timing related to the comparison of the ramp wave applied from the ramp unit 19 and the reset level in the above-described operation) at which a predetermined condition is satisfied, the output signal CO of the comparison unit 109 is inverted, and the states of the output signals CK1 to CK8, which are the logic states of the VCO 100 at that time, are held (the first lower-order phase signal). Simultaneously, the higher-order count unit 101 stops the count operation. At this time, a value held by the lower-order count unit 103 is 3'b[0]000, and a value held by the higher-order count unit 101 is 9'b1111_1110_1 (corresponding to −3). If these values are expressed in 12 bits, 12'b1111_1110_1000 is obtained.

Subsequently, a binarization process on the first lower-order phase signal is performed. Through the binarization process on the first lower-order phase signal, the count clock signal (first lower-order count signal) is output from the calculation unit 106 to the lower-order counter 103*a*, so that the lower-order counter 103*a* performs the count operation. In this embodiment, the inverted output of the third bit of the lower-order counter 103*a* is input to the lower-order counter 103*b*. At the timing at which the third-bit output of the lower-order counter 103*a* changes from "0" to "1," the inverted output of the third bit of the lower-order counter 103*a* changes from "1" to "0." According to this change, 1 is subtracted from the count value of the lower-order counter 103*b*. At the end of the binarization process on the first lower-order phase signal, a value held by the lower-order count unit 103 is 3'b[1]001 (corresponding to −7), and a value held by the higher-order count unit 101 is 9'b1111_1110_1 (corresponding to −3). If these values are expressed in 12 bits, 12'b1111_1110_1001 is obtained.

Subsequently, the control signals CLMODE/CHMODE are in the H state. Thereby, the operation modes of the lower-order count unit 103 and the higher-order count unit 101 become the data protection modes.

<<Second Reading>>

Subsequently, the latch circuits D_1 to D_8 are reset according to the control signal LRST. Here, the count values of the lower-order count unit 103 and the higher-order count unit 101 are not reset according to the control signals CLRST/CHRST. Thereafter, the control signals CLMODE/CHMODE are in the L state. Thereby, the operation modes of the lower-order count unit 103 and the higher-order count unit 101 become the count modes. The operation modes of the lower-order count unit 103 and the higher-order count unit 101 are the count-up modes. At this time, a value held by the lower-order count unit 103 is 3'b[1]001 (corresponding to −7), and a value held by the higher-order count unit 101 is 9'b1111_1110_1 (corresponding to −3). If these values are expressed in 12 bits, 12'b1111_1110_1001 is obtained.

At a second timing (the second timing related to the comparison of the ramp wave applied from the ramp unit 19 and the signal level in the above-described operation) at which a predetermined condition is satisfied, the output signal CO of the comparison unit 109 is inverted, and the states of the output signals CK1 to CK8, which are the logic states of the VCO 100 at that time, are held (the second lower-order phase signal). Simultaneously, the higher-order count unit 101 stops the count operation. At this time, a value held by the lower-order count unit 103 is 3'b[1]001 (corresponding to −7), and a value held by the higher-order count unit 101 is 9'b0000_0010_0 (corresponding to 4). If these values are expressed in 12 bits, 12'b0000_0010_0001 is obtained.

Thereafter, a binarization process on the second lower-order phase signal is performed. Through the binarization process on the second lower-order phase signal, the count clock signal (second lower-order count signal) is output from the calculation unit 106 to the lower-order counter 103a, so that the lower-order counter 103a performs the count operation. In this embodiment, the third-bit output of the lower-order counter 103a is input to the lower-order counter 103b. At the timing at which the third-bit output of the lower-order counter 103a changes from "1" to "0," 1 is added to the count value of the lower-order counter 103b. At the end of the binarization process on the second lower-order phase signal, a value held by the lower-order count unit 103 is 3'b[0]000 (corresponding to 0), and a value held by the higher-order count unit 101 is 9'b0000_0010_0 (corresponding to 4). If these values are expressed in 12 bits, 12'b0000_0010_0000 is obtained.

Thereafter, it is necessary to adjust the higher-order count value according to a count value of the lower-order count unit 103. In this embodiment, when the count value of the lower-order counter 103b is 1, it is necessary to subtract 1 from the count value of the higher-order count unit 101. In addition, when the count value of the lower-order counter 103b is 0, it is not necessary to adjust the count value of the higher-order count unit 101.

According to the above description, the determination by the determination unit 103c and the subtraction of the higher-order count value are performed. First, the control signals CLMODE/CHMODE are in the H state. Thereby, the operation modes of the lower-order count unit 103 and the higher-order count unit 101 become the data protection modes. Thereafter, the control signal SEL is set to the H state. At this time, the count clock signal of the higher-order count unit 101 is an output signal of the determination unit 103c.

Subsequently, the control signals CLMODE/CHMODE are in the L state. Thereby, the operation modes of the lower-order count unit 103 and the higher-order count unit 101 become the count modes. The count modes of the lower-order count unit 103 and the higher-order count unit 101 are the count-down modes. Thereafter, the control signal FLAG is in the H state. Thereby, the determination unit 103c determines the count value of the lower-order counter 103b and outputs the count clock signal according to the determination result. The determination unit 103c outputs the count clock signal for subtraction when the count value of the lower-order counter 103b is 1, and does not output the count clock signal when the count value of the lower-order counter 103b is 0.

In the case of this embodiment, because the count value of the lower-order counter 103b is 0, the determination unit 103c does not output the count clock. Thus, the count value of the higher-order count unit 101 does not change. At this time, a value held by the lower-order count unit 103 is 3'b[0]000 (corresponding to j), and a value held by the higher-order count unit 101 is 9'b0000_0010_0 (corresponding to 4). If these values are expressed in 12 bits, 12'b0000_0010_0000 (corresponding to 32) is obtained.

Digital data including the second lower-order count value and the second higher-order count value is transferred by the horizontal selection unit 14 to the output unit 17 via the horizontal signal line. According to the above-described operation, binary data corresponding to the difference between the first pixel signal and the second pixel signal is obtained.

As described above, in accordance with this embodiment, it is possible to perform subtraction (a CDS process) suppressing an encoding error in an imaging apparatus using a TDC type AD conversion circuit. Therefore, a high-quality image signal can be obtained. In addition, the subtraction (CDS process) can be performed on the first analog signal based on the first pixel signal and the second analog signal based on the pixel image signal in a digital domain.

Although the embodiment of the present invention has been described above in detail with reference to the drawings, specific configurations are not limited to the above-described embodiment, and various design changes can be made without departing from the spirit and scope of the present invention. Accordingly, the invention is not to be considered as being limited by the foregoing description, and is only limited by the scope of the claims.

What is claimed is:

1. An analog-to-digital (AD) conversion circuit comprising:
a reference signal generation unit configured to generate a reference signal that increases or decreases with the passage of time;
a comparison unit configured to compare an analog signal serving as an AD conversion target with the reference signal and end a comparison process at a timing at which the reference signal has satisfied a predetermined condition with respect to the analog signal;
a clock signal generation unit configured to have an oscillation circuit formed by n (n is an odd number greater than or equal to 3) delay units and including a first path in which a signal is transferred through each of the n delay units and a second path in which a signal is transferred by bypassing some of the n delay units, and output a lower-order phase signal including a plurality of signals output from the plurality of delay units;
a latch unit configured to latch the lower-order phase signal at a timing related to the end of the comparison process;
a higher-order count unit including a first counter circuit configured to acquire a higher-order count value by performing a count operation using a signal output from any one of the delay units arranged between two delay units positioned at both ends of the second path and arranged on the first path as a first count clock signal;
a calculation unit configured to detect a change position of a logic state in a signal group including the plurality of signals constituting the lower-order phase signal latched in the latch unit in order to detect a state of the lower-order phase signal defined based on the count clock signal of the first counter circuit, and generate a lower-order count signal based on the detected change position; and a lower-order count unit including a second counter circuit configured to acquire a lower-order count value by performing a count operation using the lower-order count signal as a second count clock signal, wherein digital data corresponding to the analog signal is output.

2. The AD conversion circuit according to claim 1, wherein the calculation unit detects the change position of the logic state in a signal group after the plurality of signals constituting the lower-order phase signal latched in the latch unit have been arranged in the same order as a signal group when the plurality of signals constituting the lower-order phase signal output from the clock signal generation unit during the comparison process have been arranged to be a group of signals that sequentially rise or fall at predetermined time intervals according to whether the first counter circuit performs the count operation based on rising or falling of the first count clock signal.

3. The AD conversion circuit according to claim 2, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal and also outputting a first higher-order count clock signal and acquires a second lower-order count value by performing the count operation using the second lower-order count signal as the second count clock signal and also outputting a second higher-order count clock signal after inverting values of bits constituting the first lower-order count value, and the higher-order count unit acquires a first higher-order count value by performing the count operation using one of a plurality of signals constituting the first lower-order phase signal output from the clock signal generation unit as the first count clock signal and further performing the count operation based on the first higher-order count clock signal, and acquires a second higher-order count value by performing the count operation using one of a plurality of signals constituting the second lower-order phase signal output from the clock signal generation unit as the first count clock signal and further performing the count operation based on the second higher-order count clock signal after inverting values of bits constituting the first higher-order count value, thereby outputting digital data corresponding to a difference between the first analog signal and the second analog signal.

4. The AD conversion circuit according to claim 2, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal, acquires a second lower-order count value by performing the count operation using the second lower-order count signal as the second count clock signal after inverting values of bits constituting the first lower-order count value, and outputs a higher-order count clock signal based on a flag bit of the second lower-order count value, and the higher-order count unit acquires a first higher-order count value by performing the count operation using one of a plurality of signals constituting the first lower-order phase signal output from the clock signal generation unit as the first count clock signal, and acquires a second higher-order count value by performing the count operation using one of a plurality of signals constituting the second lower-order phase signal output from the clock signal generation unit as the first count clock signal and further performing the count operation based on the higher-order count clock signal after inverting values of bits constituting the first higher-order count value, thereby outputting digital data corresponding to a difference between the first analog signal and the second analog signal.

5. The AD conversion circuit according to claim 2, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal in any one of a count-up mode and a count-down mode and also outputting a first higher-order count clock signal, and then acquires a second lower-order count value by performing the count operation using the second lower-order count signal as the second count clock signal in the other mode of the count-up mode and the count-down mode and also outputting a second higher-order count clock signal, and the higher-order count unit acquires a first higher-order count value by performing the count operation using one of a plurality of signals constituting the first lower-order phase signal output from the clock signal generation unit as the first count clock signal in any one of the count-up mode and the count-down mode and further performing the count operation based on the first higher-order count clock signal, and then acquires a second higher-order count value by performing the count operation using one of a plurality of signals constituting the second lower-order phase signal output from the clock signal generation unit as the first count clock signal in the other mode of the count-up mode and the count-down mode and further performing the count operation based on the second higher-order count clock signal, thereby outputting digital data corresponding to a difference between the first analog signal and the second analog signal.

6. The AD conversion circuit according to claim 2, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal in any one mode of a count-up mode and a count-down mode, then acquires a second lower-order count value by performing the count operation using the second lower-order count signal as the second count clock signal in the other mode of the count-up mode and the count-down mode, and outputs a higher-order count clock signal based on a flag bit of the second lower-order count value, and the higher-order count unit acquires a first higher-order count value by performing the count operation using one of a plurality of signals constituting the first lower-order phase signal output from the clock signal generation unit as the first count clock signal in any one mode of the count-up mode and the count-down mode, and then acquires a second higher-order count value by performing the count operation using one of plurality of signals constituting the second lower-order phase signal output from the clock signal generation unit as the first count clock signal in the other mode of the count-up mode and the count-down mode and further performing the count operation based on the higher-order count clock signal, thereby outputting digital data corresponding to a difference between the first analog signal and the second analog signal.

7. An imaging apparatus comprising:
an imaging unit in which a plurality of pixels each including a photoelectric conversion element and outputting a pixel signal are arranged in a matrix; and
the AD conversion circuit according to claim 2 to which an analog signal corresponding to the pixel signal is input.

8. The AD conversion circuit according to claim 1, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal and also outputting a first higher-order count clock signal and acquires a second lower-order count value by performing the count operation using the second lower-order count signal as the second count clock signal and also outputting a second higher-order count clock signal after inverting values of bits constituting the first lower-order count value, and the higher-order count unit acquires a first higher-order count value by performing the count operation using one of a plurality of signals constituting the first lower-order phase signal output from the clock signal generation unit as the first count clock signal and further performing the count operation based on the first higher-order count clock signal, and acquires a second higher-order count value by performing the count operation using one of a plurality of signals constituting the second lower-order phase signal output from the clock signal generation unit as the first count clock signal and further performing the count operation based on the second higher-order count clock signal after inverting values of bits constituting the first higher-order count value, thereby outputting digital data corresponding to a difference between the first analog signal and the second analog signal.

9. The AD conversion circuit according to claim 1, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal, acquires a second lower-order count value by performing the count operation using the second lower-order count signal as the second count clock signal after inverting values of bits constituting the first lower-order count value, and outputs a higher-order count clock signal based on a flag bit of the second lower-order count value, and the higher-order count unit acquires a first higher-order count value by performing the count operation using one of a plurality of signals constituting the first lower-order phase signal output from the clock signal generation unit as the first count clock signal, and acquires a second higher-order count value by performing the count operation using one of a plurality of signals constituting the second lower-order phase signal output from the clock signal generation unit as the first count clock signal and further performing the count operation based on the higher-order count clock signal after inverting values of bits constituting the first higher-order count value, thereby outputting digital data corresponding to a difference between the first analog signal and the second analog signal.

10. The AD conversion circuit according to claim 1, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal in any one of a count-up mode and a count-down mode and also outputting a first higher-order count clock signal, and then acquires a second lower-order count value by performing the count operation using the second lower-order count signal as the second count clock signal in the other mode of the count-up mode and the count-down mode and also outputting a second higher-order count clock signal, and the higher-order count unit acquires a first higher-order count value by performing the count operation using one of a plurality of signals constituting the first lower-order phase signal output from the clock signal generation unit as the first count clock signal in any one of the count-up mode and the count-down mode and further performing the count operation based on the first higher-order count clock signal, and then acquires a second higher-order count value by performing the count operation using one of a plurality of signals constituting the second lower-order phase signal output from the clock signal generation unit as the first count clock signal in the other mode of the count-up mode and the count-down mode and further performing the count operation based on the second higher-order count clock signal, thereby outputting digital data corresponding to a difference between the first analog signal and the second analog signal.

11. The AD conversion circuit according to claim 1, wherein:

the latch unit latches a second lower-order phase signal at a timing related to an end of a second comparison process corresponding to a second analog signal after latching a first lower-order phase signal at a timing related to an end of a first comparison process corresponding to a first analog signal, the calculation unit generates a second lower-order count signal according to the second lower-order phase signal latched in the latch unit after generating a first lower-order count signal according to the first lower-order phase signal latched in the latch unit, the lower-order count unit acquires a first lower-order count value by performing the count operation using the first lower-order count signal as the second count clock signal in any one mode of a count-up mode and a count-down mode, then acquires a second lower-order count value by performing the count operation using the second lower-order count signal as the second count clock signal in the other mode of the count-up mode and the count-down mode, and outputs a higher-order count clock signal based on a flag bit of the second lower-order count value, and the higher-order count unit acquires a first higher-order count value by performing the count operation using one of a plurality of signals constituting the first lower-order phase signal output from the clock signal generation unit as the first count clock signal in any one mode of the count-up mode and the count-down mode, and then acquires a second higher-order count value by performing the count operation using one of a plurality of signals constituting the second lower-order phase signal output from the clock signal generation unit as the first count clock signal in the other mode of the count-up mode and the count-down mode and further performing the count operation based on the higher-order count clock signal, thereby outputting digital data corresponding to a difference between the first analog signal and the second analog signal.

12. An imaging apparatus comprising:

an imaging unit in which a plurality of pixels each including a photoelectric conversion element and outputting a pixel signal are arranged in a matrix; and the AD conversion circuit according to claim 1 to which an analog signal corresponding to the pixel signal is input.

13. An imaging apparatus comprising:

an imaging unit in which a plurality of pixels each including a photoelectric conversion element and outputting a pixel signal are arranged in a matrix; and the AD conversion circuit according to any one of claims 8 to 7 to which a first analog signal corresponding to a first pixel signal based on a reset level and a second analog signal corresponding to a second pixel signal based on an amount of an electromagnetic wave incident on the photoelectric conversion element are input.

* * * * *